United States Patent
Sato et al.

(10) Patent No.: US 7,315,804 B2
(45) Date of Patent: Jan. 1, 2008

(54) ENGINEERING ASSIST METHOD AND SYSTEM

(75) Inventors: Osamu Sato, Kanagawa (JP); Takeshi Katayama, Kanagawa (JP); Hirokazu Matano, Kanagawa (JP); Kouji Imai, Kanagawa (JP); Haruki Saito, Kanagawa (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 658 days.

(21) Appl. No.: 10/651,285

(22) Filed: Aug. 29, 2003

(65) Prior Publication Data

US 2004/0107082 A1    Jun. 3, 2004

(30) Foreign Application Priority Data

Sep. 4, 2002  (JP) ............... 2002-258996
Sep. 4, 2002  (JP) ............... 2002-258997
Sep. 4, 2002  (JP) ............... 2002-258998

(51) Int. Cl.
*G06F 17/50*   (2006.01)
*G06F 17/00*   (2006.01)
*G06G 7/70*    (2006.01)
*G06G 7/48*    (2006.01)
*G06G 7/00*    (2006.01)
*G05D 3/12*    (2006.01)
*G05D 3/00*    (2006.01)
*G05D 17/00*   (2006.01)
*G01R 21/06*   (2006.01)
*G06F 19/00*   (2006.01)

(52) U.S. Cl. ............... 703/18; 700/286; 700/291; 702/60

(58) Field of Classification Search ............... 700/286, 700/291; 702/60; 703/18
See application file for complete search history.

(56) References Cited

U.S. PATENT DOCUMENTS

| | | | |
|---|---|---|---|
| 5,407,257 A | 4/1995 | Iwata | |
| 5,938,296 A | 8/1999 | Nakazawa | |
| 6,223,114 B1 | 4/2001 | Boros et al. | |
| 6,371,766 B1 * | 4/2002 | Doll et al. | 434/373 |
| 6,760,693 B1 * | 7/2004 | Singh et al. | 703/8 |
| 7,096,170 B2 * | 8/2006 | Fujita | 703/8 |

(Continued)

FOREIGN PATENT DOCUMENTS

JP    2000-329657 A    11/2000

OTHER PUBLICATIONS

Mechanical Dynamics, "ADAMS/Car Training Guide" Version 11.0, Jul. 17, 2001, 262 pgs.*

(Continued)

*Primary Examiner*—Fred Ferris
*Assistant Examiner*—Suzanne Lo
(74) *Attorney, Agent, or Firm*—Foley & Lardner LLP

(57) ABSTRACT

A car engineering assist system and method establish a master data and set a computer-generated virtual car model to represent at least a portion of a product design specification (PDS) of a test car. A real time simulator performs computer simulation of a test module using the car model, which has been set to represent at least the portion of the PDS of the test car, to produce a simulation result. A logic unit performs conformity assessment of the test module based on the simulation result and the master data.

30 Claims, 31 Drawing Sheets

U.S. PATENT DOCUMENTS

2003/0055674 A1* 3/2003 Nishiyama ..................... 705/1

OTHER PUBLICATIONS

Mechanical Dynamics, "Using ADAMS/Insight with ADAMS/Chassis" Jan. 15, 2002, 34 pgs.*

Mechanical Dynamics, "ADAMS/Car Training Guide Version 11.0", Document Properties, Jul. 17, 2001. Front page only.*

Renner et al. "Accurate Tire Models for Vehicle Handling Using the Empirical Dynamics Method", 2000 International ADAMS User Conference, 29 pages.*

Danesin et al. "Vehicle Dynamics with Real Time Damper Systems", http://www.mscsoftware.com/support/library/conf/adams/euro/2001/proceedings/papers_pdf/Paper_42.pdf, Oct. 10, 2001, 10 pages.*

Arborio et al. "Vehicle Dynamics and Stability Analysis with Matlab and Adams Car", Nov. 27, 2000, http://www.mscsoftware.com/support/library/conf/adams/euro/2000/Fiat_Poli_Vehicle_Dynamics.pdf, 9 pages.*

Lee e tal. "Hardware-in-the-Loop Simulator for ABS/TCS", IEEE, Aug. 22-27, 1999 IEEE International Conference on Control Applications, pp. 652-657.*

Kabganian et al. "A New Strategy for Traction Control in Turning Via Engine Modeling", Nov. 2001, IEEE Transactions on Vehicular Technology, vol. 50, No. 6, pp. 1540-1548.*

Horiuchi, Yutaka. "Enhancement of Vehicle Stability by Controlling the Front Brakes and Engine Torque", May 26, 1999, http://www-nrd.nhtsa.dot.gov/pdf/nrd-01/Esv/esv16/98S2P14.PDF, 11 pages.*

Y. Shibahata et al., "The Development of an Experimental Four-Wheel-Steering Vehicle", SAE Technical Paper Series, 860623, Feb. 24-28, 1986, pp. 1-8.

Jae-Cheon Lee et al., "Hardware-in-the-Loop Simulator for ABS/TCS", Proceedings of the 1999 IEEE International Conference on Hohala Coast, Aug. 1999, pp. 652-657.

D.J. Verburg et al., "VEHIL Developing and Testing Intelligent Vehicles", Proceedings IEEE Intelligent Vehicle Symposium 2002, Jun. 2002, pp. 1-8.

L. Verhoeff et al., "VEHIL: A Full-Scale Test Methodology for Intelligent Transport Systems, Vehicles and Subsystems", Proceedings of the IEEE Intelligent Vehicles Symposium 2000, Oct. 2000, pp. 369-375.

B. Hedenetz, "A Development Framework For Ultra-Dependable Automotive Systems Based on a Time-Triggered Architecture", Real-Time Systems Symposium 1998, Dec. 1998, pp. 358-367.

D. Ward et al., "Vehicle Dynamics Simulation for the Development of an Extended Adaptive Cruise Control", Advanced Intelligent Mechatronics 1999, Sep. 1999, pp. 730-735.

H. Hanselmann et al., "Real-Time Simulation Replaces Test Drives", Test and Measurement World, vol. 16, No. 3, Feb. 15, 1996, pp. 35-56, 38, 40.

H. Hanselmann et al., "Hardware-in-the-Loop Simulation Testing and its Integrating into a CACSD Toolset", Proceedings of the 1996 IEEE International Symposium on Computer-Aided Control System Design, Sep. 1996, pp. 152-156.

Y. Hori, "Future Vehicle Driven by Electricity and Control—Research on Four Wheel Motored UOT Electric March II", Advanced Motion Control, 2002, IEEE, pp. 1-14.

P. Shavrin, "Control of Independent Rear Wheel Drive Vehicle", IEEE, Conference on Decision and Control, 1995, pp. 4380-4385.

J. Park et al., "H. Yaw-Moment Control with Brakes for Improving Driving Performance and Stability", IEEE, International Conference on Advanced Intelligent Mechatronics, 1999, pp. 747-752.

F. Jinzhi et al., "An Investigation on Integrated Control of Vehicle Anti-lock Braking System and Active Suspension", Mar. 2002, pp. 15-19.

Y. Tang et al., "Simulation of the Dynamic Performance of CHANASTAR Minicar with Automatic Transmission", Journal of Chongqing University (Natural Science Edition), Jun. 2002, vol. 25, No. 6, pp. 8-12.

* cited by examiner

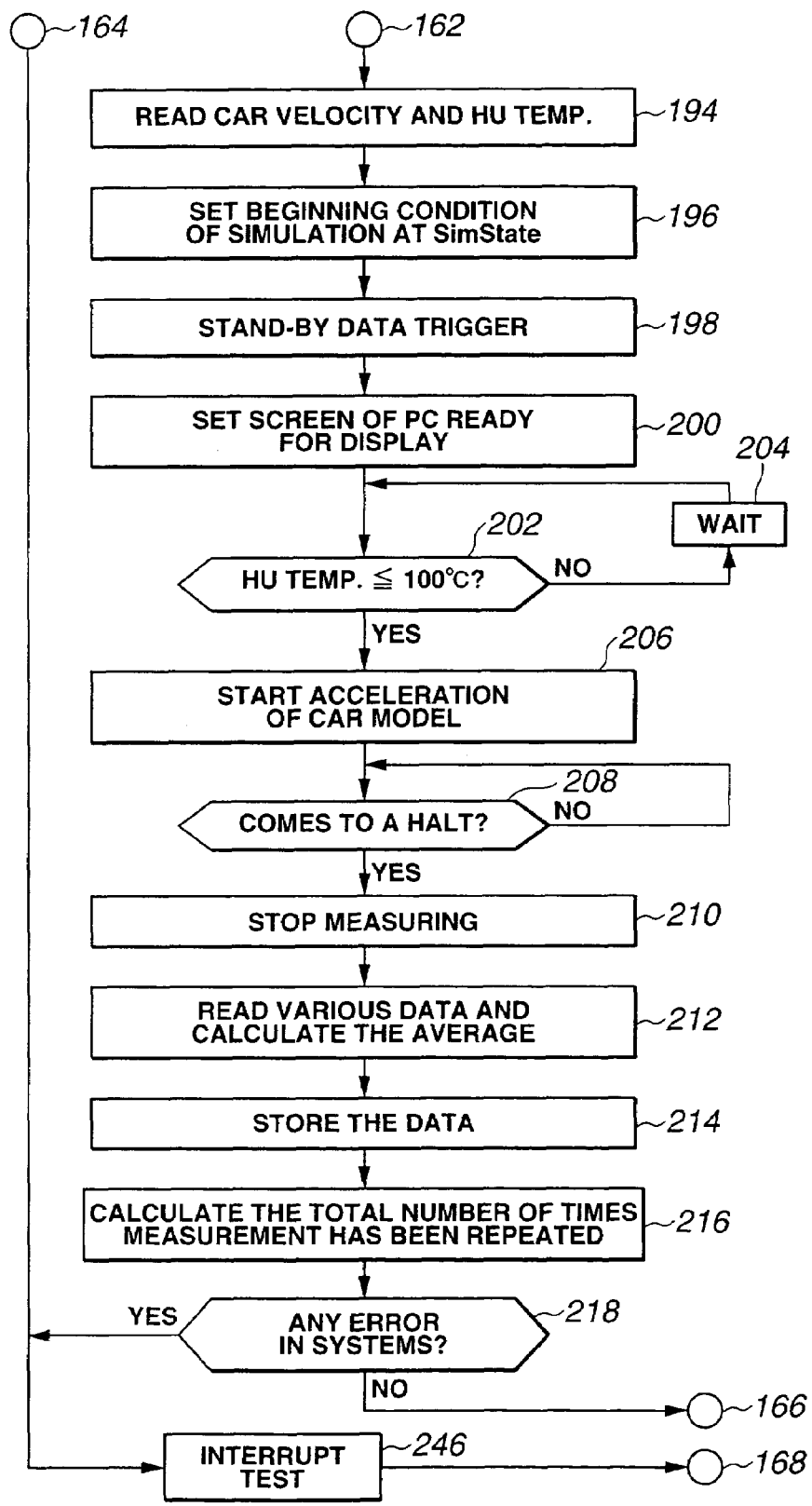

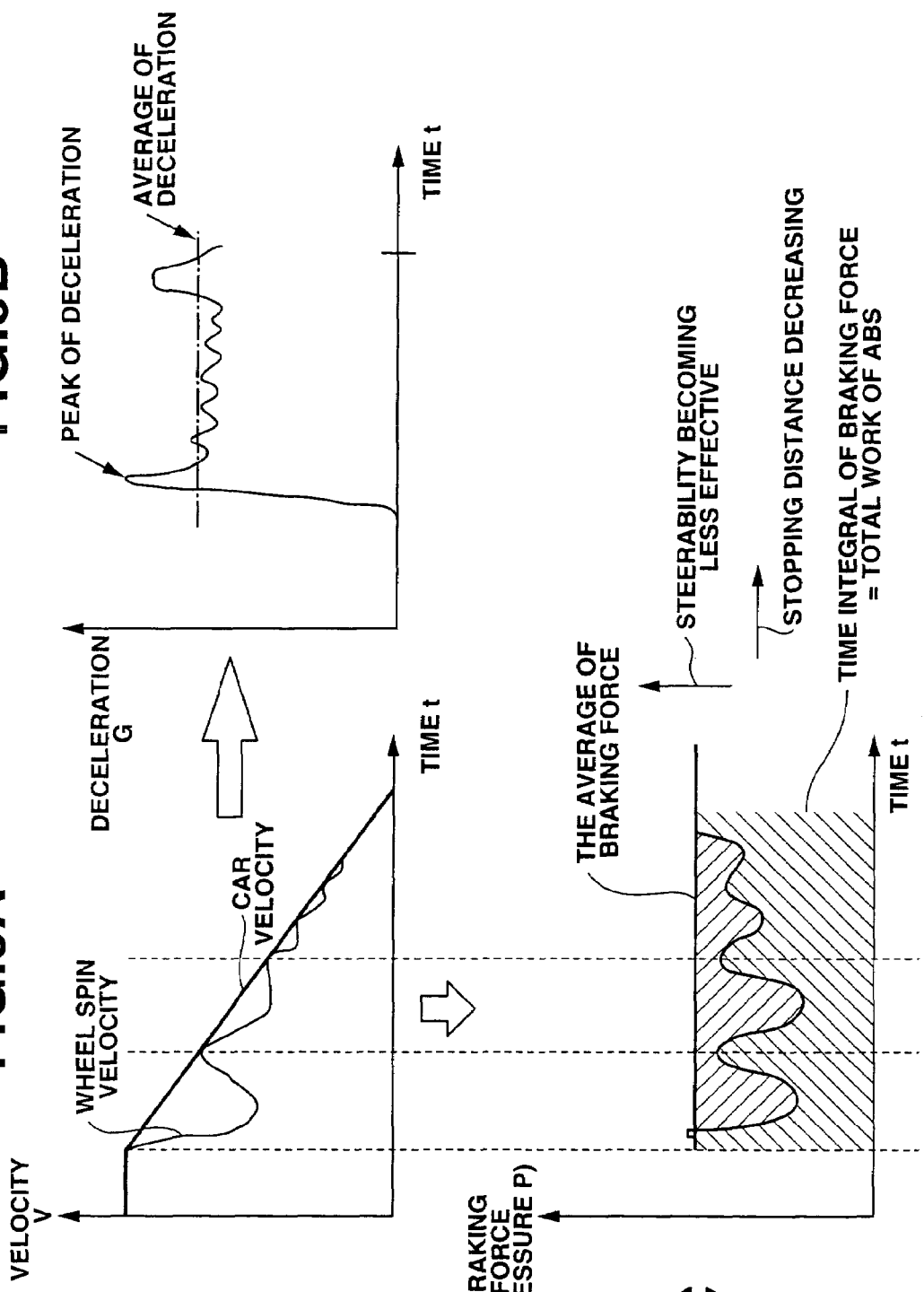

FIG.10

|  |  | F1 | |
|---|---|---|---|
|  |  | X1 | X2 |
| F2 | Y1 | 1 | 2 |
|  | Y2 | 3 | 4 |

FIG.11

| ROAD | HIGH μ (μ=1.09) | LOW μ (μ=0.81) |
|---|---|---|
| ROAD TESTING | 41.3m | 58.1m |
| SIMULATION | 41.6m | 57.3m |
| ERROR | +0.3m | -0.8m |
| TOLERANCE | ≦1.5m | ≦2.0m |

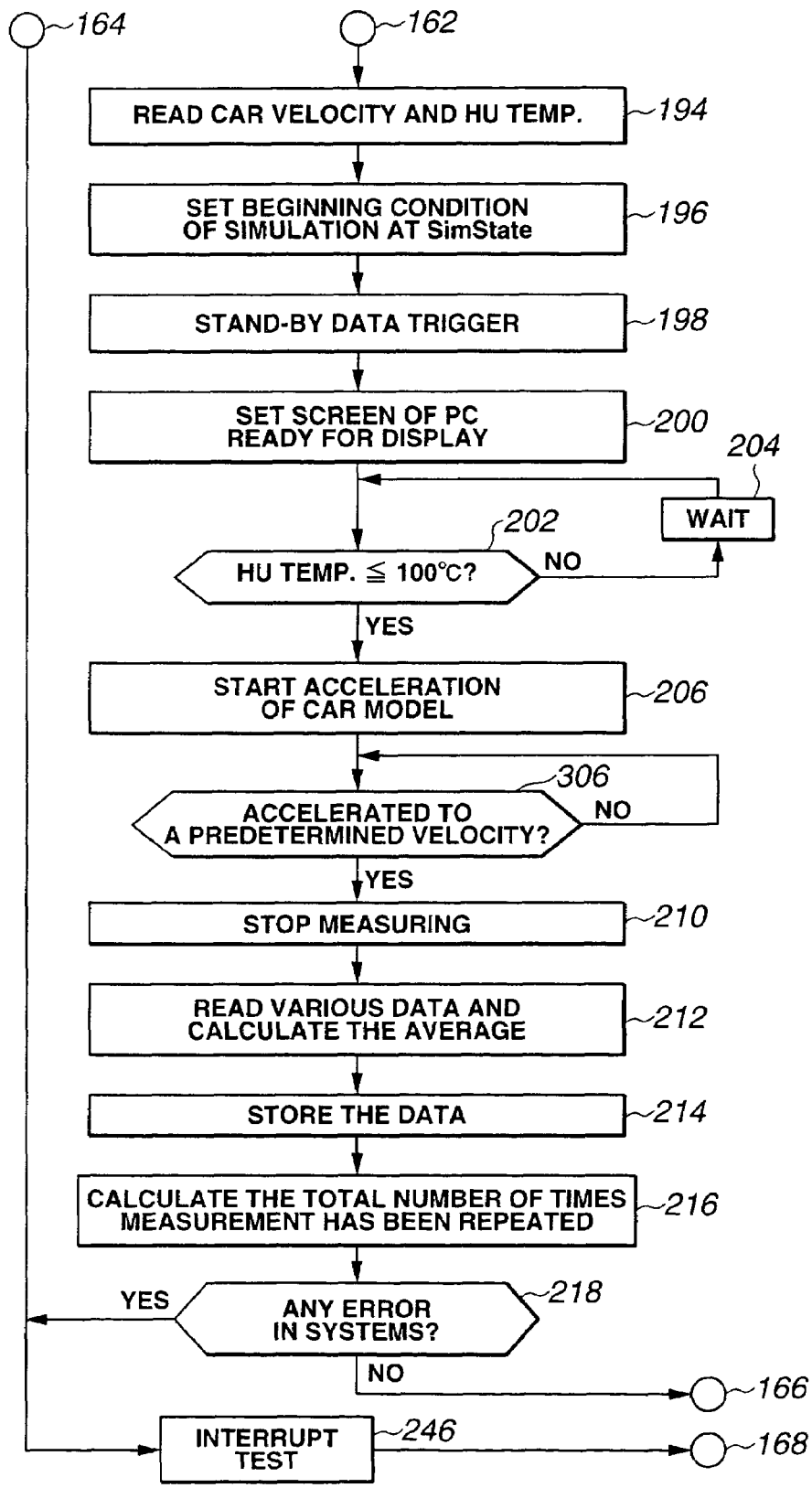

FIG.15A
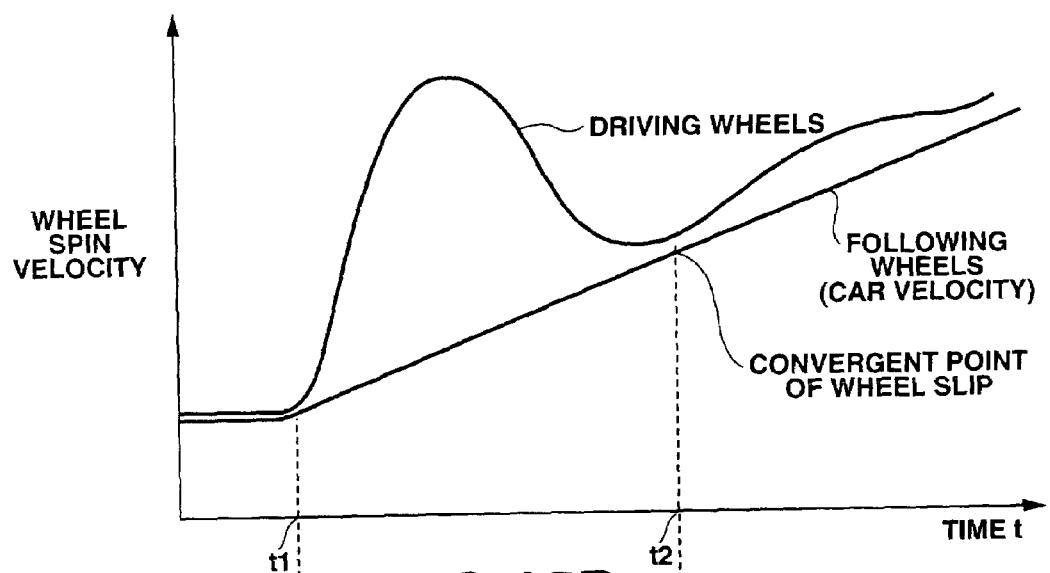
FIG.15B
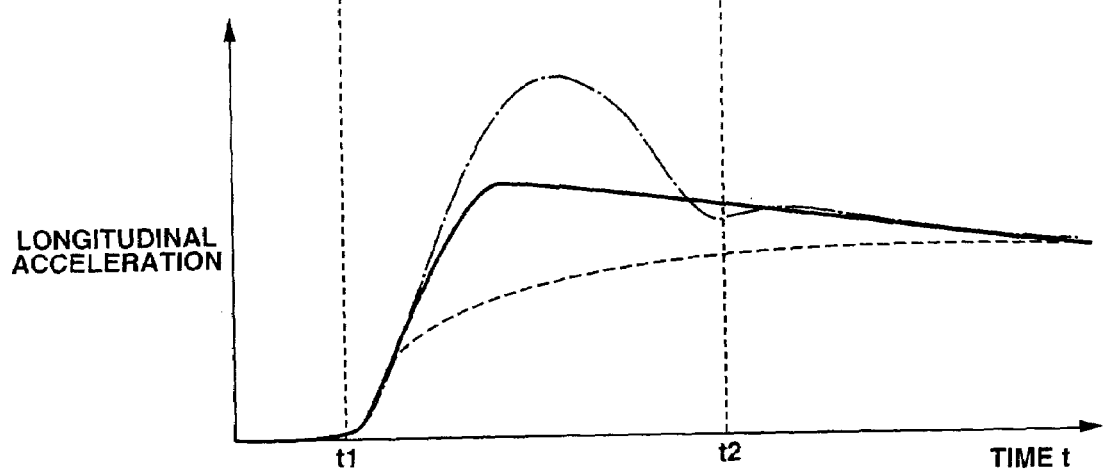
FIG.16
|  |  | F1 | |
|---|---|---|---|
|  |  | X1 | X2 |
| F2 | Y1 | 1 | 2 |
|  | Y2 | 3 | 4 |

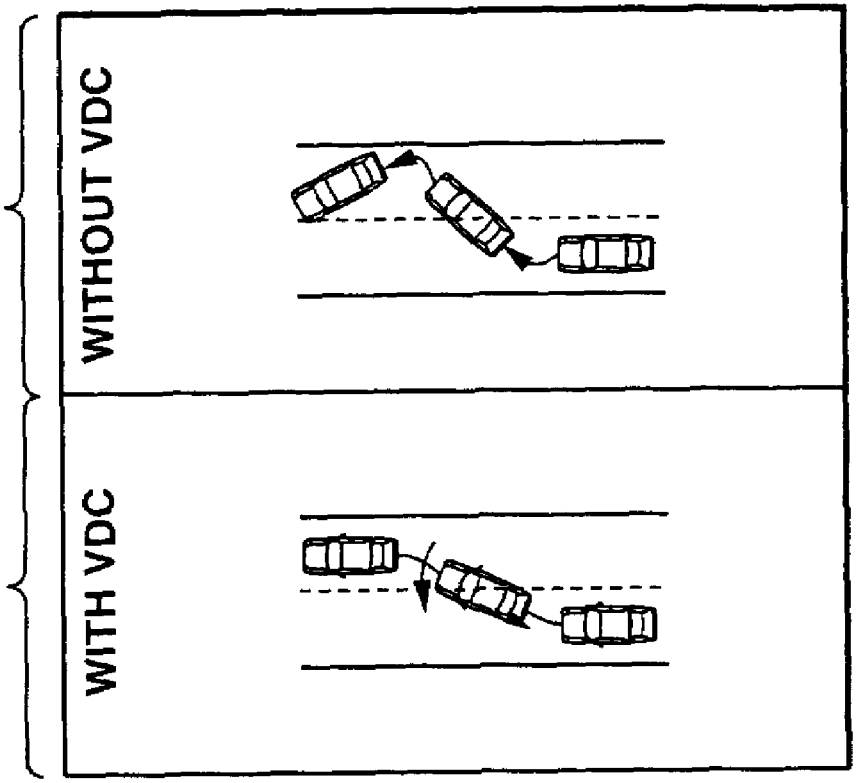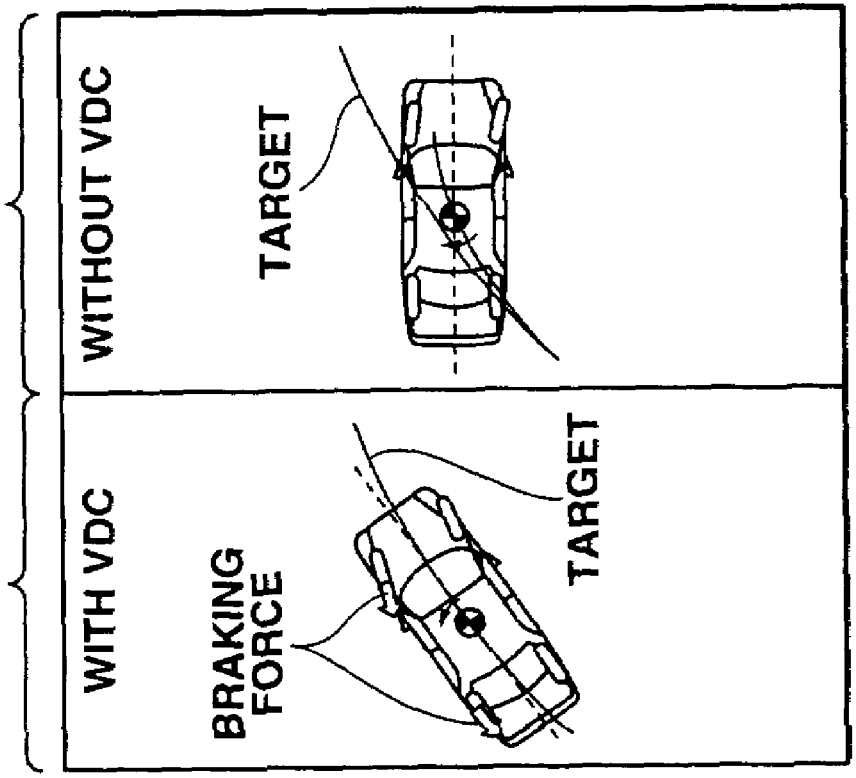

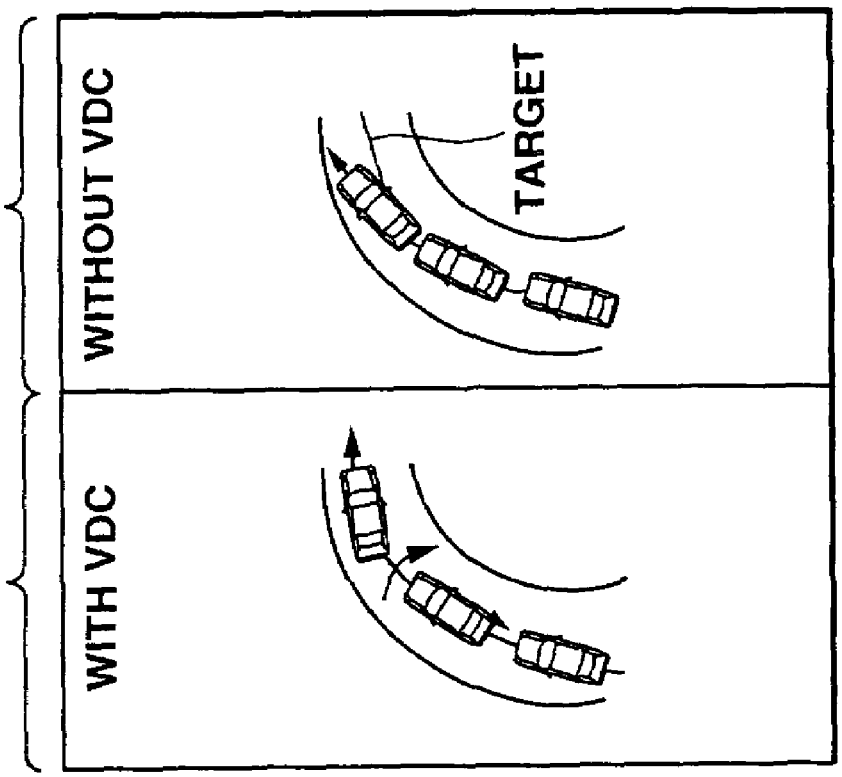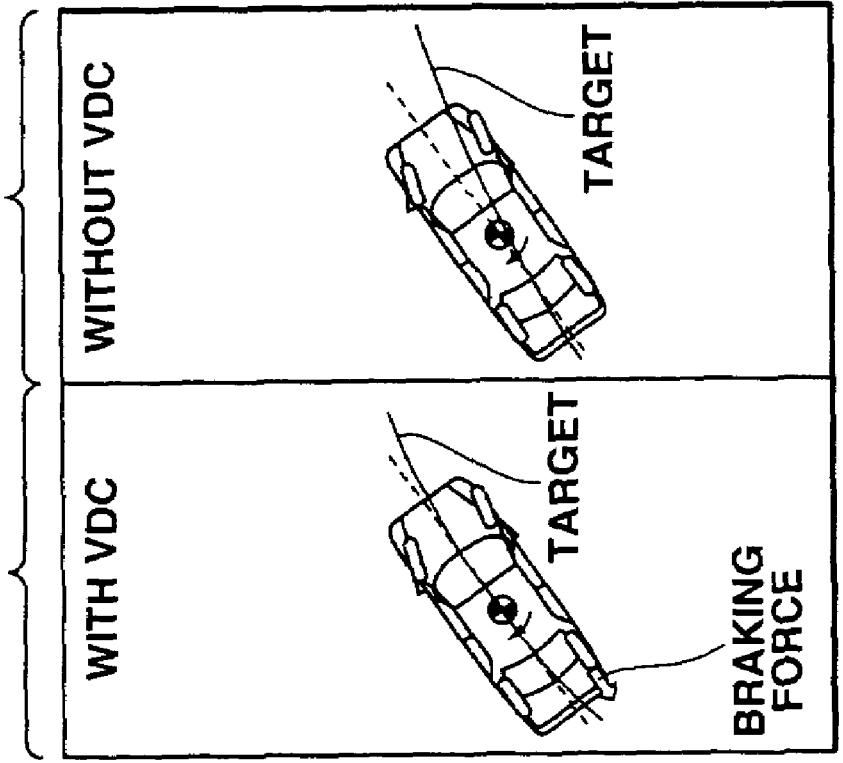

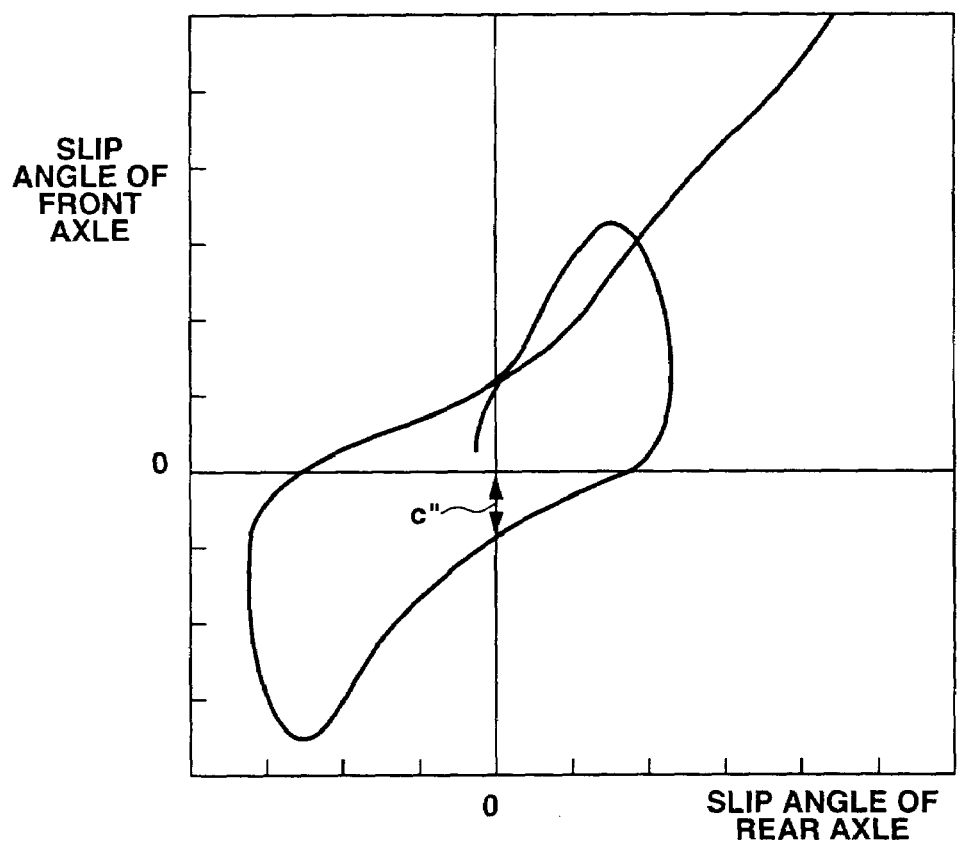

ENGINEERING ASSIST METHOD AND SYSTEM

BACKGROUND OF THE INVENTION

1. Field of the Invention

The present invention relates to an engineering assist method and system.

2. Description of the Background Art

Traditional design techniques require the creation of a prototype that is to be produced based on a product design specification (PDS) drafted by approximating function and performance of the product accounting for PDS of a car and specification of the installed equipment on the car. The prototype is then installed on the car and subjected to road testing. The road testing evaluates the performance and functional characteristics of the car. Testing on test bench is also carried out to evaluate operation of the prototype alone against the PDS. As a result of these tests, various modifications in parameter is made to the prototype and/or new parameter(s) are added, and these modifications are tested in order to allow for the production of a final product, which is optimized to fit the car.

While these traditional techniques or methods are effective, they are relatively costly and time consuming mainly due to the use of a real car for testing the prototype in a real operational setting. Preparation for the testing using the car requires considerably large amount of time and number of processes. Further, collecting reliable test results under a desired input condition inevitably demands repetition of the same testing using the car in order to compensate for deviation from the desired input condition, increasing the amount of time and number of processes. The deviation occurs due to different road profiles and/or different driving skills.

In development of a new car, the parameter optimization of modules, such as a chassis system, cannot begin until completion of a real car. Various changes and/or modifications to be made to the prototype as a result of road testing inevitably occur in the second half of the development of new car, and the production of a final product may be delayed until immediately before the production of a final version of car. In this case, any addition in functional characteristic, if needed, might cause an increase in number of input signals, causing cost increase or delay in production of the final product.

Further, the use of a real car over a long period of time increases cost for testing the prototype.

One attempt at improving upon the drawbacks upon these traditional techniques utilizes simulation of control logic and then downloads the control logic to a controller of a real car. JP P2000-329657A discloses an example of simulation technique of control logic of a chassis system.

While this approach reduces the amount of time required for developing a prototype, it still requires the use of a real car for testing.

An object of the present invention is to provide an engineering assist method and system, which can reduce the amount of time and cost required till the production of a final product or version of a module.

Another object of the present invention is to provide an engineering assist method and system, which can eliminate the road testing using a real car to allow for the production of a final product or version of a module, which is optimized to fit a car.

SUMMARY OF THE INVENTION

According to one exemplary implementation of the present invention, there is provided a car engineering assist method comprising:
   establishing a master data;
   setting a computer-generated virtual car model to represent at least a portion of a product design specification (PDS) of a test car;
   performing computer simulation of a test module using the car model, which has been set to represent at least the portion of the PDS of the test car, to produce a simulation result; and
   performing conformity assessment of the test module based on the simulation result and the master data.

According to another exemplary implementation of the present invention, there is provided an engineering assist system comprising:
   a master data;
   a test module;
   a real time simulator performing computer simulation of the test module using a computer-generated virtual car model, which is set to represent at least a portion of a product design specification (PDS) of a test car, to produce a simulation result; and
   a logic unit performing conformity assessment of the test module based on the simulation result and the master data.

BRIEF DESCRIPTION OF THE DRAWINGS

The invention will be apparent from reading of the following description in conjunction with the accompanying drawings.

FIGS. 6A, 6B and 6C, when combined, illustrate a processing flow diagram for simulation of ABS using a virtual car model.

FIGS. 9A to 9C are graphs illustrating alternative characteristics of ABS.

FIG. 10 is a table showing different results obtained by conformity assessment of ABS.

FIG. 11 is a table showing stopping distances obtained by road testing and simulation of ABS.

FIGS. 12A, 12B and 12C, when combined, illustrate a processing flow diagram for simulation of TCS using a virtual car model.

FIG. 15A is a graph illustrating the typical pattern of wheel slip of driving wheels at acceleration.

FIG. 15B is a graph illustrating three patterns of variation of car longitudinal acceleration due to three different torque reduction patterns on constraint of TCS.

FIG. 16 is a table showing different results obtained by conformity assessment of TCS.

FIGS. 21A, 21B, 21C, and 21D are views illustrating how effectively VDC system can alleviate oversteer tendency of a car during turning and lane change on low friction road.

FIGS. 22A, 22B, 22C and 22D are views illustrating how effectively VDC system can alleviate understeer tendency of a car during turning and cornering.

FIG. 27 shows another example of vehicle side slip angle during lane change on low friction road.

FIG. 28 is a table showing different results obtained by conformity assessment of VDC system.

DESCRIPTION OF THE EMBODIMENTS

Figure 1:
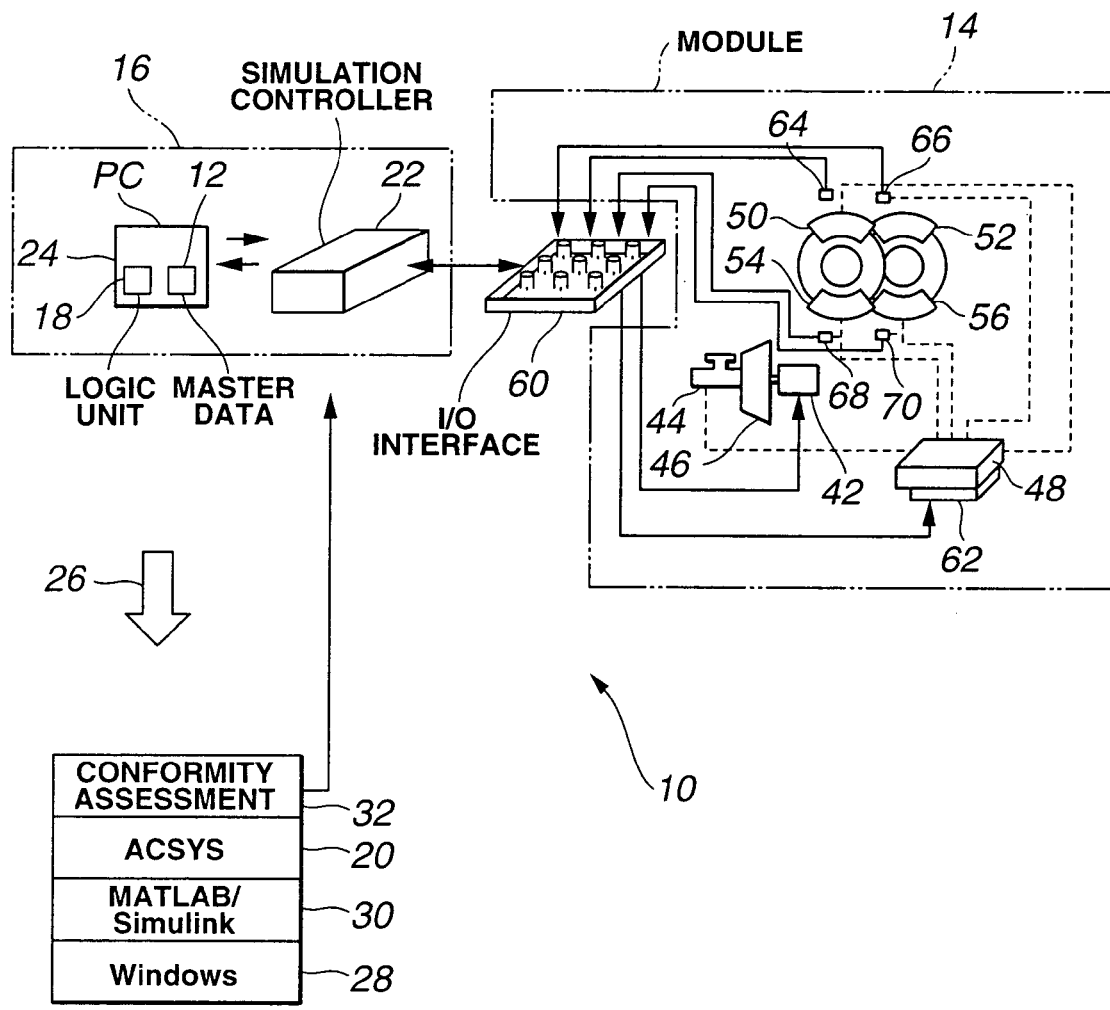
FIG. 1 is a block diagram of hardware and software implementing one exemplary implementation of the present invention.

Referring now to the accompanying drawings, FIG. 1 shows hardware and software of an exemplary implementation of a car engineering assist method and system according to the present invention. In FIG. 1, the car engineering assist system is generally indicated at 10. The system 10 is comprised of a master data 12, a test module 14, a real time simulator 16, and a logic unit 18. According to the method, the master data is established. A computer-generated virtual car model 20 is set to represent at least a portion of a product design specification (PDS) of a test car. Installation of the test module 14 on the test car is intended. Computer simulation of the test module 14 using the virtual car model 20 set for the test car is performed to produce a simulation result. Conformity assessment of the test module 14 is performed based on the simulation result and the master data 12.

The master data 12 is established on a knowledge base that a master car installed with a master module exhibits satisfactory performance and the master module exhibits satisfactory system operation. Before entering further into the manner of establishing the master data 12, the following section provides description on what the master and test modules are.

This section provides the description on the master and test modules. The master and test modules are of a control system including an actuator under control of a microprocessor based controller. The control system may be a chassis system. In embodiments, an anti-lock braking system (ABS), a traction control system (TCS), and a vehicle dynamics control (VDC) system are examples of the chassis system. The control system may be one of a four-wheel drive (4WD) system, and a four-wheel steering (4WS) system. For understanding of the 4WS system, reference should be made to Yasuji SHIBAHATA et al. SAE Technical Paper Series 860623 (Feb. 24-28, 1986) "The Development of an Experimental Four-Wheel-Steering Vehicle", which is hereby incorporated by reference in its entirety. Other examples of the control system are a fuel cell vehicle (FCV) drive system, a hybrid electric vehicle (HEV) drive system, an engine-automatic transmission (A/T) drivetrain control system, an engine-continuously variable transmission (CVT) drivetrain control system, a steering system, an intervehicle control system, a lane following control system, an electric steering system, a power-assist control system, and a reaction control system. The control systems of different makes and designed to operate in similar manners may be used as the master and test modules. In this case, the master and test car may be the same or different. The control systems of the same make and designed to operate in the same manner may be used as the master and test modules. In this case, cars of different PDSs are used as the master and test cars, respectively.

This section provides the description on the manner of establishing the master data 12. As mentioned before, the master data 12 is established on the knowledge base that a master module has a satisfactory fit to a master car. The master data 12 includes alternative characteristics for conformity assessment of the test module in terms of its system operation and at least one alternative characteristic for conformity assessment of the test module in terms of its effectiveness on the test car. The master data 12 may be established by collecting data obtained by road testing of a master car installed with a master module for creation of the alternative characteristics. In the embodiments, the master data 12 is established by setting the computer-generated virtual car model 20 to represent at least a portion of a PDS of the master car, and by performing computer simulation of the master module using the car model, which has been set as mentioned above, to produce a simulation result for creation of the alternative characteristics.

Figure 2:
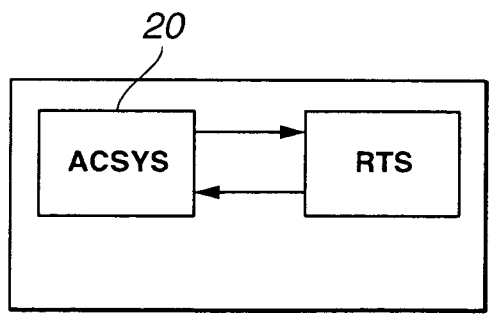
FIG. 2 is an illustration of a computer-generated virtual car model running in real time simulation (RTS) environment.

With continuing reference to FIG. 1, the real time simulator 16 can perform computer simulation of a main/test module using the computer-generated virtual car model 20 in real time simulation (RTS) environment. FIG. 2 illustrates the virtual car model 20 running in the RTS environment.

In the embodiments, a virtual car model called ACSYS or ACSYS CONTROL is used. ACSYS CONTROL stands for Automotive Continuous simulation SYStem for vehicle dynamics CONTROL. The ACSYS is available at Nissan Motor Co., Ltd, Kanagawa, Japan. The ACSYS is just one of examples, which may be used as the virtual car model. Simulation software CarSim is another example. The CarSim is a product of Mechanical Simulation Corporation, US. Vedyna of TESIS, DE is another example. Labcar of ETAS, DE is still another example.

In the embodiments, the real time simulator 16 includes a simulation controller 22, and a computer processor in the form of a personal computer (PC) 24. The simulation controller 22 and the PC 24 are communicatively coupled to each other. The PC 24 operates under stored program control Boxes located in the direction of an arrow 26 illustrate programs for the PC 24. Windows 2000, as represented by a box 28, is operating system (OS) of the PC 24. A box 30 represents a model based design tool MATLAB/Simulink of The Math Works. Inc. US. The virtual car model ACSYS 20 has been developed using MATLAB/Simulink 30. A box 32 represents a computer program for the logic unit 18 to perform conformity assessment of the test module 14 based on the simulation result and the master data 12.

Figure 3:
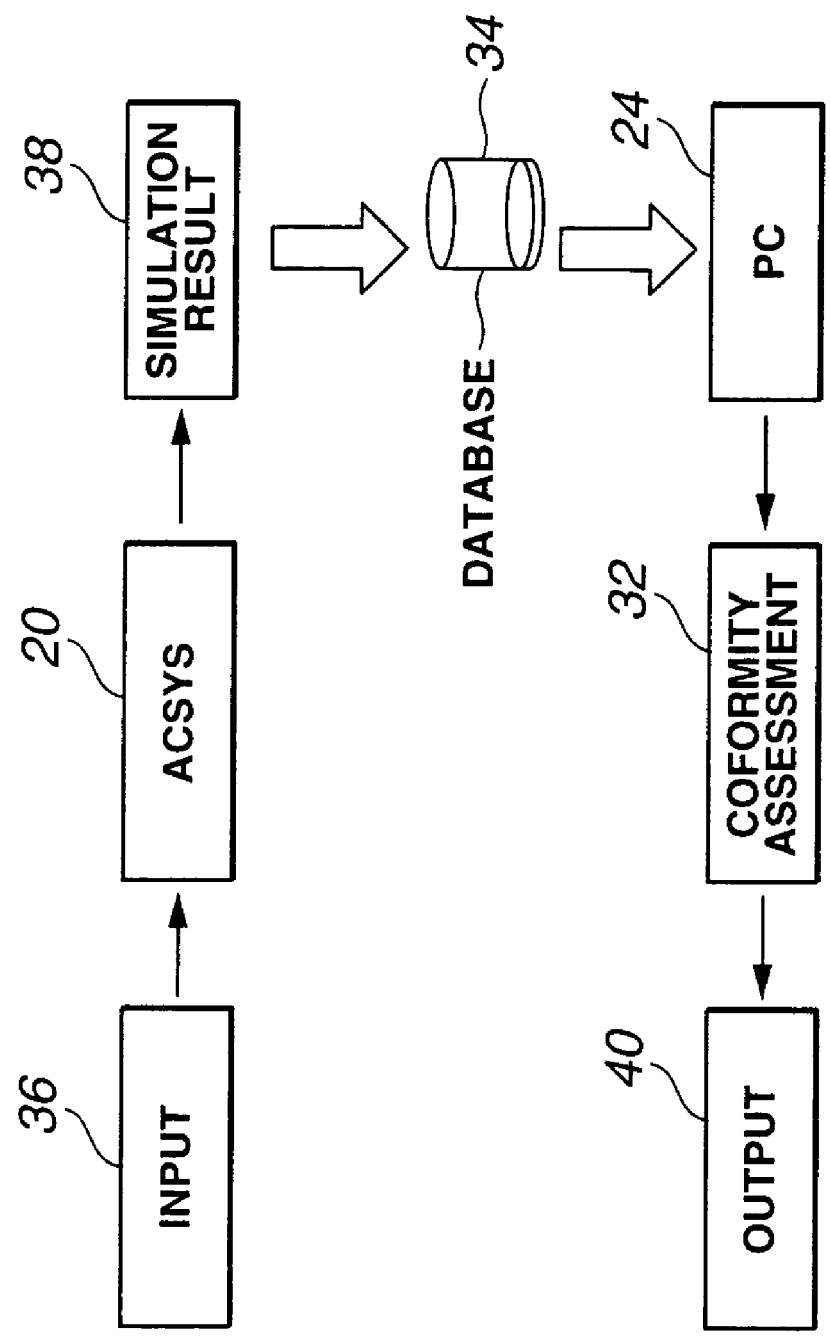
FIG. 3 is a block diagram illustrating simulation to form database of the simulation result, and conformity assessment including processing data from the database to create alternative characteristics.

In the embodiments, performing conformity assessment includes processing the simulation result to create the alternative characteristics. As mentioned before, the master data 12 includes alternative characteristics for conformity assessment of the test module 14 in terms of its system operation and at least one alternative characteristic for conformity assessment of the test module 14 in terms of its effectiveness on the test car. With reference to FIG. 3, the alternative characteristics of the master data 12 are created by processing data out of database 34. Setting the virtual car model 20 to represent a portion of the PDS of the master car via an input box 36 is prerequisite. In the embodiments, as it is known to have a satisfactory fit to the master car, the module 14 is regarded as the master module. Using the virtual car model 20, computer simulation of the module 14 is performed to produce simulation result 38. The simulation continues until sufficient amount of simulation result 38 are produced to form the database 34. The database 34 is an input to the PC 24. The PC 24 operates under the control of conformity assessment program 32 to process the simulation result out of the database 34 to create the alternative characteristics. These alternative characteristics constitute the master data 12.

With continuing reference to FIG. 3, the virtual car model 20 is now set to represent a portion of the PDS of the test car and used in performing simulation of the test module 14 to produce simulation result 38, thereby to form new database 34. Under the control of conformity assessment program 32, the PC 24 operates to process the simulation result to create alternative characteristics of the test module 14 in terms of its system operation and at least one alternative characteristic of the test module 14 in terms of its effectiveness on the test car. These alternative characteristics constitute a "compare" data.

Under the control of conformity assessment program 32, the PC 24 operates to compare the alternative characteristics of the module 14, which constitute the compare data, to the alternative characteristics for conformity assessment of the module 14, which constitute the master data 12, respectively. Based on the comparison result, the PC 24 makes decision whether the modification of the module 14 is needed or the module 14 as it is has a satisfactory fit to the test car. The decision made is used as an output at an output box 40.

This section provides further description on the virtual car model ACSYS 20. Parameters representing characteristics of elements of a car are used as input file for the car model ACSYS 20 to simulate, on real time basis, operation of the car.

In the embodiments, the module 14 takes the form of a control system, such as ABS, TCS and VDC. For the control system, the virtual car model ACSYS 20 was developed based on a conventional car model for evaluation and analysis of driving stability and ride comfort. This conventional car model is comprised of element models representing a suspension system, a steering system, and a chassis system. For the control system, the car model ACSYS 20 has incorporated additional element models representing an engine, a drivetrain, brakes and tires. To excite the car model ACSYS 20, setting of each of the incorporated element models in the input file suffices. Moreover, the car model ACSYS 20 can be used in any desired versions by selecting any desired one of the element models via a particular switch. The provision of such switches makes it easy to vary version of the car model ACSYS 20 with different cars in type.

With reference again to FIG. 3, the input box 36 represents the above-mentioned input file that excites the car model ACSYS 20. The virtual car model 20 produces the simulation result 38. The simulation result 38 includes variations of wheel braking force against time when the test module 14 is the ABS. The simulation result 38 includes variations of wheel spin velocity against time when the test module 14 is the TCS. The simulation result 38 includes variations of slip angles of the front and rear axles against time when the test module 14 is the VDC system.

With reference back to FIG. 1, downloading the car model ACSYS 20 allows the simulation controller 22 of the real time simulator 16 to perform simulation, on real time basis, at regular time intervals of 1 millisecond. Let us now consider how the car model ACSYS 20 operates on constraint of anti-lock braking at deceleration. Via a braking effort generator 42, applying a thrust, as an input, to a master cylinder 44 with a booster 46 produces a braking hydraulic pressure. The braking pressure is used as an input to a VDC/TCS/ABS actuator 48. The actuator 48 allows for transmission of braking pressure to wheel cylinders 50, 52, 54 and 56. Calculation is performed, based on the transmitted braking pressure, a coefficient of friction of brake pads, an effective area of caliper pistons, and an effective radius of rotors, to give a braking torque. The calculated braking torque is transmitted to each of tires.

With continuing reference to FIG. 1, the output signals of the real time simulator 16 are fed to an input/output (I/O) interface 60. The I/O interface 60 has a D/A board and a CAN board. The simulated values are in digital form and indicate wheel spin velocity, yaw rate, lateral acceleration, braking pressure and steering angle, which in real world would be supplied, as sensor analog or CAN signals, to a VDC/TCS/ABS controller 62. The D/A board and CAN board convert the simulated values into appropriate input forms to the VDC/TCS/ABS controller 62. The simulated values indicative of wheel spin velocity, yaw rate, lateral acceleration and braking pressure are updated at regular intervals of 1 millisecond. The simulated value indicative of steering angle is updated at regular intervals of 10 milliseconds. In the embodiment, the simulated value indicative of braking pressure is not used because the sensor output of a braking pressure sensor is used. In the embodiment, the actual braking system is used. An alarm is produced when the system fails to function or operate properly.

With continuing reference to FIG. 1, in the embodiment, the VDC/TCS/ABS controller 62 is the same as the onboard one. The controller 62 receives signals from the I/O interface 60 and controls the actuator 48. The actuator 48, master cylinder 44 and wheel cylinders 50, 52, 54 and 56 are the same as the onboard units.

Wheel cylinder pressure sensors 64, 66, 68 and 70 detect braking pressures at the wheel cylinders 50, 52, 54 and 56, respectively. The sensor outputs are fed to the I/O interface 60.

Figure 4:
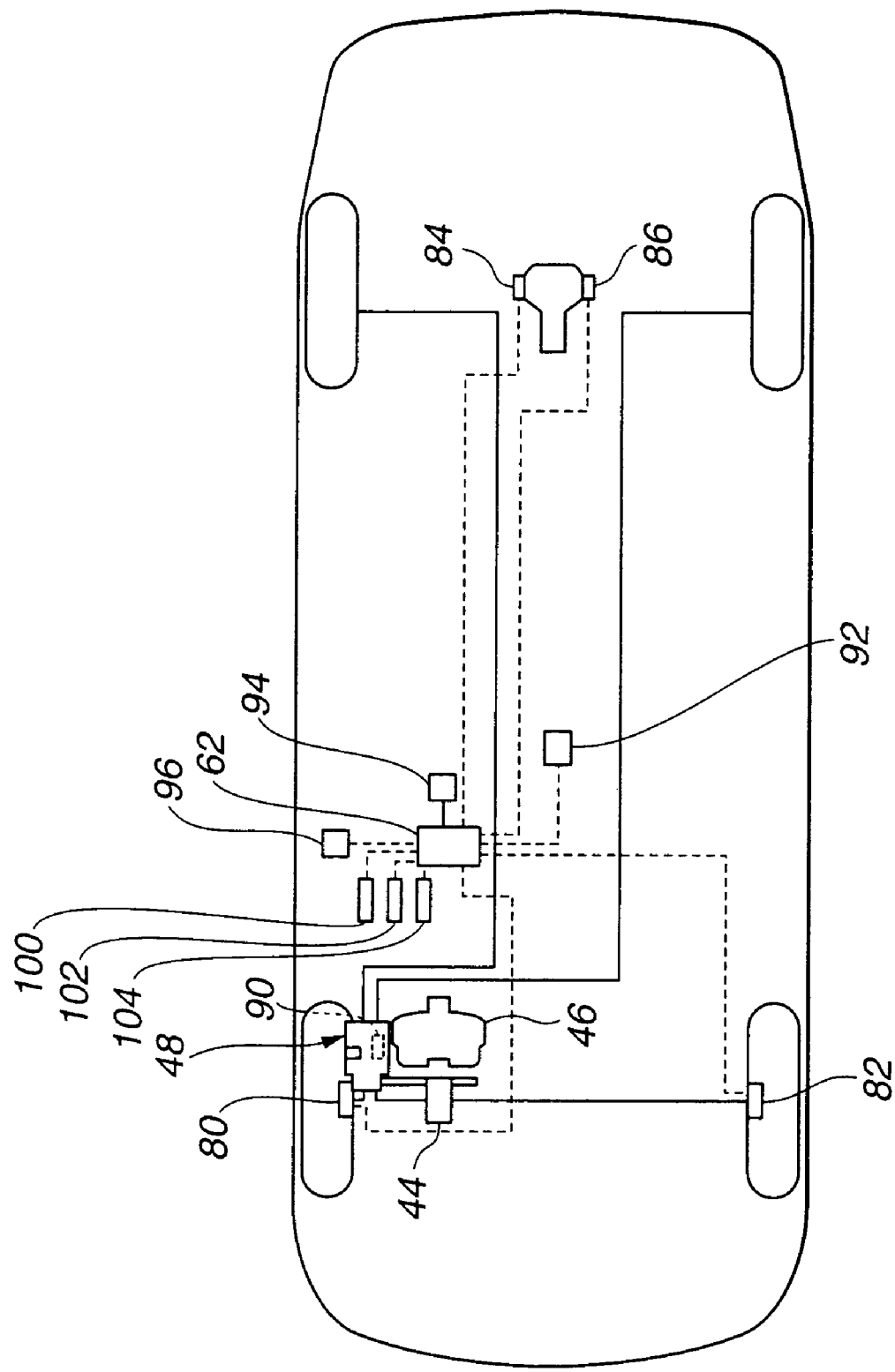
FIG. 4 is an illustration of a real car with a chassis system.

FIG. 4 illustrates a real car installed with the chassis system. The chassis system includes the VDC/TCS/ABS controller 62, the master cylinder 44, the VDC/TCS/ABS actuator 48, and the booster 46. It also includes wheel spin velocity sensors 80, 82, 84 and 86, a built-in pressure sensor 90 of the VDC/TCS/ABS actuator 48, a yaw rate/lateral G sensor 92, a steering angle sensor 94, a VDC off switch 96, and various display devices, namely, a VDC off display 100, a slip display 102 and an alarm display 104. These display devices 100, 102 and 104 communicate with the VDC/TCS/ABS controller 62 by CAN.

Along with electronic developments in chassis systems, the embodiments are considered. In one embodiment, the invention is applied to an ABS (anti-lock braking system). Once an ABS is installed, it becomes simple matter to add a traction control facility by detecting wheel spin velocity during acceleration and momentarily applying braking force to limit it. In another embodiment, the invention is applied to a TCS (traction control system). Looking beyond TCS, trend will be to integrate vehicle dynamics control (VDC) into ABS. In still another embodiment, the invention is applied to a VDC system. The VDC works by having an electronic control unit determine the degree of understeer or oversteer during cornering and then use the ABS to apply a carefully determined braking force to one or more wheels in order to restore neutral handling and maximize vehicle stability. To implement VDC, it is necessary to install a yaw rate/lateral G (acceleration) sensor to detect vehicle yaw and to measure cornering force.

Figure 5:
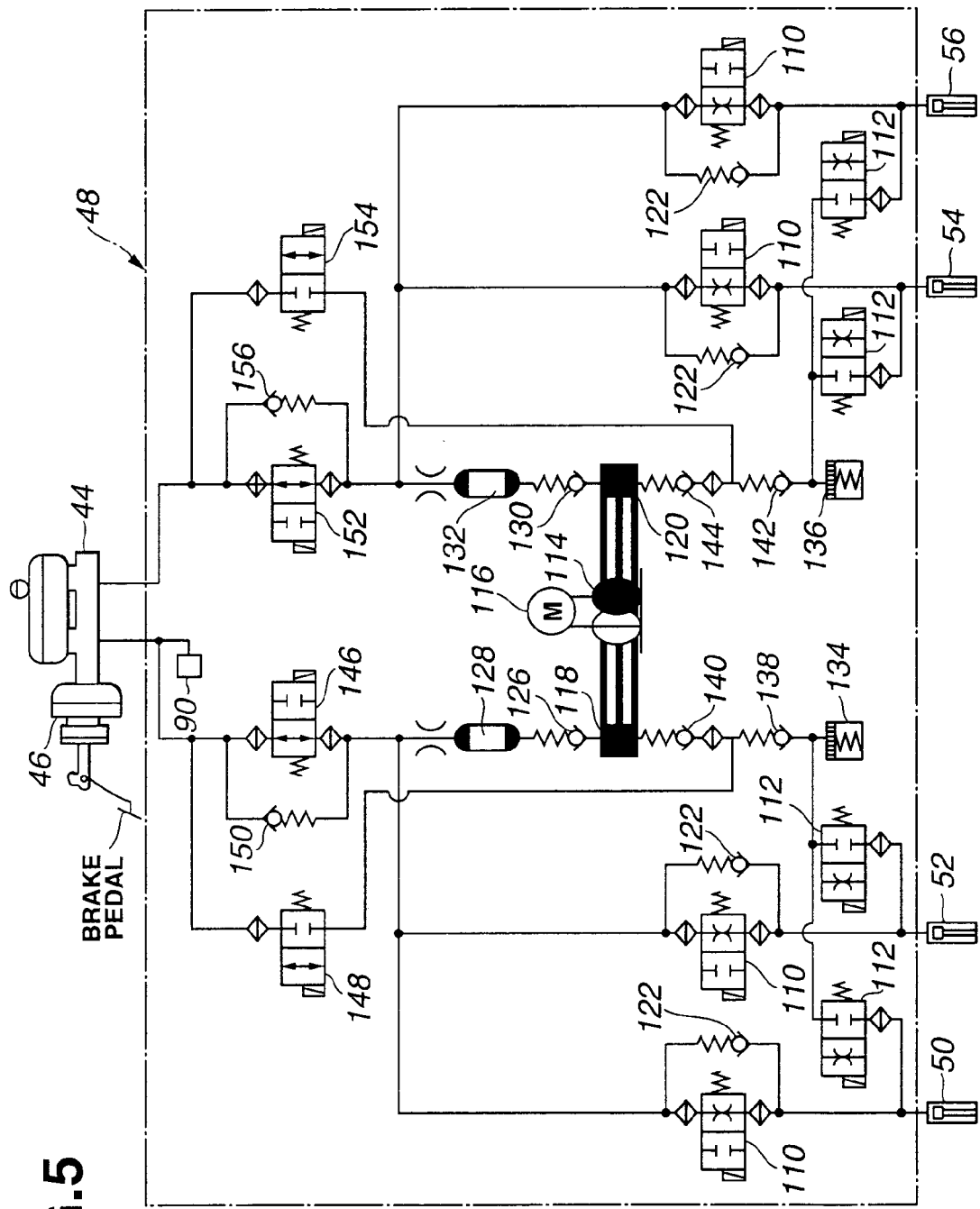
FIG. 5 is a hydraulic circuit of a VDC/TCS/ABS actuator.

A hydraulic circuit of FIG. 5 illustrates one example of the VDC/TCS/ABS actuator 48. The actuator 48 is operatively disposed between the master cylinder 44 and the wheel cylinders 50, 52, 54 and 56. The actuator 48 employs a hydraulic circuit configuration of the type that includes, per each wheel cylinder 50, 52, 54, 56, a pair of solenoid operated inlet and outlet valves 110 and 112 for applying a determined braking pressure to the wheel cylinder, and a pump 114 driven by a motor 116. The pump 114 has a front pump portion 118 circuited with two pairs of solenoid operated inlet and outlet valves 110 and 112 for the front wheel cylinders 50 and 52 and a rear pump portion 120 is circuited with the other two pairs for the rear wheel cylinders 54 and 56. Naturally, this circuit connection differs depending on the type, vertically split or diagonally split, of brake system selected. The vertically split brake system implementing the above-mentioned hydraulic circuit configuration is disclosed in U.S. Pat. No. 5,407,257 (Iwata) issued Apr. 18, 1995, which patent has been hereby incorporated by reference in its entirety. The diagonally split brake system implementing the above-mentioned hydraulic circuit configuration is disclosed in U.S. Pat. No. 5,938,296 (Nakazawa) issued Aug. 17, 1999, which patent has been hereby incorporated by reference in its entirety.

Turning to the illustrated circuit configuration in FIG. 5, a return check valve 122 is provided across each inlet valve 110. A one-way outlet valve 126 and a damper 128 are fluidly disposed between the front pump portion 118 and the two inlet valves 110 for the front wheel cylinders 50 and 52. Similarly, a one-way outlet valve 130 and a damper 132 are fluidly disposed between the rear pump portion 120 and the other two inlet valves 110 for the rear wheel cylinders 54 and 56. A front reservoir 134 is connected to the two outlet valves 112 for the front wheel cylinders 50 and 52. A check valve 138 and a one-way inlet valve 140 are fluidly disposed between the outlet valves 112 for the front wheel cylinders 50 and 52 and the front pump portion 118. Similarly, a check valve 142 and a one-way inlet valve 144 are fluidly disposed between the outlet valves 112 for the rear wheel cylinders 54 and 56.

Two solenoid operated ON/OFF gate valves 146 and 148 are provided to control fluid communication between the master cylinder 44 and the two pairs of solenoid operated inlet and outlet valves 110 and 112 for the front wheel cylinders 50 and 52. A check valve 150 is provided across the gate valve 146. The gate valve 146 is fluidly disposed between the two inlet valves 110 for the front wheel cylinders 50 and 52 and the master cylinder 44. The other gate valve 148 is fluidly disposed between the two outlet valves 112 for the front wheel cylinders 50 and 52 and the master cylinder 44.

The other two solenoid operated ON/OFF gate valves 152 and 154 are provided to control fluid communication between the master cylinder 44 and the other two pairs of solenoid operated inlet and outlet valves 110 and 112 for the rear wheel cylinders 54 and 56. A check valve 156 is provided across the gate valve 152. The gate valve 152 is fluidly disposed between the two inlet valves 110 for the rear wheel cylinders 54 and 56 and the master cylinder 44. The other gate valve 154 is fluidly disposed between the two outlet valves 112 for the rear wheel cylinders 54 and 56 and the master cylinder 44.

In response to signals from the controller 62, the solenoid operated ON/OFF gate valves 146, 148, 152 and 154, and the four pairs of solenoid operated inlet and outlet valves 110 and 112 operate to control braking pressure applied to each wheel cylinder 50, 52, 54 and 56 in one of various modes, including, a normal braking mode, a hold mode (ABS), a pressure reduction mode (ABS) and a pressure recovery mode (ABS).

As mentioned before, in the embodiments, the car engineering assist system 10 performs simulation of a control system or module 14 using the car model of a master car to produce simulation result for establishing the master data 12 and then performs simulation of the control system 14 using the car model of a test car to produce simulation result for establishing the "compare" data.

Figure 6A:
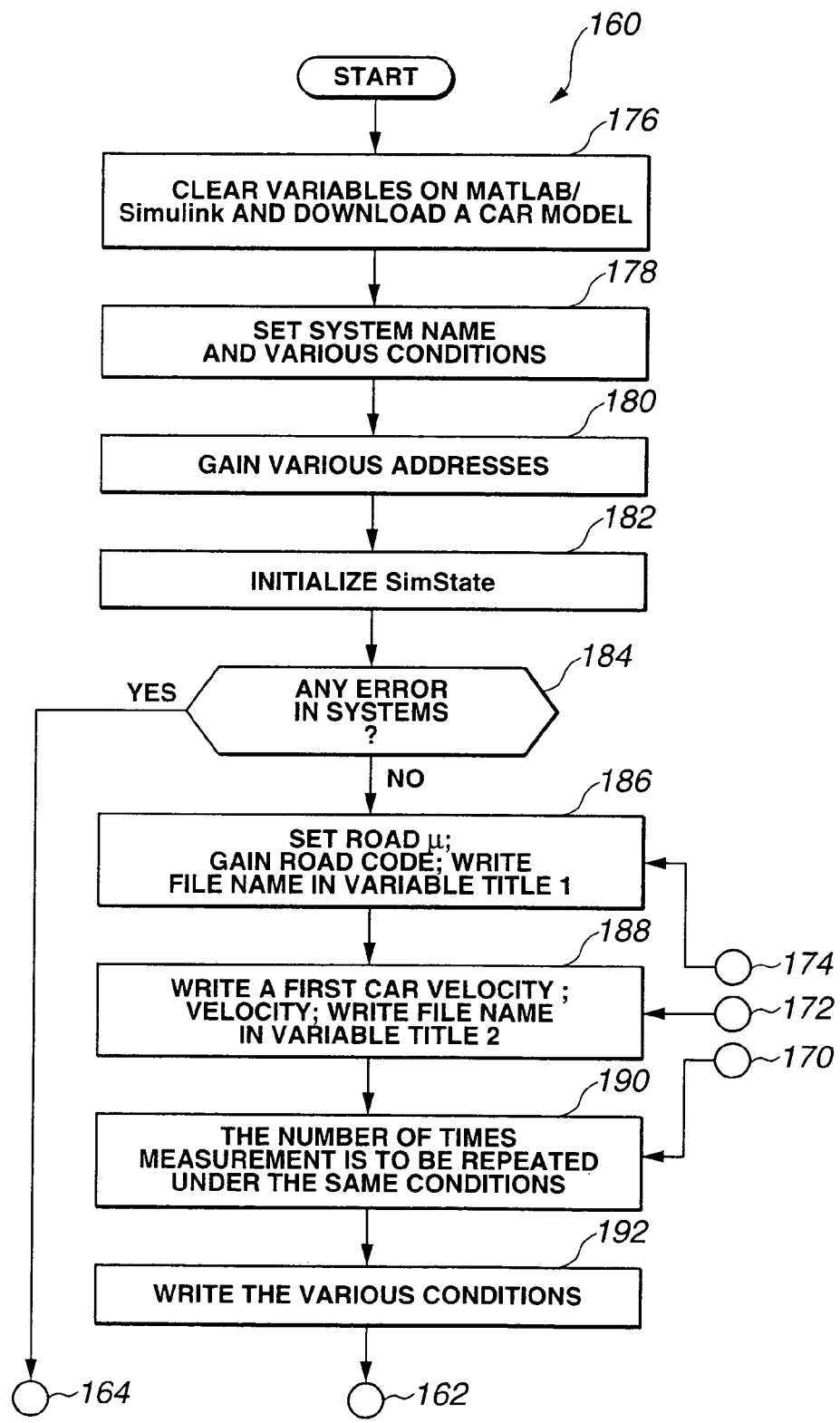
Figure 6C:
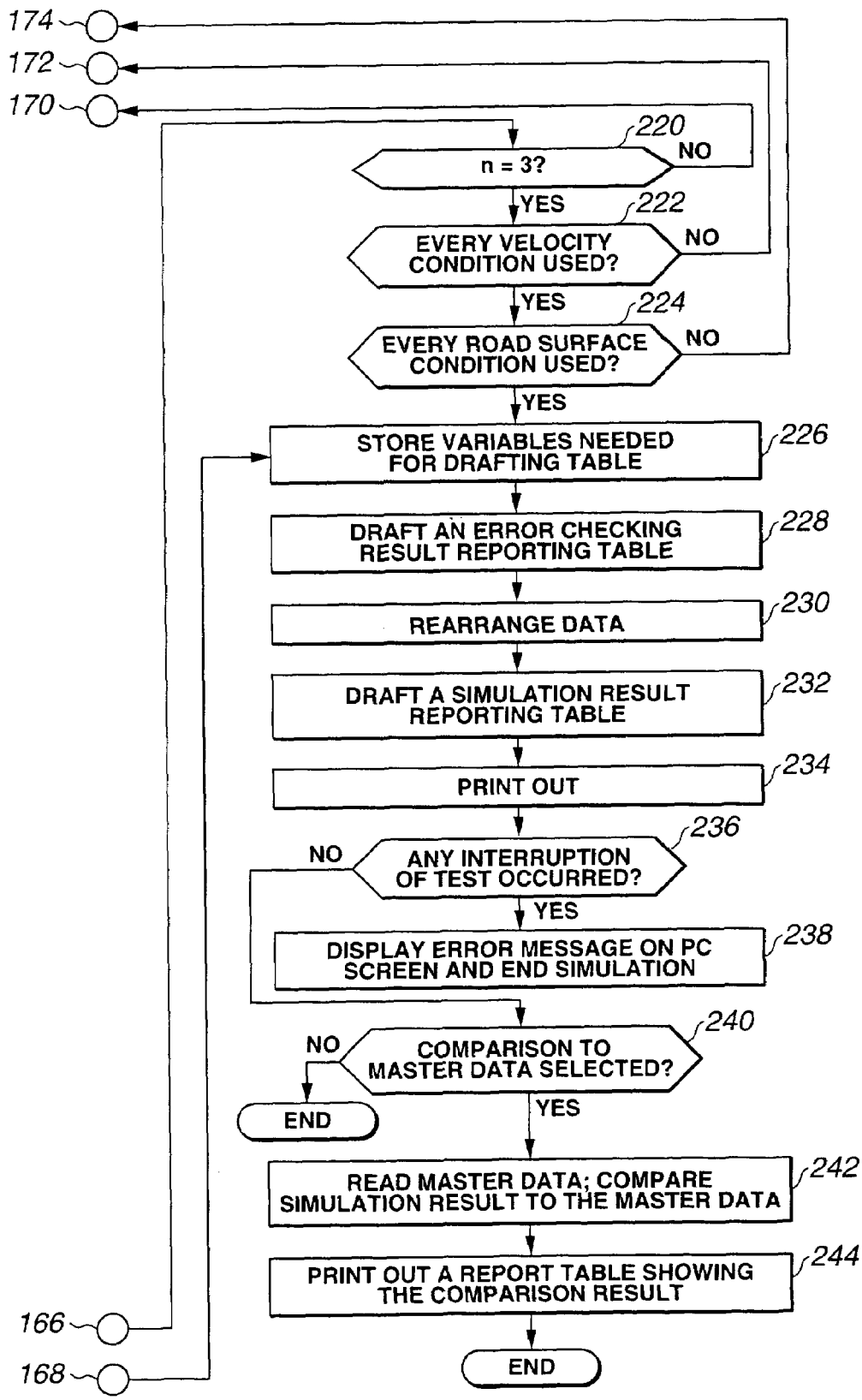

The processing flow diagram in FIGS. 6A, 6B and 6C illustrates one example of a process for performing simulation generally indicated by the reference numeral 160. The real time simulator 16 repeats simulation using a car model of the master car and then repeats the same simulation after replacing it with another car model of the test car.

In FIG. 6A, steps 176 to 182 are provided for the initialization of hardware of the real time simulator 16. Step 176 is provided to clear all of variables on MATLAB/Simulink 30 and to download the virtual car model ACSYS 20 adapted to a car being tested. Step 178 is provided to set the module or system name being tested and to set various conditions (including road μ). Step 180 is provided to gain various kinds of addresses. Step 182 is provided to initialize SimState, allowing for standby of the real time simulator 16.

At step 184, the presence of any error or failure is checked before making measurement by looking into the simulation system state and VDC/TCS/ABS system state. If there is any error in the systems state, the process goes to step 246 (FIG. 6B). Step 246 is provided to interrupt the test (simulation). If there is no error, the process goes to step 186.

Steps 186 to 192 are provided for the setting of conditions under which simulation is repeated. Step 186 is provided to set road μ, gain road code, and write file name in variable title 1. Step 188 is provided to write first or initial car velocity and write file name in variable title 2. Step 190 is provided to determine the number of times measurement is to be repeated under the same conditions. Step 192 is provided to write the various conditions.

In FIG. 6B, steps 194 to 200 are provided for the stand-by of simulation. Step 194 is provided to read car velocity and hydraulic unit (HU) temperature. Step 196 is provided to set beginning conditions of simulation at SimState. Step 198 is provided to stand-by data trigger. Step 200 is provided to set screen of PC 24 ready for displaying measures or measured information. Steps 202 to 210 are provided for the control of simulation.

Step 202 is provided to check the presence of any problem on HU temperature by comparing HU temperature to a threshold temperature value of 100° C. If HU temperature exceeds 100° C., the process goes to step 204 that is provided for automatic waiting for a drop in HU temperature. If HU temperature is less than or equal to 100° C., the process goes to step 206. Step 206 is provided to start acceleration of the car model by writing 1 in variable "start". When, after acceleration, the car model reaches the first car velocity, the braking pressure is applied to cause the ABS to operate. The car model is decelerated. Collection of data continues until it is determined at step 208 that the car model comes to a halt. The data collection is terminated upon determination at step 208 that the car model has come to a halt.

Steps 212 to 216 are provided for the collection and storage of data. Step 212 is provided to read various data collected and calculate the average of values obtained by measurements repeated three times (n=3) under the same condition. Step 214 is provided to store the data in file. Step 216 is provided to calculate the total number of times measurement has been repeated.

Steps 218 to 224 are provided for the inquiry whether or not simulation is to be repeated. Step 218 is provided to determine whether or not there is any error (and/or failure) in the systems after measurement. If there is no error after the measurement, the process goes to step 220 in FIG. 6C. If there is error, the process goes to step 246 to interrupt the test. In FIG. 6C, step 220 is provided to determine whether or not simulation has been repeated three times (n=3) under the same condition. If the number n of times is less than 3, the process goes back to step 190 in FIG. 6A for performing another round of simulation under the same condition. If the number n of times is equal to 3, the process goes to step 222. Step 222 is provided to determine whether or not every velocity condition (first velocity at which brake is to be applied) has been used in simulation. If every velocity condition has not been used, the process goes back to step 188 for performing another round of simulation using another unused velocity condition. If every velocity condition has been used, the process goes to step 224. Step 224 is provided to determine whether or not every road surface condition (road μ) has been used in simulation. If every road surface condition has not been used, the process goes back to step 186 for performing another round of simulation using another unused road surface condition. If every road surface condition has been used, the process goes to step 226. From the preceding description, it is clear that, with two high and low road μ conditions and two high and low first velocity conditions, simulation is repeated three times under each of four possible combinations of road surface and velocity conditions.

Steps 226 to 234 are provided for the post processing of data. Step 226 is provided to store, under the same file name, variables needed for drafting a table. Step 228 is provided to draft an error checking result-reporting table. Step 230 is provided to rearrange the data obtained. Step 232 is provided to draft a simulation result-reporting table. Step 234 is provided to print out the simulation result-reporting table.

Figure 7A:
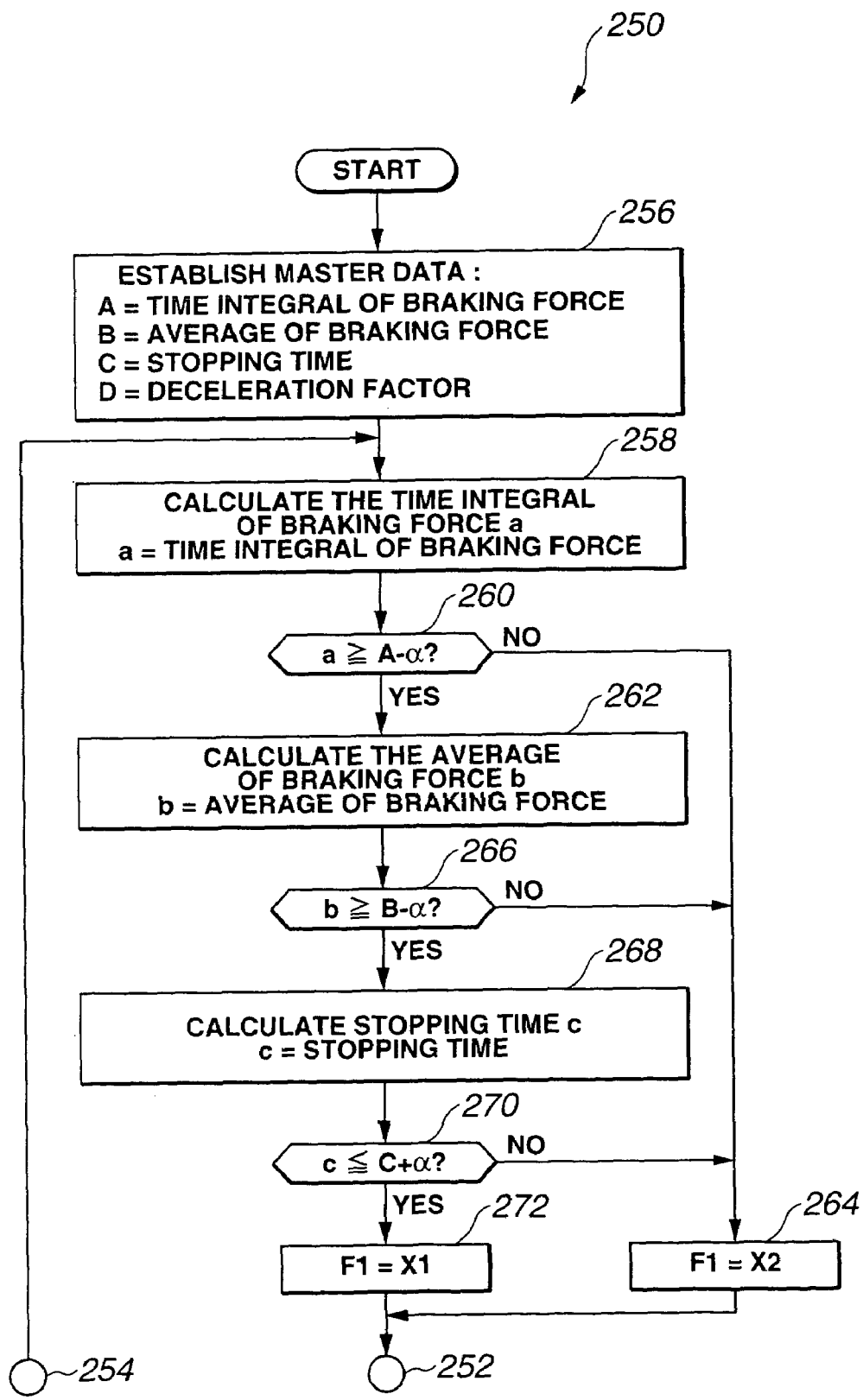
FIGS. 7A and 7B, when combined, illustrate a flow diagram of a routine for conformity assessment of ABS.
Figure 7B:
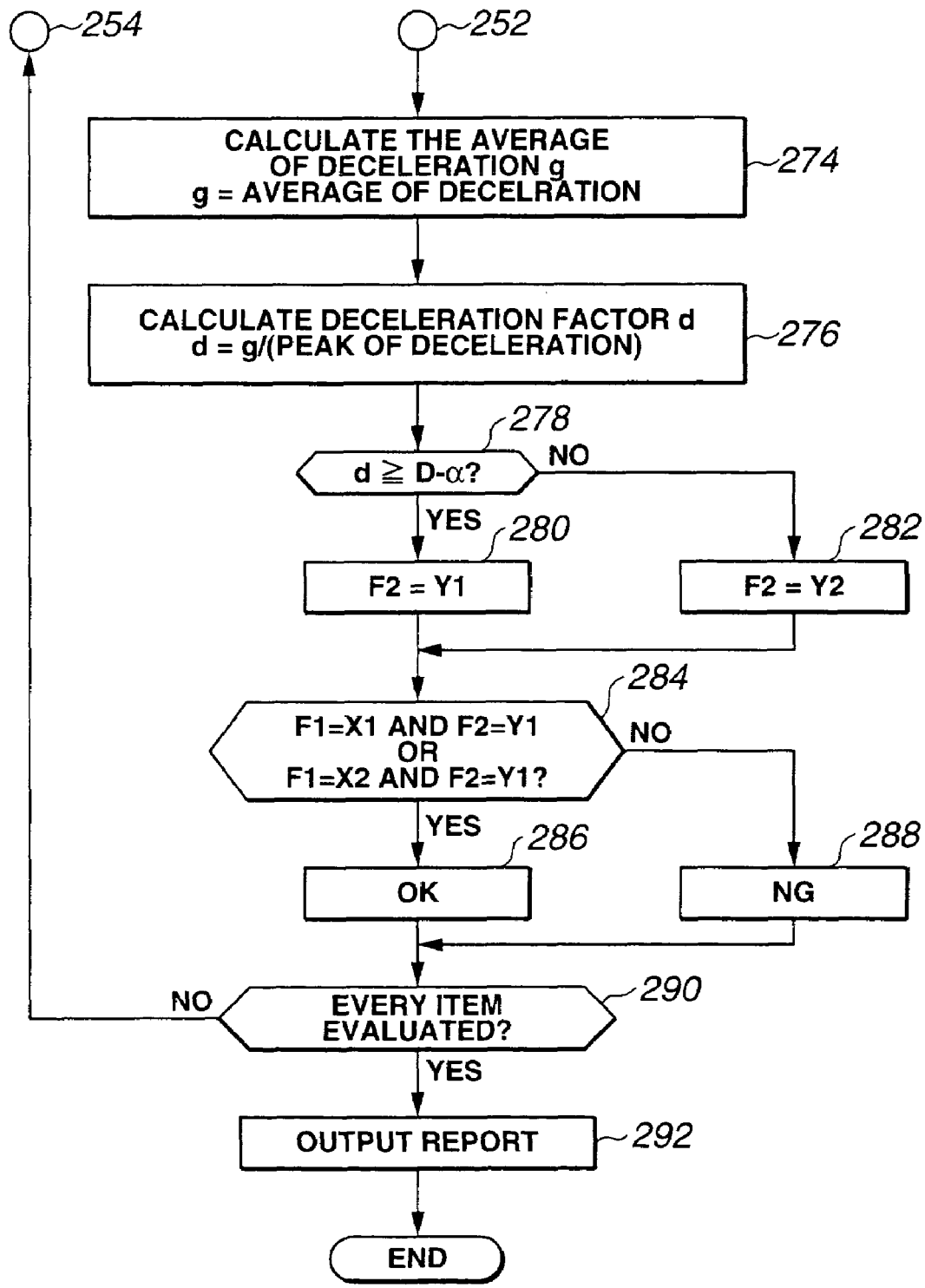

Steps 236 to 240 are provided for the inquiry whether or not confirmation assessment of the system or module is to be performed. Step 236 is provided to determine whether or not any interruption of test (simulation) occurred. If this is the case, the process goes to step 238. Step 238 is provided to display error message on PC screen and end the simulation. If no interruption of test occurred, the process goes to step 240. Step 240 is provided to determine whether or not comparison to master data was selected by checking the conditions that were set before beginning the simulation. If the selection was not made, the process ends. If the selection was made, a sub-routine for conformity assessment illustrated in FIGS. 7A and 7B is executed.

Steps 242 and 244 are provided for the output processing of simulation result Step 242 is provided to read master data and compare the simulation result to the master data. Step 244 is provided to print out a report table showing the comparison result.

Figure 8A:
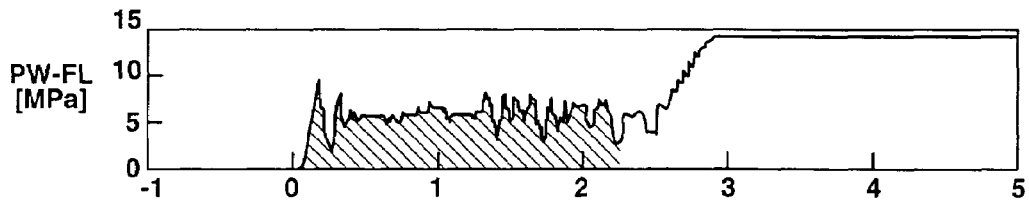
FIGS. 8A to 8F are graphs illustrating the simulation result.
Figure 8B:
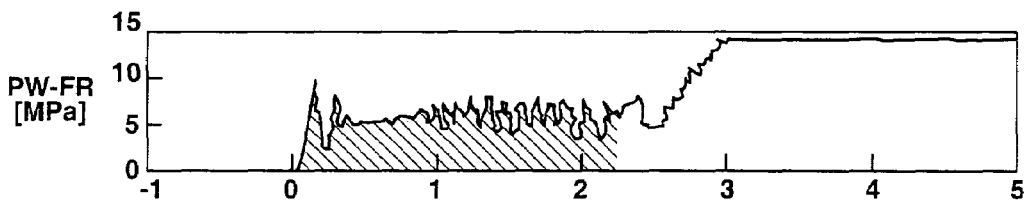
Figure 8C:
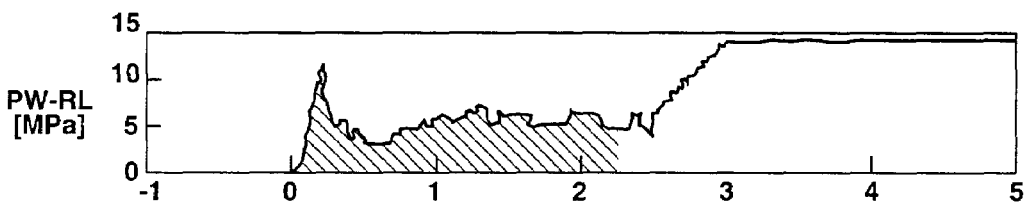
Figure 8D:
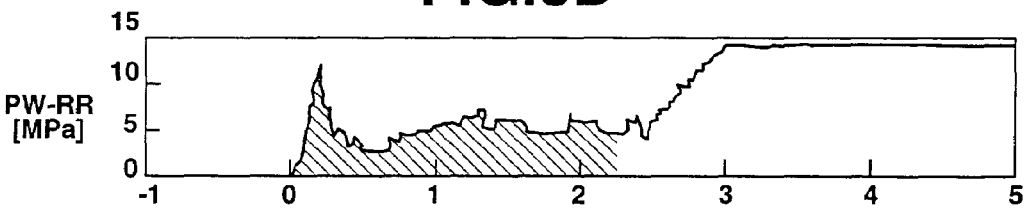
Figure 8E:
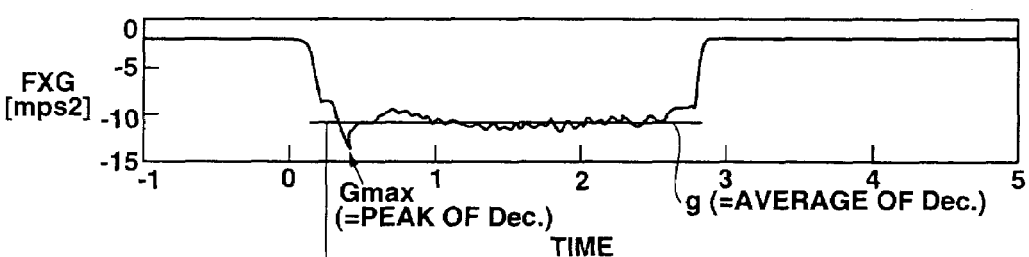
Figure 8F:
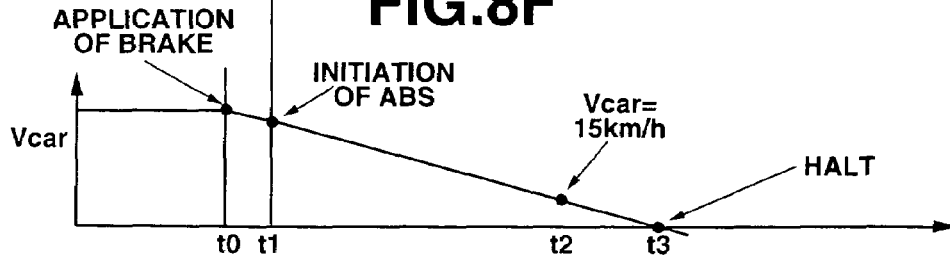

In the embodiment, the ABS is a test module or system to be simulated. FIGS. 8A to 8F illustrate the simulation result produced by the real time simulator 16. The simulation result includes variation of wheel braking pressure applied to each wheel cylinder against time as illustrated in FIGS. 8A to 8D. The simulation result also includes variation of car longitudinal acceleration against time as illustrated in FIG. 8E. In the embodiment where the ABS is the test module, the simulation result as illustrated in FIGS. 8A to 8E is processed to create, as alternative characteristics of the test module in terms of its system operation, the time integral a of braking force on constraint of anti-locking braking and the average b of braking force on constraint of anti-lock braking. The shadowed area in each of FIGS. 8A to 8E illustrates the time integral a of braking force. The simulation result as illustrated in FIG. 8F is processed to create the stopping time c required to bring a car to a halt on constraint of anti-lock braking. In FIG. 8F, the stopping time is from t0 to t3. FIG. 8E is a graph illustrating variation characteristic of car longitudinal acceleration. In FIG. 8E, $G_{max}$ indicates the peak of deceleration, and g indicates the average of car deceleration. The simulation result as illustrated in FIG. 8E is processed to create, as the alternative characteristic of the test module in terms of its effectiveness on the test car, a deceleration factor d that is expressed as a ratio between the average d of car deceleration and peak $G_{max}$ thereof. The time integral a of braking force, the average b of braking force, and the stopping time c constitute, as the alternative characteristics of the test module (ABS) in terms of its system operation, the "compare" data. The deceleration factor d constitutes, as the variation characteristic of the test module (ABS) in terms of its effectiveness on the test car, the "compare" data.

As mentioned before, in the embodiments, the master data 12 is established by performing simulation of the same module using the car model representing the master car. There is knowledge base that the master car installed with the module exhibits satisfactory performance and the module exhibits satisfactory system operation. Thus, the time integral a of braking force, the average b of braking force, and the stopping time c created by processing the simulation result are used as desired values thereof and indicated now by the reference characters A, B and C, respectively. The deceleration factor d is used as a desired value thereof and indicated now by the reference character D. The desired values A, B, C, and D constitute the master data 12 for conformity assessment of the test module (ABS).

In each of FIGS. 8A to 8D referred to above, the horizontal axis represents time and the vertical axis represents braking pressure applied to the wheel cylinder. As it proportional to braking force actually applied to the road wheel at least over the operating range under consideration, the braking force is used to represent the braking pressure. However, there is no intention to limit the invention to the system using hydraulic fluid as medium to produce braking force. The present invention is applicable with other types of braking systems, such as a regenerative braking system.

The flow diagram of FIGS. 7A and 7B illustrates the exemplary implementation of a routine for conformity assessment generally indicated by the reference numeral 250, In the embodiment, the real time simulator 16 performs conformity assessment of the module 14 (ABS) under the program control.

In step 256, the real time simulator 16 calculates the desired values of alternative characteristics that constitute the master data 12 based on database made after repetition of simulation. They are the time integral of braking force A, the average of braking force B, the stopping time C and the deceleration factor D.

In the next step 258, the real time simulator 16 calculates the time integral of braking force a by processing the simulation result as shown in FIGS. 8A to 8D.

Taking the simulation result in FIGS. 8A to 8D and 8F as an example, the time integral a is given by integrating the braking force variation characteristic curves in FIGS. 8A to 8E from the moment t0 where application of brake starts to the moment t2 where car velocity $V_{car}$ drops to 15 km/h. The time integral a can be expressed as:

$$a = \int_{t0}^{t2}(PW-FL)dt + \int_{t0}^{t2}(PW-FR)dt + \int_{t0}^{t2}(PW-RL)dt + \int_{t0}^{t2}(PW-RR)dt$$

The time integral of braking force A of the master data is calculated in the same manner.

In step 260, the real time simulator 16 determines whether or not the time integral of braking force a is greater than or equal to a first reference (A−α) obtained by subtracting a first predetermined value α from the desired value of the time integral of braking force A of the master data 12. If this is the case (Yes), the routine proceeds to step 262. If this is not the case, the routine proceeds to step 264. In the embodiment, the first predetermined value α is equal to 20% of the desired value A of the master data 12.

In step 262, the real time simulator 16 calculates the average of braking force b by processing the simulation result as shown in FIGS. 8A to 8D.

Taking the simulation result in FIGS. 8A to 8D and 8F as an example, the average b is given as the sum of the averages of braking pressure variation characteristic curves of all of the wheel cylinders from the moment t0 where application of brake starts to the moment t2 where car velocity $V_{car}$ drops to 15 km/h.

The average of braking force B of the master data 12 is calculated in the same manner.

In step 266, the real time simulator 16 determines whether or not the average of braking force b is greater than or equal to a second reference (B−α) obtained by subtracting a second predetermined value α from the desired value of the average of braking force B of the master data 12. If this is the case (Yes), the routine proceeds to step 268. If this is not the case, the routine proceeds to step 264. In the embodiment, the second predetermined value α is equal to 20% of the desired value B of the master data 12.

In step 268, the real time simulator 16 calculates the stopping time c required to stop the car.

Taking the simulation result in FIG. 8F as an example, the stopping time c is from the moment t1 where ABS starts operating to the moment t3 where the car comes to a halt ($V_{car}=0$).

The stopping time C of the master data 12 is given in the same manner.

In step 270, the real time simulator 16 determines whether or not the stopping time c is less than or equal to a third reference (C+α) obtained by adding a third predetermined value α to the desired value of the stopping time C. If this is the case (Yes), the routine proceeds to step 272. If this is not the case, the routine proceeds to step 264. In the embodiment, the third predetermined value α is equal to 20% of the desired value C of the master data 12.

In step 272, the real time simulator 16 sets a system conformity flag F1 as F1=X1, meaning that all of the conditions set in steps 260, 266 and 270 have been met. Then, the routine proceeds to step 274 in FIG. 7B.

In step 264, the real time simulator 16 sets the system conformity flag F1 as F1=X2 unless all of the conditions have been met. In other words, if at least one of these conditions is not met, the system conformity flag F1 is set as F1=X2. In plain words, the module has failed to exhibit satisfactory system operation. Then, the routine proceeds to step 274 in FIG. 7B.

In FIG. 7B, at step 274, the real time simulator 16 calculates the average of deceleration g.

Taking the simulation result in FIG. 8E as an example, the average of deceleration g is given by calculating the average of deceleration FXG from the moment t1 where ABS starts operating to the moment t2 where car velocity $V_{car}$ drops to 15 km/h.

In the next step 276, the real time simulator 16 uses the peak of deceleration out of the database of simulation result and the average of deceleration g obtained in step 274 to calculate a deceleration factor d, which can be expressed as:

$d=g/$(peak of deceleration).

Taking the simulation result in FIG. 8E as an example, the peak of deceleration $G_{max}$ is used in calculating the deceleration factor d. The deceleration factor d may be named as a road surface utilization factor if the deceleration peak $G_{max}$ can be regarded as the tire μ peak.

The deceleration factor D of the master data 12 is given in the same manner.

In the next step 278, the real time simulator 16 determines whether or not the deceleration factor d is greater than or equal to a fourth reference (D−α) obtained by subtracting a fourth predetermined value a from the desired value of the deceleration factor D of the master data 12. If this is the case (Yes), the routine proceeds to step 280. If this is not the case, the routine proceeds to step 282. In the embodiment, the fourth predetermined value α is equal to 20% of the desired value D of the master data 12.

In step 280, the real time simulator 16 sets a car conformity flag F2 as F2=Y1, meaning that the condition set in step 278 has been met. Then, the routine proceeds to step 284.

In step 282, the real time simulator 16 sets the car conformity flag F2 as F2=Y2 unless the condition set in step 278 has been met. In other words, if this condition is not met, the car conformity flag F2 is set as F2=Y2. Then, the routine proceeds to step 284.

In step 284, the real time simulator 16 determines whether condition F1=X1 and F2=Y1 or F1=X2 and F2=Y1 is met or not. If this is the case (Yes), the routine proceeds to step 286. If this is not the case (No), the routine proceeds to step 288.

In step 286, the real time simulator 16 sets "OK", meaning a conformity assessment result that the ABS has a satisfactory fit to the test car.

In step 288, the real time simulator 16 sets "NG", meaning another conformity assessment result that the ABS fails to have a satisfactory fit to the test car.

In the next step 290, the real time simulator 16 determines whether or not each of items has been evaluated. If this is the case (Yes), the routine goes to step 292. If this is not the case (No), the routine goes back to step 258.

In step 292, the real time simulator 16 outputs report on the conformity assessment result.

With reference to FIGS. 9A to 9C, let us now consider why the time integral (a, A) of braking force, the average of braking force (b, B), and the stopping time (c, C) are optimum as alternative characteristics of the ABS in terms of its system operation. FIG. 9A illustrates varying of car velocity and wheel spin velocity on constraint of anti-lock braking. The illustrated curve of wheel spin velocity shows cyclic variation of wheel acceleration and deceleration. This cyclic variation results from cyclic application of braking force as shown in FIG. 9C. The illustrated fully drawn curve in FIG. 9C indicates repetition of a cycle including a reduction in braking force to cope with wheel deceleration followed by the subsequent increase in braking force to cope with the subsequent wheel acceleration. As is readily seen from FIG. 9C, the time integral of braking force is alternative characteristic of the total work done by ABS.

The total work expressed by the time integral braking force may be regarded as accomplishment of two functions, which ABS is expected to have. One function of them is to bring the car to a halt. The other function is to keep steerability within satisfactory range during braking. The time integral of braking force may be regarded as accomplishment of these two functions of the ABS.

With continuing reference to FIG. 9C, the area expressed by the time integral of braking force is a shape factor including other two alternative characteristics. They are the average of braking force and the stopping time. The average of braking force is a characteristic, in height direction, of the shape of area. If the average of braking force increases, the steerability becomes less effective, but the stopping distance becomes short. The stopping time is another characteristic, in length direction, of the shape of area. If the average of braking force decreases, the steerability becomes effective and stopping distance becomes long. In other words, what is done is to convert the area (the time integral of braking force) into the shape of a square with a height (the average of braking force) and a length (the stopping distance) for the comparison to the shape of a square expressed by the master data.

This may be readily seen from a logic flow, in FIGS. 7A and 7B, along step 260, step 266 and step 270 down to step 272. In step 272, the system conformity flag F1 is set as F1=X1.

For the evaluation of effectiveness of an ABS on a car, the deceleration factor (d, D) is used as the alternative characteristic. One may highly evaluate the effectiveness if the ABS brings the car to a halt at deceleration appropriate to road μ condition.

The deceleration factor (d, D) represents well variation pattern of car deceleration on constraint of ABS. With reference to FIG. 9B, the fully drawn curve illustrates the variation pattern of car deceleration on constraint of ABS. The pattern involves a deceleration peak, which occurs immediately after the initiation of ABS operation. The deceleration peak is followed by an undulation in deceleration with small amplitudes around a certain level after a ramp reduction in deceleration. The deceleration factor d created by processing the simulation result is compared to a desired value of deceleration factor D out of the main data.

This may be readily seen from a logic flow in FIGS. 7A and 7B. If, in step 278, the deceleration factor d is greater than or equal to the fourth reference (D−α), the routine goes to step 280 where the car conformity flag F2 is set as F2=Y1.

In the preceding description, the braking force or pressure variation characteristic is used to derive the time integral thereof, the average thereof, and the stopping time as the alternative characteristics of ABS in terms of its system operation. Alternatively, the braking torque variation characteristic can be used instead of the braking force or pressure variation characteristic to derive the alternative characteristics.

In the preceding description, the deceleration factor (d, D) is used as the alternative characteristic of ABS in terms of its effectiveness on test car. Alternatively, the road to tire friction factor can be used instead of the deceleration factor.

With reference to FIG. 10, the illustrated table shows four different results, namely, case 1, case 2, case 3 and case 4.

Case 1: F1=X1 and F2=Y1: The ABS under testing is satisfactory in terms of its system operation and its effectiveness on the test car. The judgment turns out to be OK.

Case 2: F1=X2 and F2=Y1: The ABS under testing is not satisfactory in terms of its system operation, but it is satisfactory in terms of its effectiveness on the test car. The judgment turns out to be OK accounting for the completion of appropriate modification to the ABS.

Case 3: F1=X1 and F2=Y2: The ABS under tensing is satisfactory in terms of its system operation, but it is not satisfactory in terms of its effectiveness on the test car. The judgment turns out to be NG. In this case, it is not possible to mount the ABS to the car. A need for modification, such as parameter alteration, to the ABS exists. The ABS as modified is subjected to simulation again for conformity assessment.

Case 4: F1=X2 and F2=X2: The ABS under tensing is not satisfactory in terms of not only in its system operation, but also in its effectiveness on the test car. The judgment turns out to be NG. In this case, it is not possible to mount the ABS to the car. A need exists for modification, such as parameter alteration, to the ABS. The ABS as modified is subjected to simulation again for conformity assessment. If the judgment fails to turn out to be OK upon repetition of conformity assessment three times, characteristics of components (tire, suspension, engine, transmission) of a car model are modified for further simulation and conformity assessment.

FIG. 11 shows the results of road testing and simulation of the ABS using the virtual car model ACSYS. The initial or first car velocity was 100 km/h when the brake was applied. The results are stopping distances. High and low μ road conditions were used. With high μ road condition, the stopping distance of road testing was 41.3 m and that of simulation was 41.6 m. The error was +0.3 m and falls in the range of tolerance ($\leq 1.5$ m). With low μ road condition, the stopping distance of road testing was 58.1 m and that of simulation was 57.3 m. The error was −0.8 m and falls in the range of tolerance ($\leq 2.0$ m).

With reference to FIGS. 12A to 20, another embodiment of the present invention is described. This embodiment is substantially the same as the previously described embodiment in hardware. However, as different from the previous embodiment, a TCS is simulated. Thus, the TCS is a test module 14 or system to be simulated.

Figure 12A:
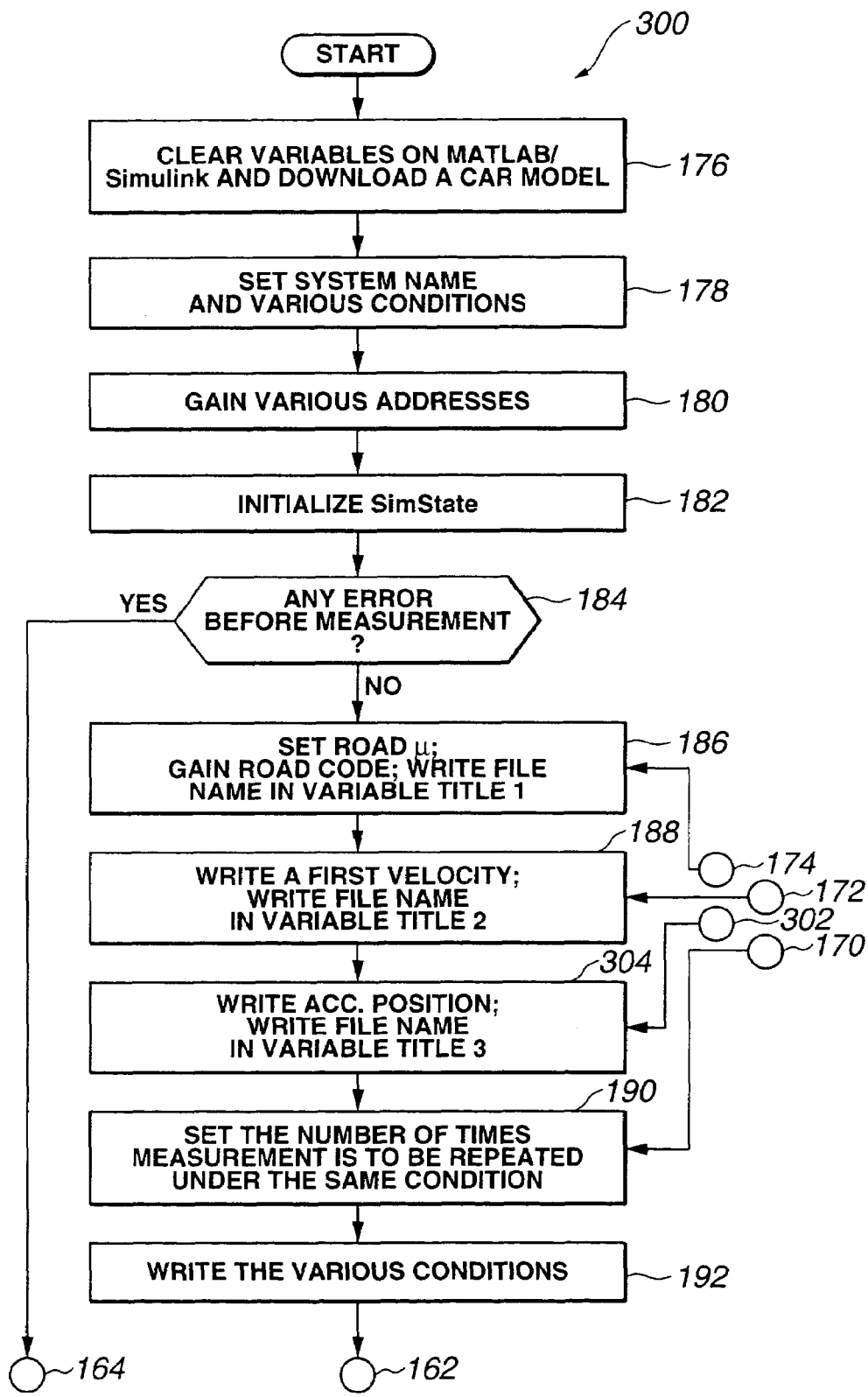
Figure 12C:
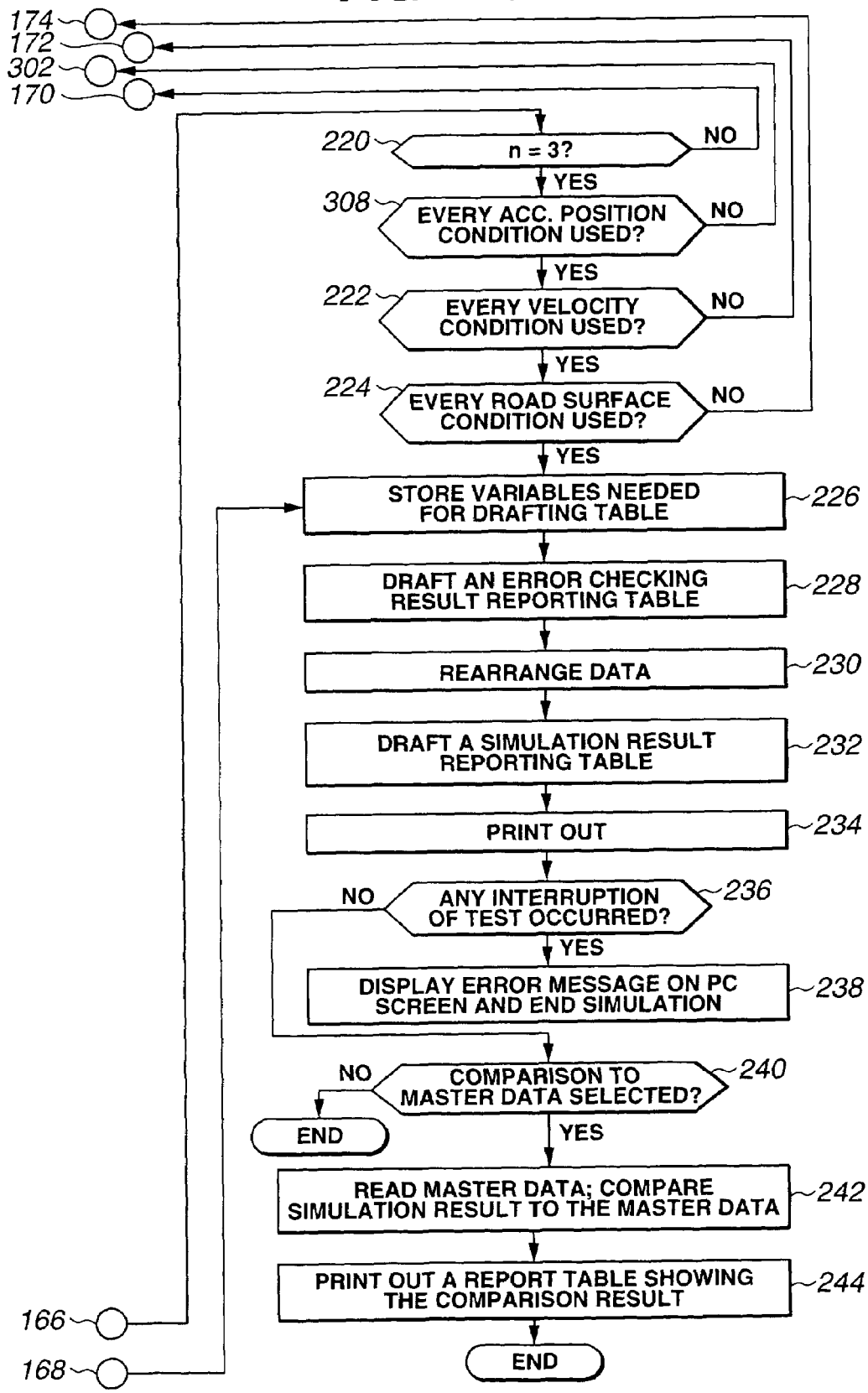

The processing flow diagram in FIGS. 12A, 12B and 12C illustrates another example of a process for performing simulation generally indicated by the reference numeral 300.

The process 300 is substantially the same as the process 160 illustrated by the flow diagram in FIGS. 6A, 6B and 6C. Thus, like reference numerals are used to denote like steps throughout FIGS. 6A to 6C and 12A to 12C.

However, the process 300 is different from the process 160 in conditions adjusted to simulation of TRC. The process 300 is different from the process 160 in the three respects as follows:

1) With reference to FIGS. 12A and 6A, a newly added step 304 is provided to write accelerator position and write file name in variable tile 3 in addition to writing file names in variable title 1 at step 186 and in variable title 2 at step 188. In FIG. 12A, steps 186, 188, 304, 190 and 192 are provided for the setting of conditions under which simulation is repeated.

2) With reference to FIGS. 12B and 6B, a newly added step 306 is inserted between steps 206 and 210 in the place of the step 208. The step 306 is provided to determine whether or not a cam model has reached a predetermined car velocity after acceleration, Collection of data continues until it is determined that at step 306 that the car model has been accelerated to each the predetermined car velocity. In FIG. 12B, steps 202, 204, 206, 306 and 210 are provided for the control of simulation.

3) With reference to FIGS. 12C and 6C, a newly added step 308 is provided to determine whether or not every accelerator position condition has been used in simulation. If this is the case, the process goes to step 222. If this is not the case, the process goes back to the newly added step 304 in FIG. 12A. In FIGS. 12B and 12C, steps 218, 220, 308, 222 and 224 are provided for the inquiry whether or not simulation is to be repeated.

Figure 14A:
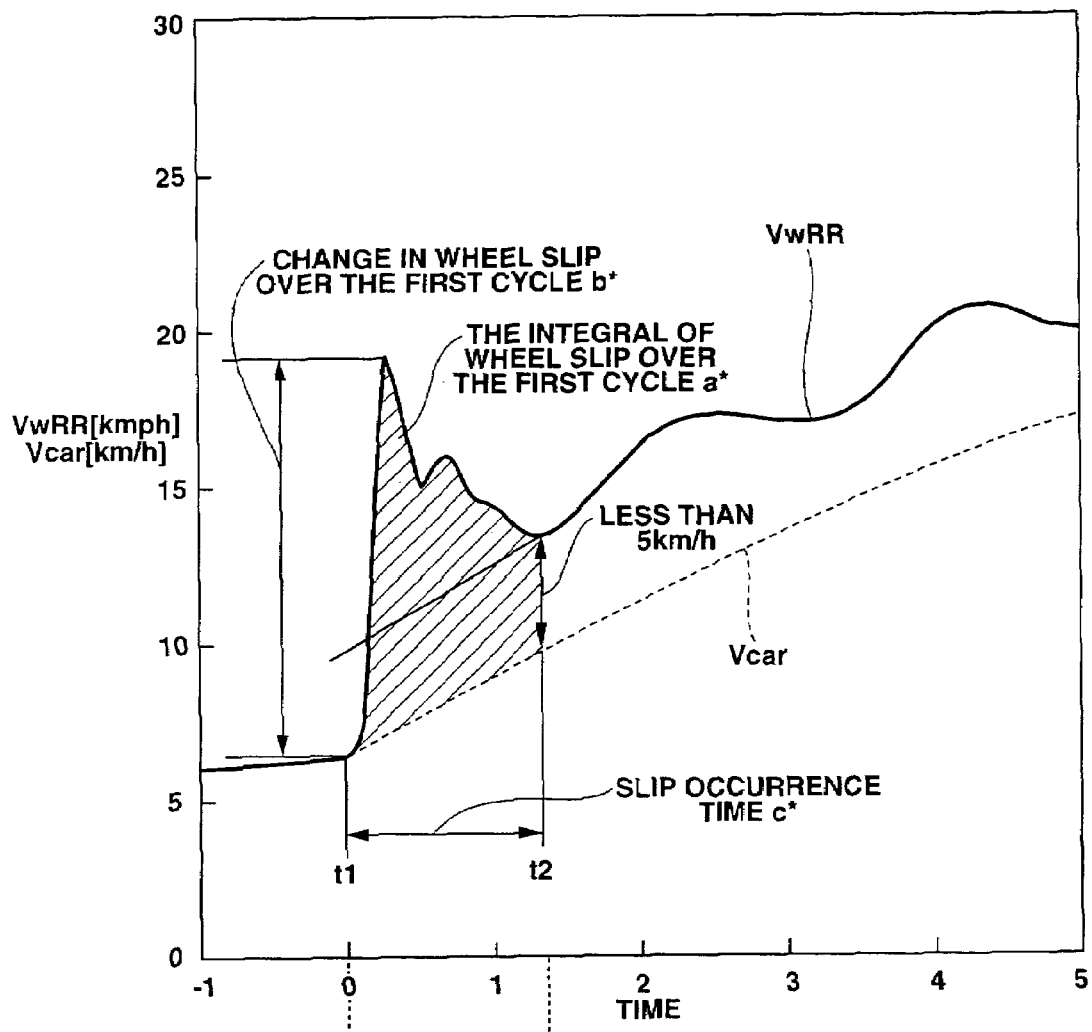
FIGS. 14A and 14B are graphs illustrating alternative characteristics of TCS.
Figure 14B:
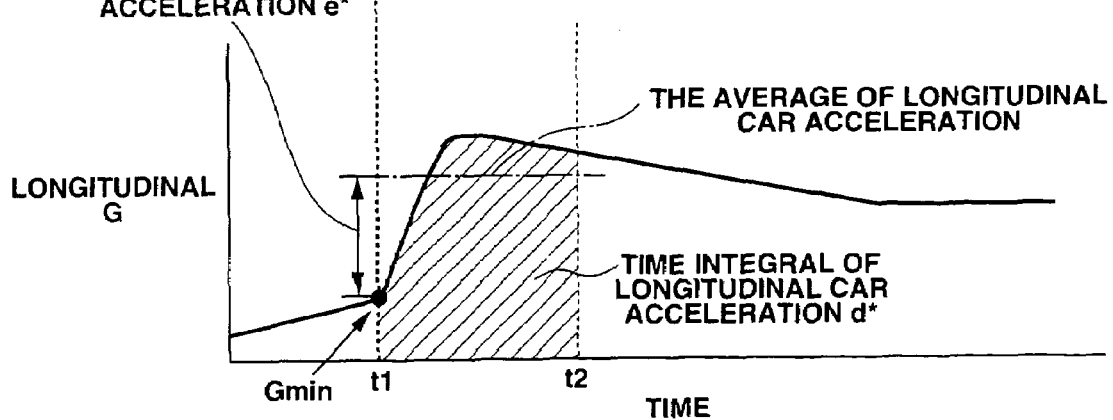

In this embodiment, the TCS is a test module or system to be simulated. FIGS. 14A and 14B illustrate the simulation result produced by a real time simulator 16. The simulation result includes wheel spin velocity variation characteristic. The car under consideration has driving rear wheels and following front wheels. In this case, the wheel spin velocity variation characteristic includes the average of rear wheel spin velocities $V_{wRR}$ and the average of front wheel spin velocities $V_{wFF}$ (=car velocity $V_{car}$) as shown in FIG. 14A. The simulation result also includes variation of car longitudinal acceleration against time as illustrated in FIG. 14B. In the embodiment where the TCS is the test module, the simulation result as illustrated in FIG. 14A is processed to create, as alternative characteristic of the test module in terms of its system operation, the time integral a* of wheel slip over the first control cycle from the moment t1 to the subsequent moment t2. At the moment t1, the wheel slip, i.e., a difference between $V_{wRR}$ and $V_{car}$, occurs. In response to the occurrence of this wheel slip, the TCS begins to operate, suppressing the wheel slip by reducing engine torque or applying braking torque. Subsequently, at the moment t2, the wheel slip converges to a certain value of 5 km/h, for example. The shadowed area in FIG. 14A illustrates the time integral a* of wheel slip over the first cycle. The simulation result as illustrated in FIG. 14A is processed to create, as the alternative characteristic of the test module in terms of its system operation, a change in wheel slip over the first cycle b*. The change in wheel slip b* is expressed as a difference between the maximum and the minimum of the average of rear wheel spin velocities $V_{wRR}$ over the first cycle from t1 to t2. The simulation result is processed to create, as the alternative characteristic of the test module in terms of its system operation, a slip occurrence time c* that is the time between the moments t1 and t2. FIG. 14B is a graph illustrating variation characteristic of car longitudinal acceleration. The simulation result as illustrated in FIG. 14B is processed to create, as the alternative characteristic of the test module in terms of its effectiveness on the test car, the time integral of longitudinal car acceleration d* over the first cycle from t1 to t2. The simulation result as illustrated in FIG. 14B is processed to create a change in longitudinal car acceleration e* over the first cycle from t1 to t2. The average of longitudinal car acceleration over the first cycle is calculated. The change in longitudinal car acceleration e* is expressed as a difference between the average of longitudinal car acceleration and the minimum longitudinal acceleration $G_{min}$. The time integral a* of wheel slip, the change b* in wheel slip, and the slip occurrence time c* constitute, as the alternative characteristics of the test module (TCS) in terms of its system operation, "compare" data. The time integral d* of longitudinal car acceleration and the change e* in longitudinal car acceleration constitute, as the alternative characteristics of the test module (TCS) in terms of its effectiveness on the test car, the "compare" data.

As mentioned before, in the embodiments, the master data 12 is established by performing simulation of the same module using the car model representing the master car. There is knowledge base that the master car installed with the module exhibits satisfactory performance and the module exhibits satisfactory system operation. Thus, the time integral a* of wheel slip, the change b* in wheel slip, and the slip occurrence time c* created by processing the simulation result are used as desired values thereof and indicated now by the reference characters A*, B* and C*, respectively. The time integral d* of longitudinal car acceleration and the change e* in longitudinal car acceleration are used as desired values thereof and indicated now by the reference characters D* and E*, respectively. The desired values A*, B*, C*, D* and E* constitute the master data 12 for conformity assessment of the test module (TCS).

Figure 13A:
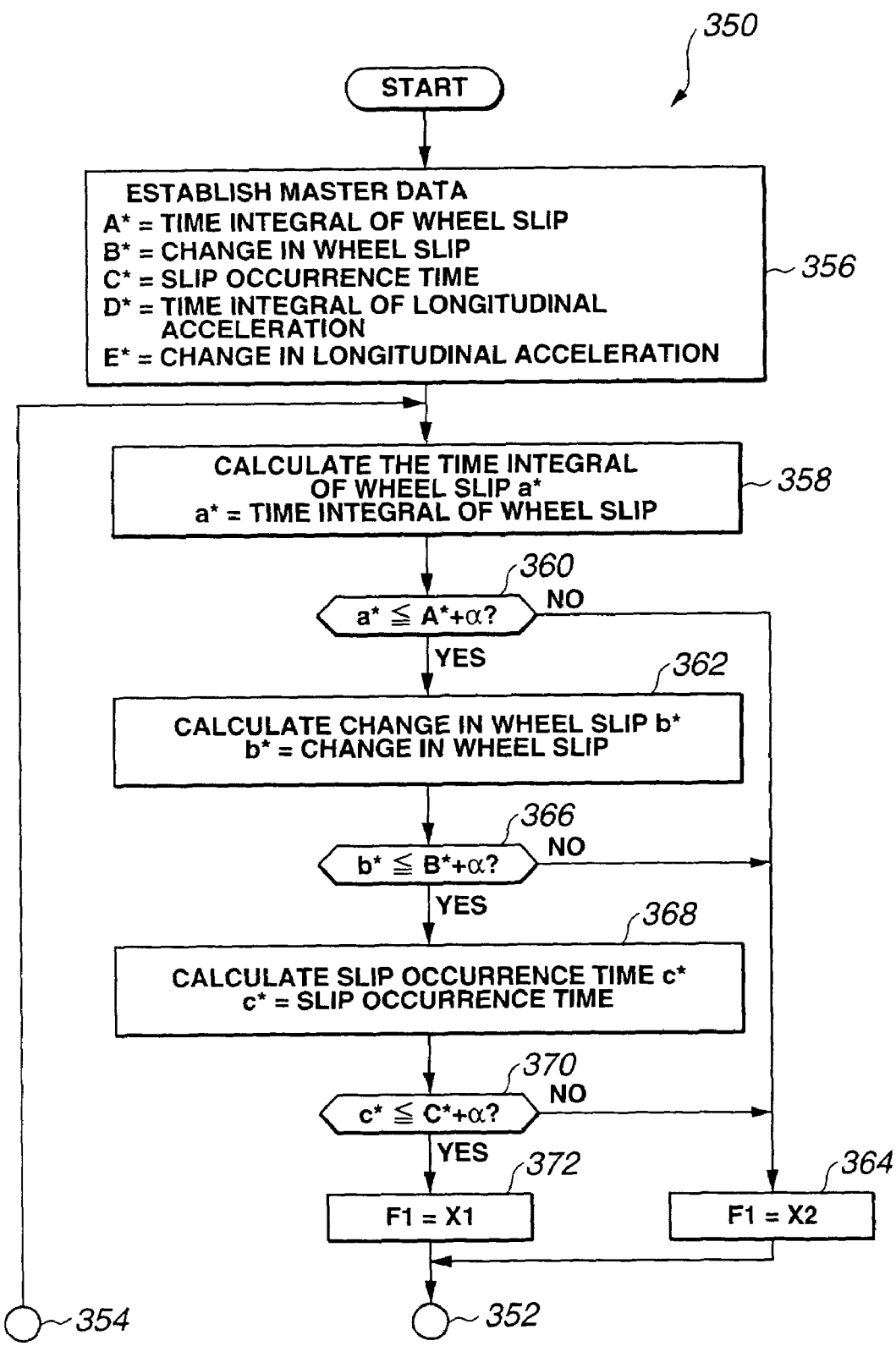
FIGS. 13A and 13B, when combined, illustrate a flow diagram of a routine for conformity assessment of TCS.
Figure 13B:
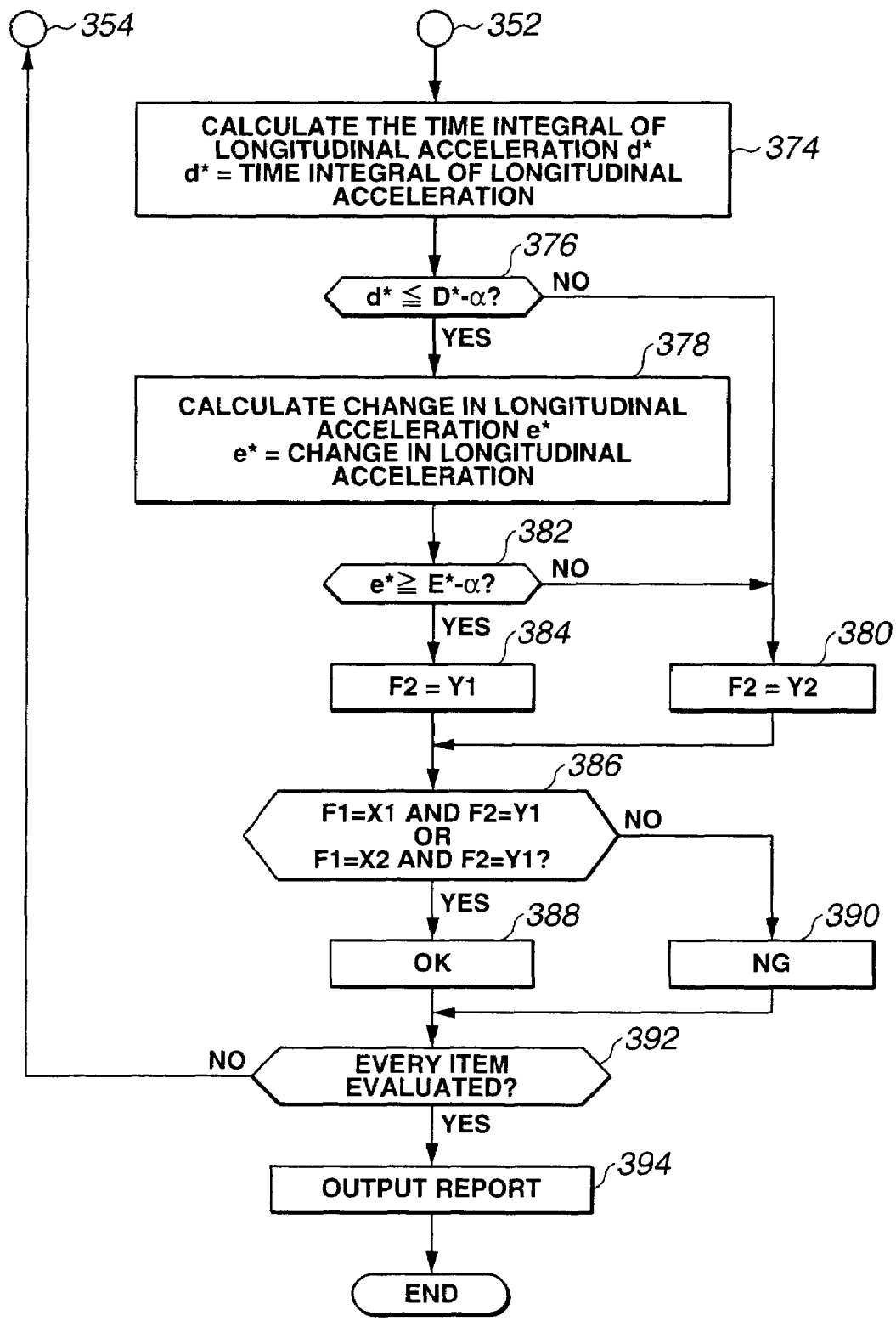

The flow diagram of FIGS. 13A and 13B illustrates the exemplary implementation of a routine for conformity assessment generally indicated by the reference numeral 350. In the embodiment, the real time simulator 16 performs conformity assessment of the module 14 (TCS) under the program control.

In step 356, the real time simulator 16 calculates the desired values of alternative characteristics that constitute the master data 12 based on database made after repetition of simulation. They are the time integral of wheel slip A*, the change in wheel slip B*, the slip occurrence time C*, the time integral of longitudinal car deceleration D*, and the change in longitudinal acceleration E*.

In the next step 358, the real time simulator 16 calculates the time integral of wheel slip a* by processing the simulation result as shown in FIG. 14A.

Taking the simulation result in FIG. 14A as an example, the time integral a* is given by integrating the wheel slip over the first control (TCS) cycle from the moment t1 to the moment t2. The time integral a* can be expressed as:

$$a^* = \int_{t1}^{t2} (V_{wRR} - V_{car}) dt$$

The time integral of wheel slip A* of the master data is calculated in the same manner.

In step 360, the real time simulator 16 determines whether or not the time integral of wheel slip a* is less than or equal to a first reference (A*+α) obtained by adding a first predetermined value α to the desired value of the time integral of wheel slip A* of the master data 12. If this is the case (Yes), the routine proceeds to step 362. If this is not the case, the routine proceeds to step 364. In the embodiment, the first predetermined value α is equal to 20% of the desired value A* of the master data 12.

In step 362, the real time simulator 16 calculates the change in wheel slip b* by processing the simulation result as shown in FIG. 14A.

Taking the simulation result in FIG. 14A, the change in wheel slip b* is expressed as a difference between the maximum and the minimum of the average of rear wheel spin velocities $V_{wRR}$ over the first cycle from t1 to t2.

The change in wheel slip B* of the master data 12 is calculated in the same manner.

In step 366, the real time simulator 16 determines whether or not the change in wheel slip b* is less than or equal to a second reference (B*+α) obtained by adding a second predetermined value α to the desired value of the change in wheel slip B* of the master data 12. If this is the case (Yes), the routine proceeds to step 368. If this is not the case, the routine proceeds to step 364. In the embodiment, the second predetermined value α is equal to 20% of the desired value B* of the master data 12.

In step 368, the real time simulator 16 calculates the slip occurrence time c*.

Taking the simulation result in FIG. 14A as an example, the slip occurrence time c* is from the moment t1 to the moment t2.

The slip occurrence time C* of the master data 12 is given in the same manner.

In step 370, the real time simulator 16 determines whether or not the slip occurrence time c* is less than or equal to a third reference (C*+α) obtained by adding a third predetermined value α to the desired value of the slip occurrence time C*. If this is the case (Yes), the routine proceeds to step 372. If this is not the case, the routine proceeds to step 364. In the embodiment, the third predetermined value a is equal to 20% of the desired value C* of the master data 12.

In step 372, the real time simulator 16 sets a system conformity flag F1 as F1=X1, meaning that all of the conditions set in steps 360, 366 and 370 have been met. Then, the routine proceeds to step 374 in FIG. 13B.

In step 364, the real time simulator 16 sets the system conformity flag F1 as F1=X2 unless all of the conditions have been met. In other words, if at least one of these conditions is not met, the system conformity flag F1 is set as F1=X2. In plain words, the module has failed to exhibit satisfactory system operation. Then, the routine proceeds to step 374 in FIG. 13B.

In FIG. 13B, at step 374, the real time simulator 16 calculates the time integral of longitudinal car acceleration d*.

Taking the simulation result in FIG. 14B, the time integral of longitudinal car acceleration d* can be expressed as:

$$d^* = \int_{t1}^{t2} G \, dt$$

The time integral of longitudinal car acceleration D* of the master data 12 is calculated in the same manner.

In the next step 376, the real time simulator 16 determines whether or not the time integral of longitudinal car acceleration d* is less than or equal to a fourth reference (D*−α) obtained by subtracting a fourth predetermined value α from the desired value of the time integral of longitudinal can acceleration D*. If this is the case (Yes), the routine proceeds to step 378. If this is not the case, the routine proceeds to step 380. In the embodiment, the fourth predetermined value α is equal to 20% of the desired value D* of the master data 12.

In step 378, the real time simulator 16 calculates the change in longitudinal car acceleration e* by processing the simulation result as shown in FIG. 14B.

Taking the simulation result in FIG. 14B, the change in longitudinal acceleration e* is expressed as a difference between the average of longitudinal car acceleration over the first cycle from t1 to t2 and the minimum of longitudinal car acceleration $G_{min}$.

The change in longitudinal car acceleration E* of the master data 12 is calculated in the same manner.

In the next step 384, the real time simulator 16 determines whether or not the change in longitudinal acceleration e* is greater than or equal to a fifth reference (E*−α) obtained by subtracting a fifth predetermined value α from the desired value of the change E* of the master data 12. If this is the case (Yes), the routine proceeds to step 384. If this is not the case, the routine proceeds to step 380. In the embodiment, the fifth predetermined value α is equal to 20% of the desired value E* of the master data 12.

In step 384, the real time simulator 16 sets a car conformity flag F2 as F2=Y1, meaning that the condition set in steps 376 and 382 have been met. Then, the routine proceeds to step 386.

In step 380, the real time simulator 16 sets the car conformity flag F2 as F2=Y2 unless the conditions set in step 376 and 382 have been met. In other words, if both of these conditions are not met, the car conformity flag F2 is set as F2=Y2. Then, the routine proceeds to step 386.

In step 386, the real time simulator 16 determines whether condition F1=X1 and F2=Y1 or F1=X2 and F2=Y1 is met or not. If this is the case (Yes), the routine proceeds to step 388. If this is not the case (No), the routine proceeds to step 390.

In step 388, the real time simulator 16 sets "OK", meaning a conformity assessment result that the TCS has a satisfactory fit to the test car.

In step 390, the real time simulator 16 sets "NG", meaning another conformity assessment result that the TCS fails to have a satisfactory fit to the test car.

In the next step 392, the real time simulator 16 determines whether or not each of items has been evaluated. If this is the case (Yes), the routine goes to step 394. If this is not the case (No), the routine goes back to step 358.

In step 394, the real time simulator 16 outputs report on the conformity assessment result.

With reference to FIGS. 15A and 15B, let us now consider why the time integral of wheel slip (a*, A*) over the first cycle, the change in wheel slip (b*, B*) over the first cycle, and the slip occurrence time (c*, C*) over the first cycle are optimum as alternative characteristics of the TCS in terms of its system operation. FIG. 15A illustrates varying of driving wheel spin velocity ($V_{wRR}$) and following wheel spin velocity (=car velocity $V_{car}$) upon acceleration on low µ road on constraint of TCS. In response to wheel slip, the TCS reduces driving force applied to the driving wheels by reducing engine torque or applying braking torque. This causes the wheel slip of the driving wheels to drop down to a convergent point. Thus, a shortage and/or delay in driving torque reduction by TCS can be expressed by an excessive increase in area enclosed by the driving wheel spin velocity characteristic and car velocity characteristic over the first cycle (the time integral of wheel slip from a*), an excessive increase in difference between the maximum of the driving wheel spin velocity and the minimum thereof over the first cycle (the change in wheel slip b*), and an excessive increase in time of the first cycle (the slip occurrence time c*). A reduction in at least one of the area a*, the difference in wheel slip b* and the slip occurrence time c* can be regarded as an indication of an improvement toward effective driving torque reduction done by the TCS.

In other words, the wheel spin velocity characteristic is expressed by the area of a triangle (the time integral a*), an angle between two sides of the triangle (the change in wheel slip b*) and a length of one of the two sides of the triangle (the slip occurrence time c*) for the comparison to the shape of a triangle expressed by the master data.

The manner of comparison may be readily seen from a logic flow, in FIGS. 13A and 13B, along step 360, step 366 and step 370 down to step 372. In step 372, the system conformity flag F1 is set as F1=X1.

For the evaluation of effectiveness of TCS on the car, the time integral of longitudinal car acceleration (d*, D*) and the change in longitudinal car acceleration (e*, E*) are used as alternative characteristics. One may highly evaluate the effectiveness if the TCS allows the car to keep acceleration at acceleration appropriate to road µ condition.

FIG. 15B shows three different patterns of variation characteristic of car longitudinal acceleration on constraint of TCS. An excessive increase in the time integral of longitudinal acceleration d* is an indication that the driving torque reduction by the TCS is excessive to provide an undesired longitudinal car acceleration characteristic as indicated by the one-dot chain line. An excessively small change in longitudinal car acceleration e* is an indication that the driving torque reduction by the TCS is insufficient to provide an undesired longitudinal car acceleration characteristic as indicated by the dotted line. In FIG. 15B, the fully drawn characteristic is a desired one.

Thus, one may highly evaluate the effectiveness of TCS on the car if the time integral of longitudinal car acceleration d* is less than or equal to the fourth reference (D*−α) and the change in longitudinal car acceleration e* is less than or equal to the fifth reference (E*−α). This may be readily seen from a logic flow in FIGS. 13A and 13B along step 374, step 376, step 378, step 382 and step 384. In step 384, the car conformity flag F2 is set as F2=Y1.

In the preceding description, the wheel spin velocity characteristic is used to derive the time integral of wheel slip (a*, A*), the change thereof (b*, B*), and the slip occurrence time (c*, C*) as the alternative characteristics of TCS in terms of its system operation. Alternatively, the braking force or pressure characteristic can be used instead of the wheel spin velocity characteristic if TCS reduces driving torque by applying brake.

In the preceding description, the time integral of longitudinal car acceleration (d*, D*) and the change in longitudinal car acceleration (e*, E*) are used as the alternative characteristics of TCS in terms of its effectiveness on test car. Alternatively, the road to tire friction factor can be used instead of them.

With reference to FIG. 16, the illustrated table shows four different results, namely, case 1, case 2, case 3 and case 4.

Case 1: F1=X1 and F2=Y1: The TCS under testing is satisfactory in terms of its system operation and its effectiveness on the test car. The judgment turns out to be OK.

Case 2: F1=X2 and F2=Y1: The TCS under testing is not satisfactory in terms of its system operation, but it is satisfactory in terms of its effectiveness on the test car. The judgment turns out to be OK accounting for the completion of appropriate modification to the TCS.

Case 3: F1=X1 and F2=Y2: The TCS under tensing is satisfactory in terms of its system operation, but it is not satisfactory in terms of its effectiveness on the test car. The judgment turns out to be NG. In this case, it is not possible to mount the TCS to the car. A need for modification, such as parameter alteration, to the TCS exists. The TCS as modified is subjected to simulation again for conformity assessment.

Case 4: F1=X2 and F2=X2: The TCS under tensing is not satisfactory in terms of not only in its system operation, but also in its effectiveness on the test car. The judgment turns out to be NG. In this case, it is not possible to mount the TCS to the car. A need exists for modification, such as parameter alteration, to the TCS. The TCS as modified is subjected to simulation again for conformity assessment. If the judgment fails to turn out to be OK upon repetition of conformity assessment three times, characteristics of components (tire, suspension, engine, transmission) of a car model are modified for further simulation and conformity assessment.

Figure 17:
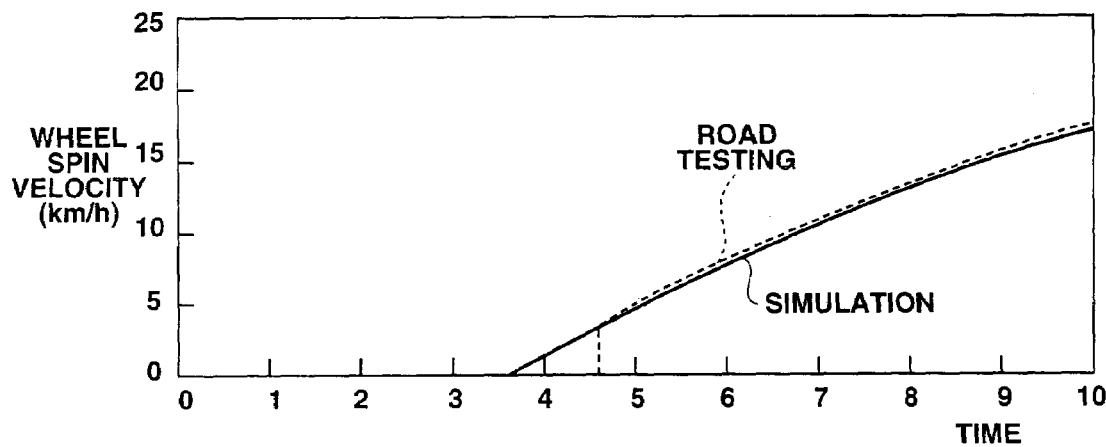
FIG. 17 is a graph showing the following wheel spin velocity variation characteristics obtained by road testing of TCS and simulation thereof.
Figure 18:
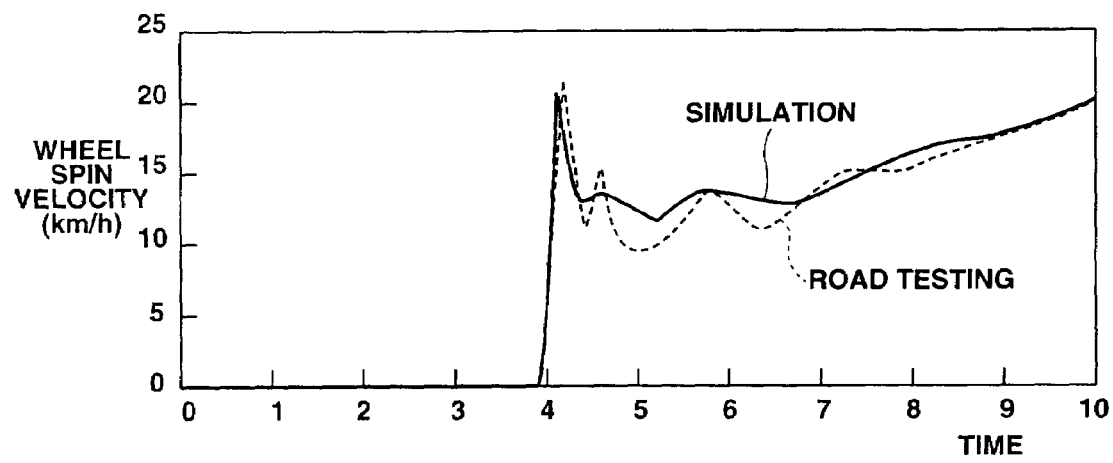
FIG. 18 is a graph showing the driving wheel spin velocity variation characteristics obtained by road testing of TCS and simulation thereof.
Figure 19:
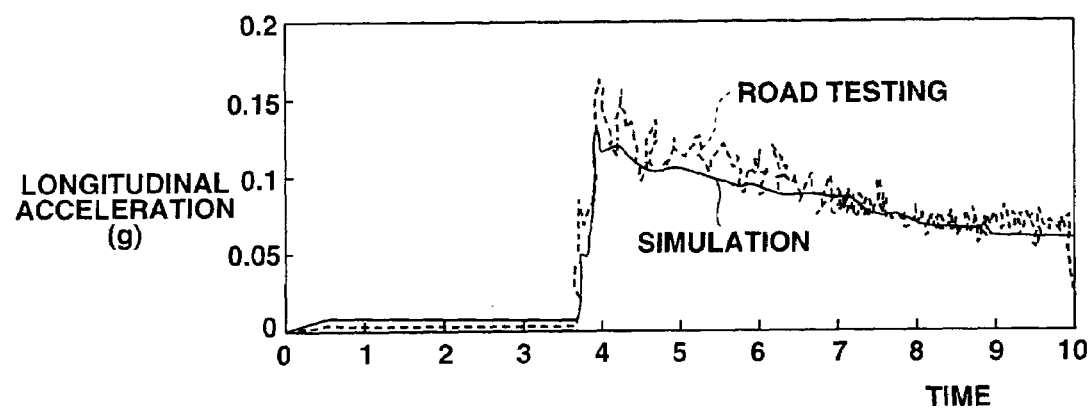
FIG. 19 is a graph showing the longitudinal car acceleration variation characteristics obtained by road testing of TCS and simulation thereof.
Figure 20:
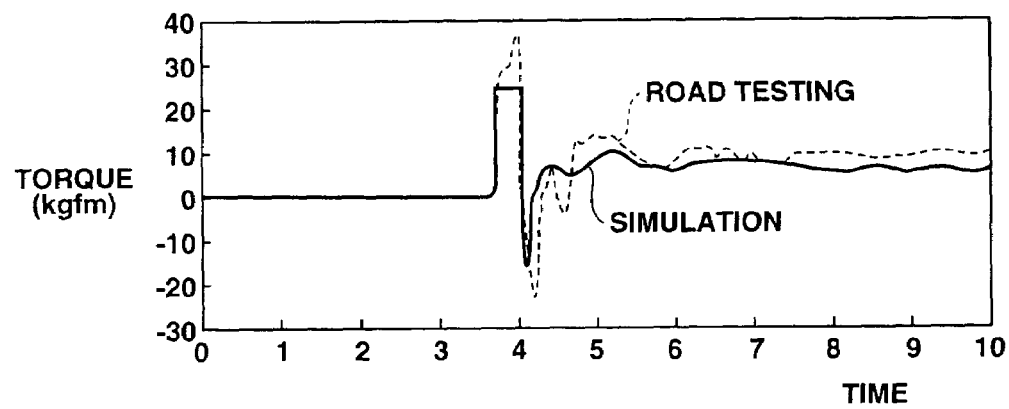
FIG. 20 is a graph showing the variation characteristics of a target value of engine torque obtained by road testing of TCS and simulation thereof.

FIGS. 17 to 20 show the results of road testing and simulation of the TCS using the virtual car model ACSYS at acceleration from a standstill on road with friction coefficient µ=0.25. The TCS can reduce driving torque by engine torque reduction and brake application. FIG. 17 shows following wheel spin velocity characteristic. FIG. 18 shows driving wheel spin velocity characteristic. FIG. 19 shows longitudinal car acceleration characteristic. FIG. 20 shows target engine torque characteristic. It will be appreciated that the simulation result approximates well the road testing result in each of FIGS. 17 to 20.

With reference now to FIGS. 21A-21D and 22A-22D, this section provides brief description on a VDC system. The VDC works by having a controller 62 (see FIG. 1) determine the degree of oversteer (FIGS. 21A-21D) or understeer (FIGS. 22A-22D) during cornering or lane change and then use the ABS to apply a determined braking force to one or more wheels and/or use the TCS to reduce engine torque in order to restore neutral handling and maximize car stability. With reference to FIGS. 21A-21D, upon determining oversteer during cornering or lane change, the controller 62 reduces engine torque and applies a determined braking force to cornering outer side front and rear wheels as indicated by arrows in FIG. 21A. With reference to FIGS. 22A-22D, upon determination of understeer during cornering or lane change, the controller 62 reduces engine torque and applies a determined braking force to converging inner rear wheel as indicated by an arrow in FIG. 22A.

With reference to FIGS. 23A to 30, another embodiment of the present invention is described. This embodiment is substantially the same as the previously described embodiments in hardware. However, as different from them, a VDC system is simulated. Thus, the VDC system is a test module 14 or system to be simulated.

Figure 24A:
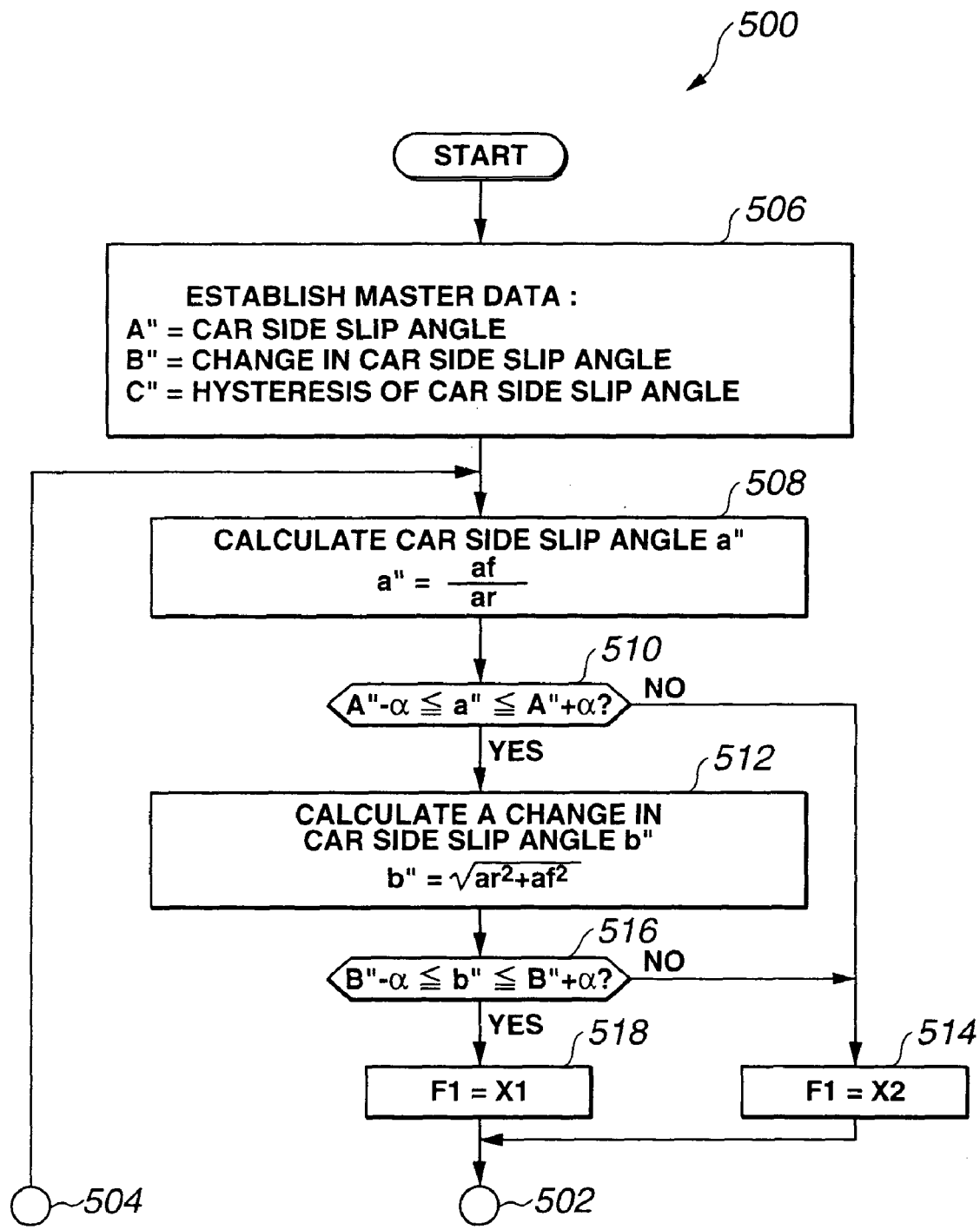
FIGS. 24A and 24B, when combined, illustrate a flow diagram of a routine for conformity assessment of VDC system.
Figure 24B:
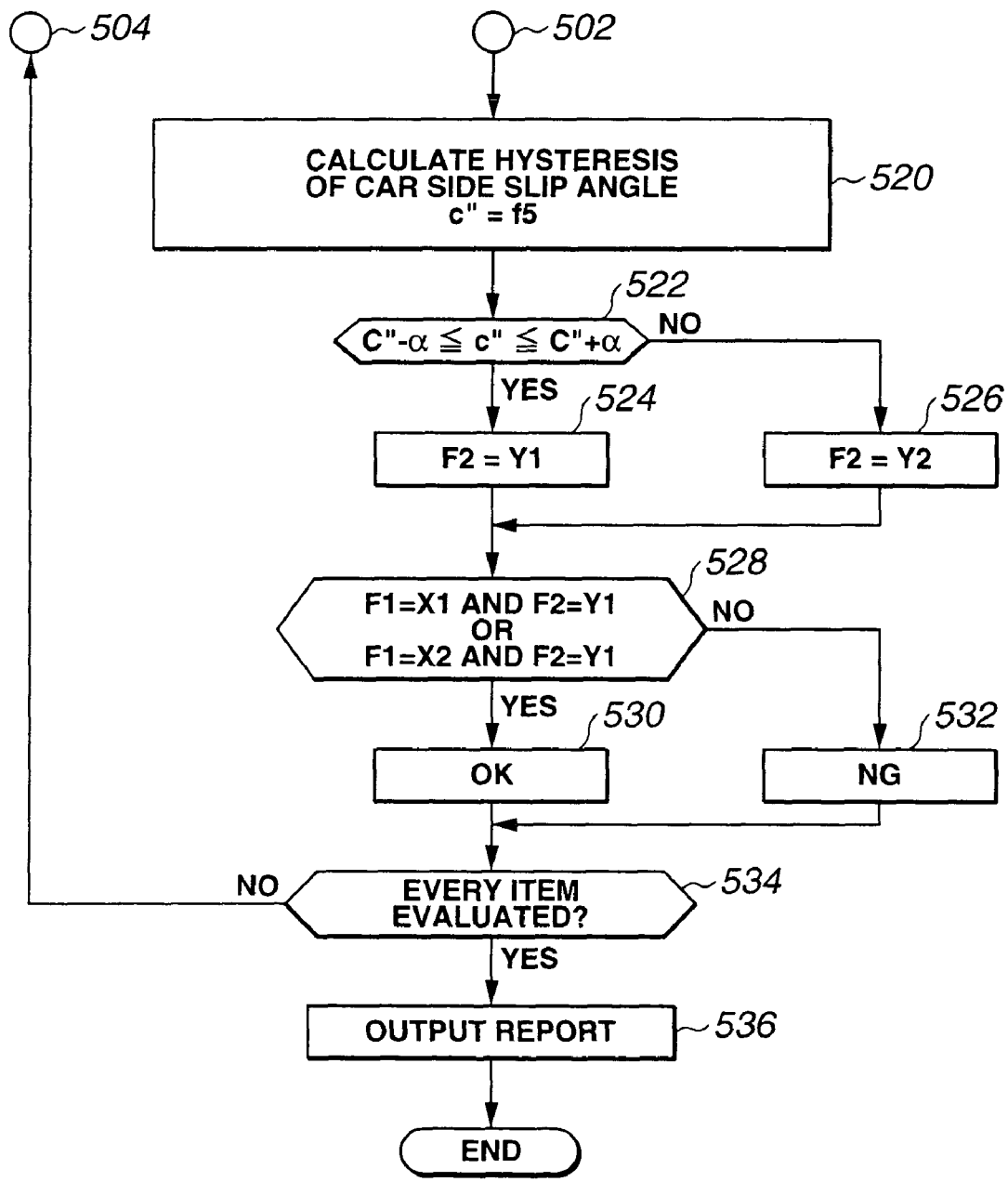

The processing flow diagram in FIGS. 24A, 24B and 24C illustrates another example of a process for performing simulation generally indicated by the reference numeral 460.

The process 460 is substantially the same as the process 160 illustrated by the flow diagram in FIGS. 6A, 6B and 6C. Thus, like reference numerals are used to denote like steps throughout FIGS. 6A to 6C and 23A to 23C.

Figure 23A:
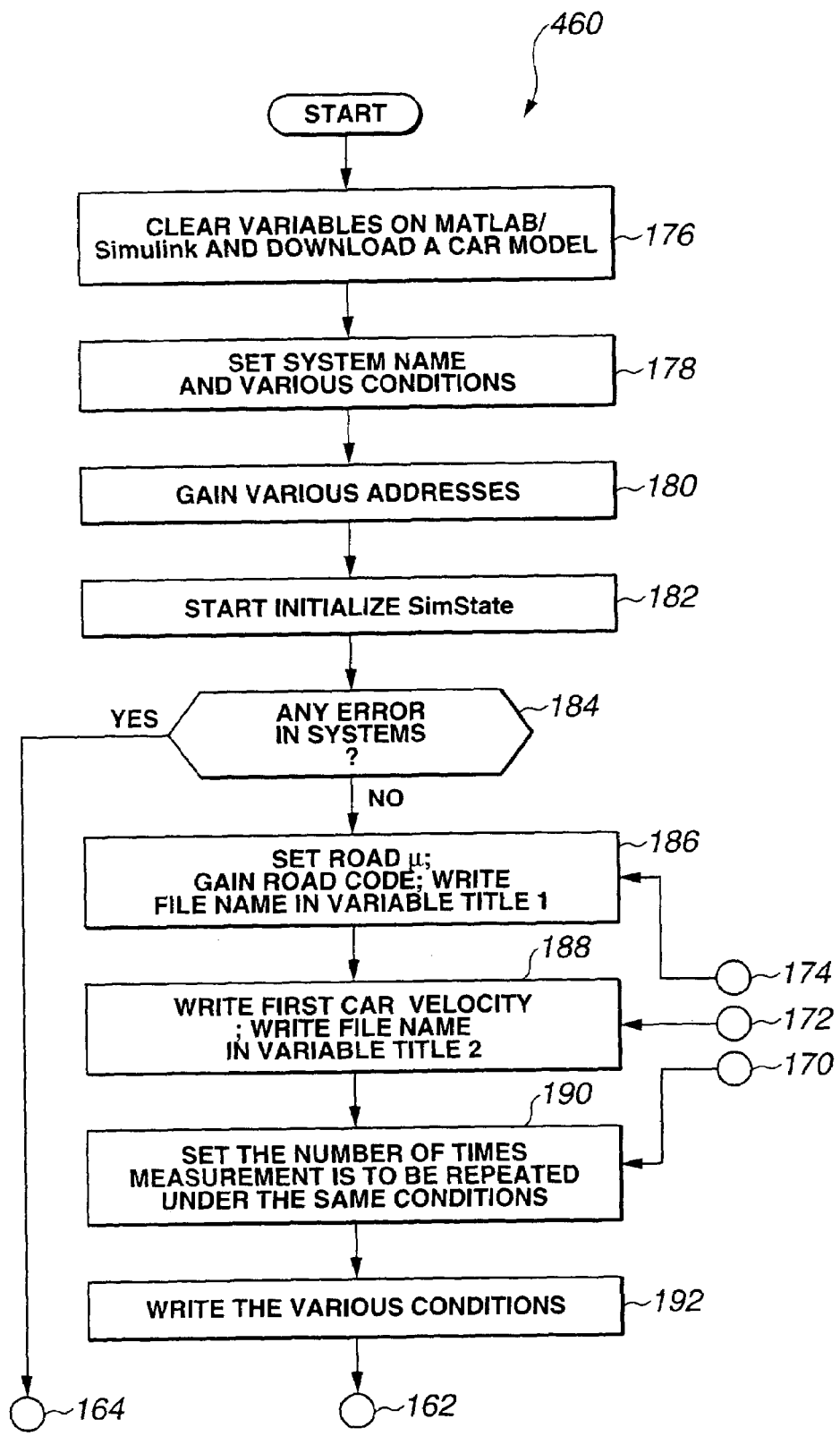
FIGS. 23A, 23B and 23C, when combined, illustrate a processing flow diagram for simulation of VDC system using a virtual car model.
Figure 23B:
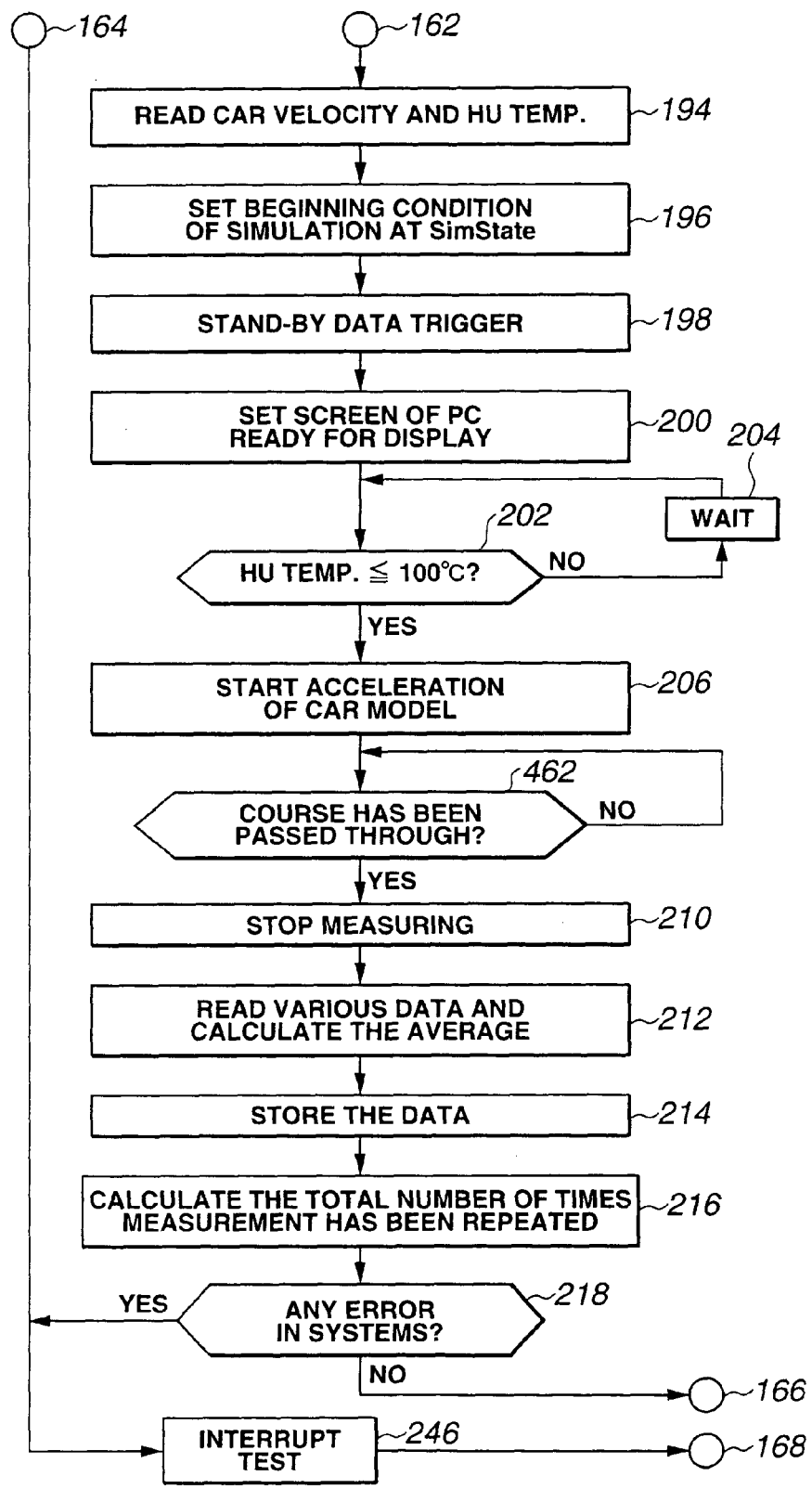
Figure 23C:
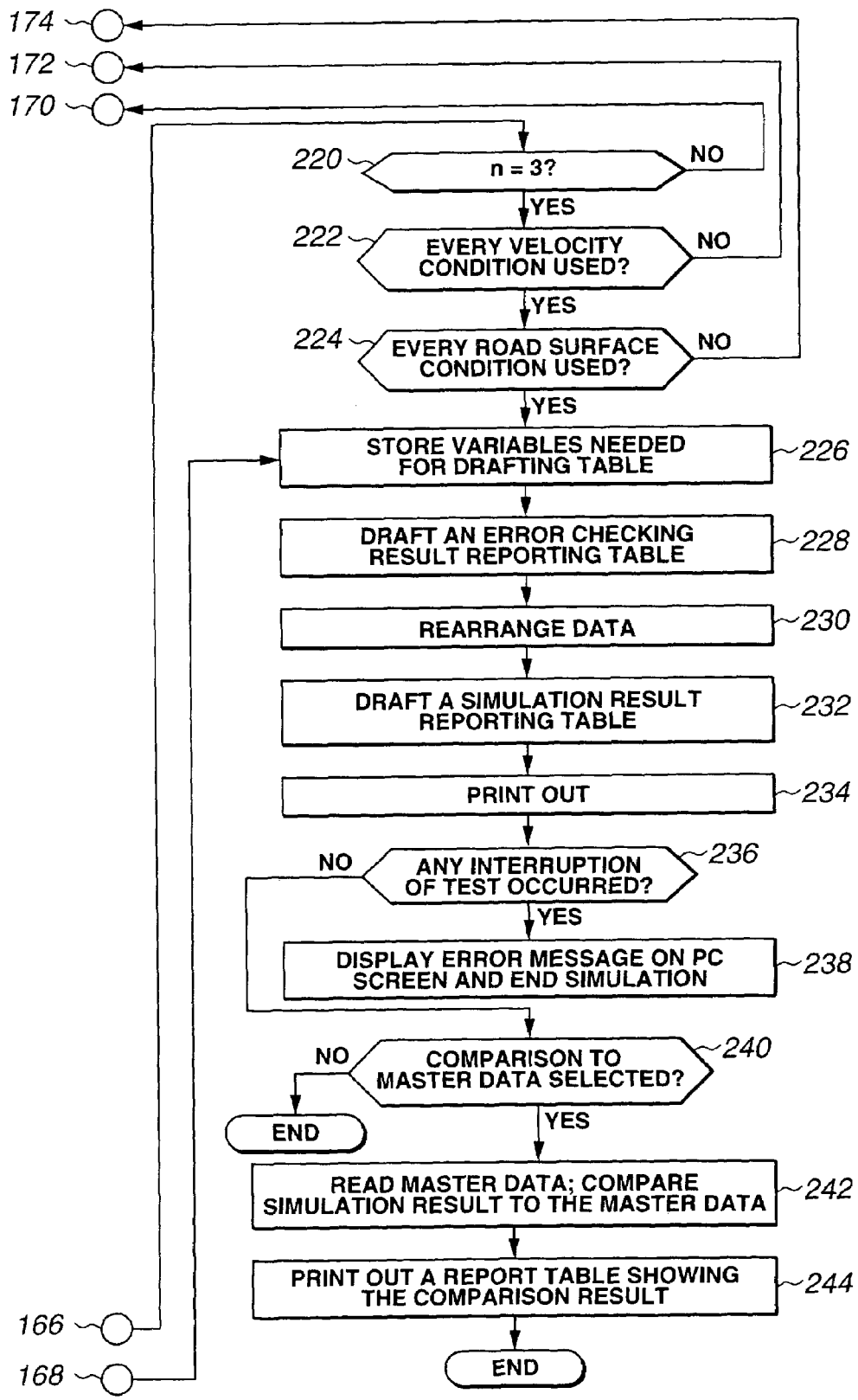

However, the process 460 is different from the process 160 in conditions adjusted to simulate the VDC system. The process 300 is different from the process 160 in the following respect:

With reference to FIGS. 23B and 6B, a newly added step 462 is inserted between steps 206 and 210 in the place of the step 208. The step 462 is provided to determine whether or not a cam model has passed through a predetermined course (lane change, for example). Collection of data continues until it is determined that at step 306 that the car model has been accelerated and passed through the course. In FIG. 23B, steps 202, 204, 206, 462 and 210 are provided for the control of simulation.

Figure 25:
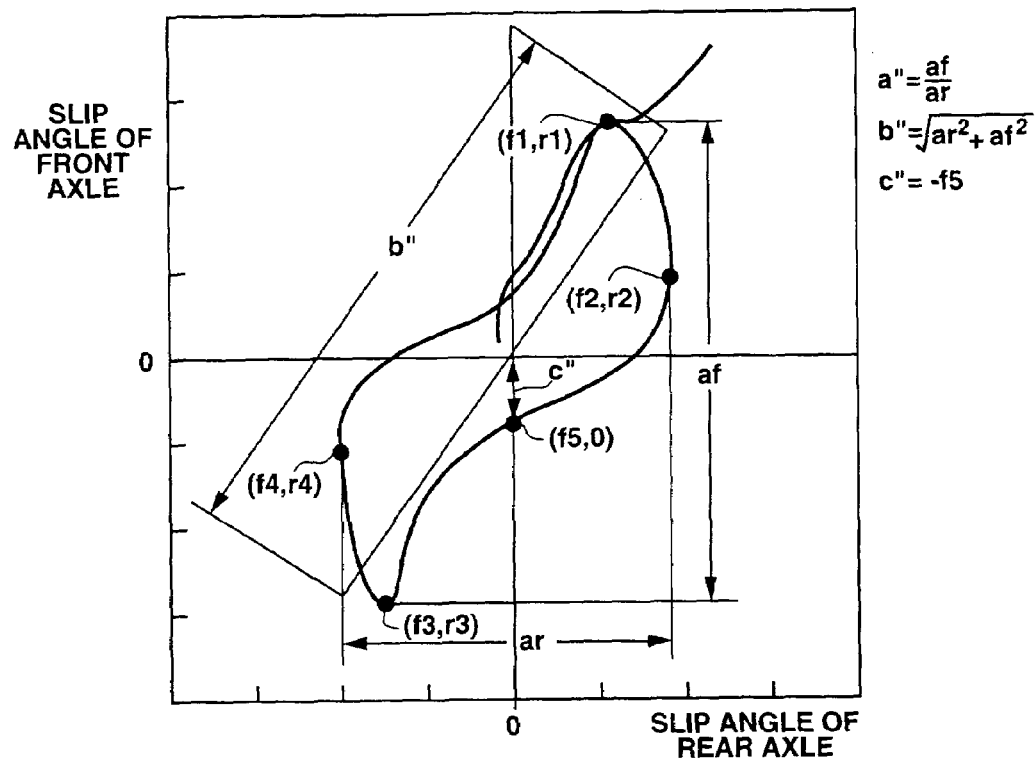
FIG. 25 shows vehicle side slip angle obtained during lane change on low friction (low μ) road, illustrating alternative characteristics of VDC system.

In this embodiment, the VDC system is a test module or system to be simulated. FIG. 25 illustrates the simulation result produced by a real time simulator 16 for establishment of a master data 12. The simulation result includes vehicle (or car) sideslip angle characteristic obtained by simulation of a master VDC system using a virtual car model of a master car for lane change on low μ road. The car under consideration has driving rear wheels and following front wheels. The simulation result is processed to create, as alternative characteristics of the test module in terms of its system operation, a car side slip angle a", and a change in car side slip angle b". The simulation result as illustrated in FIG. 25 is processed to calculate the four points as follows:

The maximum point (f1, r1) of front axle slip angle;
The maximum point (f2, r2) of rear axle slip angle;
The minimum point (f3, r3) of front axle slip angle; and
The minimum point (f4, r4) of rear axle slip angle:

Using these calculated points, a change in rear axle slip angle ar and a change in front axle slip angle af, which are expressed as:

$$ar = r2 - r4$$

$$af = f1 - f3$$

The car side slip angle a is expressed as:

$$a'' = \frac{af}{ar} = \frac{f1 - f3}{r2 - r4}$$

The change in car side slip angle b" is expressed as:

$$b'' = \sqrt{ar^2 + af^2}$$

The simulation result as illustrated in FIG. 25 is processed to create, as the alternative characteristic of the test module in terms of its effectiveness on the test car, a car side slip angle hysteresis c". The car side slip angle hysteresis c" is expressed as:

$$c'' = -f5$$

where: a point (f5, 0) is a point where the front axle slip angle is minus and the rear axle slip angle is zero.

If the simulation data is produced by simulation of the test module (VDC system) using a virtual car model of the test car, the car side slip angle a" and the change in car side slip angle b" constitute, as the alternative characteristics of the test module (VDC system) in terms of its system operation, "compare" data. The car side slip angle hysteresis c" constitutes, as the alternative characteristic of the test module (VDC system) in terms of its effectiveness on the test car, the "compare" data.

As mentioned before, in the embodiments, the master data 12 is established by performing simulation of the same module using the car model representing the master car. There is knowledge base that the master car installed with the module exhibits satisfactory performance and the module exhibits satisfactory system operation. Thus, the car side slip angle a", the change in car side slip angle b", and the car side slip angle hysteresis c" created by processing the simulation result as illustrated in FIG. 25 are used as desired values thereof and indicated now by the reference characters A", B" and C" respectively. The desired values A" B" and C" constitute the master data 12 for conformity assessment of the test module (VDC system).

The flow diagram of FIGS. 24A and 24B illustrates the exemplary implementation of a routine for conformity assessment generally indicated by the reference numeral 500. In the embodiment, the real time simulator 16 performs conformity assessment of the module 14 (VDC system) under the program control.

In step 506, the real time simulator 16 calculates the desired values of alternative characteristics that constitute the master data 12 based on database made after repetition of simulation. The car side slip angle A", the change in car side slip angle B", and the car side slip angle hysteresis C are examples of such alternative characteristics of the master data 12.

Figure 26:
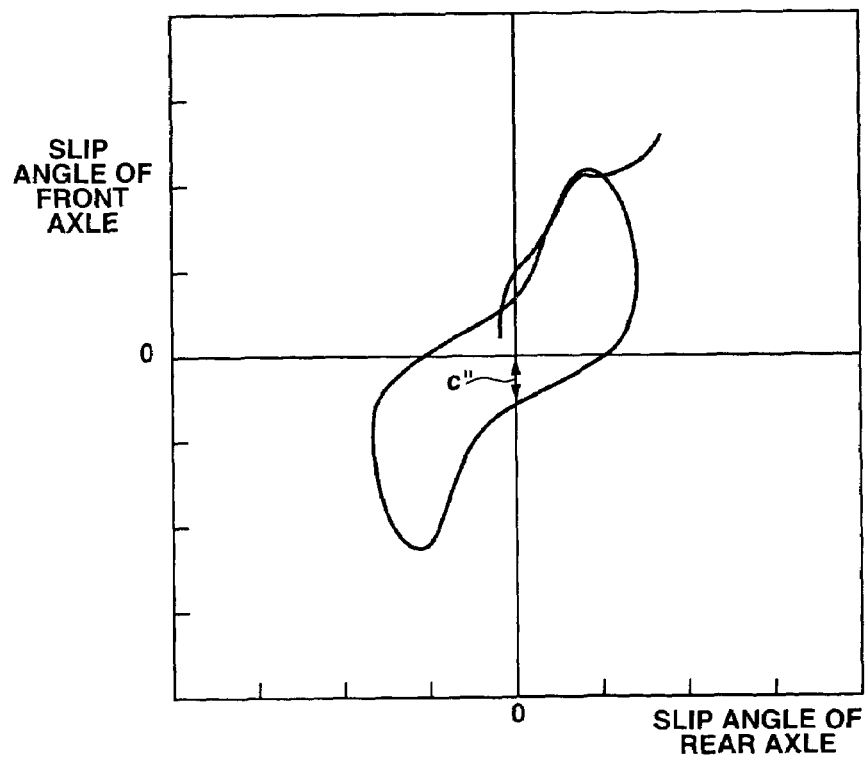
FIG. 26 shows one example of vehicle side slip angle during lane change on low friction road.

In the next step 508, the real time simulator 16 calculates the car side slip angle a" by processing the simulation result of the test module 14. FIGS. 26 and 27 illustrate examples of such simulation result.

In step 510, the real time simulator 16 determines whether or not the car side slip angle a" falls in a range limited by a first reference lower (A"−α) on one hand and by a first reference upper (A"+α) on the other hand. If this is the case (Yes), the routine proceeds to step 512. If this is not the case, the routine proceeds to step 514. In the embodiment, a first predetermined value α is equal to 50% of the desired value A" of the master data 12.

In step 512, the real time simulator 16 calculates a change in car side slip angle b" by processing the simulation result as shown in FIG. 25 or 26 or 27.

In the next step 516, the real time simulator 16 determines whether or not the change in car side slip angle b" falls in a range limited by a second reference lower (B"−α) on one hand and by a second reference upper (B"+α) on the other hand. If this is the case (Yes), the routine proceeds to step 518. If this is not the case, the routine proceeds to step 514. In the embodiment, a second predetermined value α is equal to 50% of the desired value B" of the master data 12.

In step 518, the real time simulator 16 sets a system conformity flag F1 as F1=X1, meaning that all of the conditions set in steps 510 and 516 have been met. Then, the routine proceeds to step 520 in FIG. 24B.

In step 514, the real time simulator 16 sets the system conformity flag F1 as F1=X2 unless all of the conditions have been met. In other words, if at least one of these conditions is not met, the system conformity flag F1 is set as F1=X2. In plain words, the module has failed to exhibit satisfactory system operation. Then, the routine proceeds to step 520 in FIG. 24B.

In FIG. 24B, in step 520, the real time simulator 16 calculates car side angle hysteresis c".

In the next step 522, the real time simulator 16 determines whether or not the car side slip angle hysteresis c" falls in a range limited by a third reference lower (C"−α) on one hand and by a third reference upper (C"+α) on the other hand. If this is the case (Yes), the routine proceeds to step 524. If this is not the case (No), the routine proceeds to step 526. In the embodiment, a third predetermined value α is equal to 50% of the desired value C" of the master data 12.

In step 524, the real time simulator 16 sets a car conformity flag F2 as F2=Y1, meaning that the condition set in step 522 has been met. Then, the routine proceeds to step 528.

In step 526, the real time simulator 16 sets the car conformity flag F2 as F2=Y2 unless the condition set in step 522 has been met. In other words, if this condition is not met, the car conformity flag F2 is set as F2=Y2. Then, the routine proceeds to step 528.

In step 528, the real time simulator 16 determines whether condition F1=X1 and F2=Y1 or F1=X2 and F2=Y1 is met or not. If this is the case (Yes), the routine proceeds to step 530. If this is not the case (No), the routine proceeds to step 532.

In step 530, the real time simulator 16 sets "OK", meaning a conformity assessment result that the VDC system has a satisfactory fit to the test car.

In step 532, the real time simulator 16 sets "NG", meaning another conformity assessment result that the VDC system fails to have a satisfactory fit to the test car.

In the next step 534, the real time simulator 16 determines whether or not each of items has been evaluated. If this is the case (Yes), the routine goes to step 536. If this is not the case (No), the routine goes back to step 508.

In step 536, the real time simulator 16 outputs report on the conformity assessment result.

With reference to FIGS. 25, 26 and 27, let us now consider why the car side slip angle (a", A"), and the change in car side slip angle (b", B") are optimum as alternative characteristics of the VDC system in terms of its system operation.

With reference to FIG. 25, the car side slip angle characteristic during lane change is explained. To initiate a lane change, turning the steering wheel in one direction causes both front axle and rear axle slip angles to increase in the direction till the point (f1, r1). The front axle slip angle decreases along the path from the point (f1, r1) to the point (f2, r2) due to suspension of turning of the steering wheel. Subsequently, both the front axle and rear axle slip angles decrease along the path from the point (f2, r2) to the point (f3, r3). Turning the steering wheel back causes the front axle slip angle to increase from the point (f3, r3) to the point (f4, r4). After the point (f4, r4), both the front axle and rear axle slip angles increase in the opposite direction back toward the neutral.

The car side slip angle a" is the ratio between af and ar. This indicates yaw rate balance between the front and rear wheels during lane change. The VDC system works well if the car side slip angle a" falls in the certain range. The change in car side slip angle b" indicates yaw rate of car during lane change. The VDC system works well if the change in car side slip angle b" falls in the certain range.

In other words, the car side slip angle a" is an inclination of a loop, the change in car side slip angle b" is a length of the loop and the car side slip angle hysteresis c" is a width of the loop for the comparison to a loop as shown in FIG. 25 expressed by the master data.

The manner of comparison may be readily seen from a logic flow, in FIGS. 24A and 24B, along step 510 and step 516 down to step 518. In step 518, the system conformity flag F1 is set as F1=X1.

For the evaluation of effectiveness of VDC system on the car, the car side slip angle hysteresis c" is used as alternative characteristic. If the hysteresis c" becomes large, understeer tendency increases. If the hysteresis c" becomes small, oversteer tendency increases.

The hysteresis c" shown in FIG. 26 is smaller than the desired value C" The hysteresis c" shown in FIG. 27 is larger than the desired value C".

If the hysteresis c" falls in the predetermined range about the desired value C", it is judged that the behavior of car in response to the driver's operation of the steering wheel is satisfactory. This may be readily seen from a logic flow in FIGS. 24A and 24B along step 522 and step 524. In step 524, the car conformity flag F2 is set as F2=Y1.

In the preceding description, the car side slip angle hysteresis c" is used as the alternative characteristic of VDC in terms of its effectiveness on test car. Alternatively, the characteristic relationship between slip angle (side slip) and yaw rate or the characteristic relationship between the steering angle and yaw rate can be used.

With reference to FIG. 28, the illustrated table shows four different results, namely, case 1, case 2, case 3 and case 4.

Case 1: F1=X1 and F2=Y1: The VDC system under testing is satisfactory in terms of its system operation and its effectiveness on the test car. The judgment turns out to be OK.

Case 2: F1=X2 and F2=Y1: The VDC system under testing is not satisfactory in terms of its system operation, but it is satisfactory in terms of its effectiveness on the test car. The judgment turns out to be OK accounting for the completion of appropriate modification to the VDC system.

Case 3: F1=X1 and F2=Y2: The VDC system under tensing is satisfactory in terms of its system operation, but it is not satisfactory in terms of its effectiveness on the test car. The judgment turns out to be NG. In this case, it is not possible to mount the VDC system to the car. A need for modification, such as parameter alteration, to the VDC system exists. The VDC system as modified is subjected to simulation again for conformity assessment.

Case 4: F1=X2 and F2=X2: The VDC system under tensing is not satisfactory in terms of not only in its system operation, but also in its effectiveness on the test car. The judgment turns out to be NG. In this case, it is not possible to mount the VDC system to the car. A need exists for modification, such as parameter alteration, to the VDC system. The VDC system as modified is subjected to simulation again for conformity assessment. If the judgment fails to turn out to be OK upon repetition of conformity assessment three times, characteristics of components (tire, suspension, engine, transmission) of a car model are modified for further simulation and conformity assessment.

Figure 29:
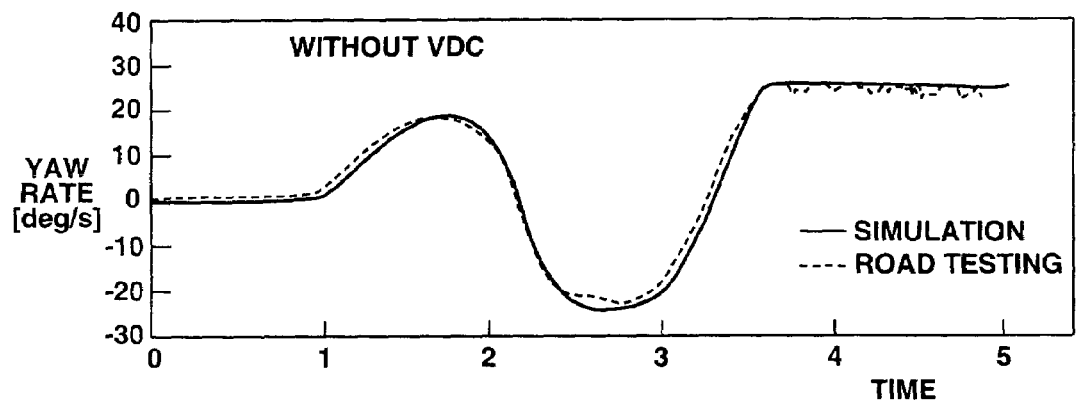
FIG. 29 is a graph showing the yaw rate characteristics of a car without VDC system obtained by road testing and simulation.
Figure 30:
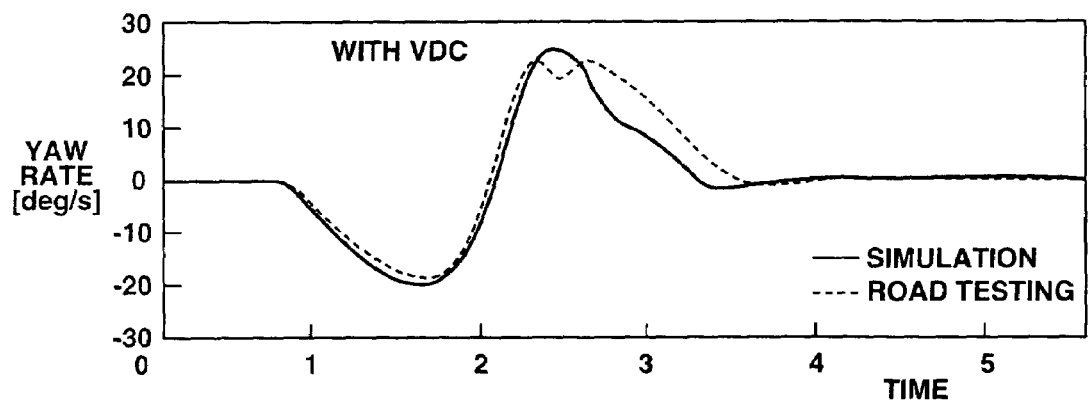
FIG. 30 is a graph showing the yaw rate characteristics of a car with VDC system obtained by road testing and simulation.

FIGS. 29 and 30 yaw rate characteristics during lane change on low μ (=0.4) road. FIG. 29 shows yaw rate characteristics without VDC system, while FIG. 30 shows yaw rate characteristics with VDC system. It will be appreciated that the simulation result approximates well the road testing results in each of FIGS. 29 to 30.

While the present invention has been particularly described, in conjunction with exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Applications No. P2002-258996, filed Sep. 4, 2002, No. P2002-258997, filed Sep. 4, 2002, and No. P2002-258998, filed Sep. 4, 2002, the disclosure of each of which is hereby incorporated by reference in its entirety.

What is claimed is:

1. A car engineering assist method comprising:
   establishing a master data;
   setting a computer-generated virtual car model to represent at least a portion of a product design specification (PDS) of a test car;
   performing computer simulation of a test module using the car model, which has been set to represent at least the portion of the PDS of the test car, to produce a simulation result;
   performing conformity assessment of the test module based on the simulation result and the master data; and
   outputting the conformity assessment result,
   wherein the master data includes alternative characteristics for conformity assessment of the test module in terms of its system operation and for conformity assessment of the test module in terms of its effectiveness on the test car; and
   wherein the master and test modules are of an anti-lock braking system (ABS), wherein processing the simulation result creates, as the alternative characteristic of the test module in terms of its effectiveness on the test car, a deceleration factor that is expressed as a ratio between average of deceleration and peak thereof on constraint of antilock braking, and wherein the master data includes, as the alternative characteristic for conformity assessment of the test module in terms of its effectiveness on the test car, a desired value of the deceleration factor.

2. The method as claimed in claim 1, wherein processing the simulation result creates, as the alternative characteristics of the test module in terms of its system operation, the time integral of braking force on constraint of anti-lock braking, the average of braking force on constraint of anti-lock braking and time required to stop a car on constraint of anti-lock braking, and wherein the master data includes, as the alternative characteristics for conformity assessment of the test module in terms of its system operation, a desired value of the time integral of braking force, a desired value of the average of braking force, and a desired value of the time.

3. A car engineering assist method comprising:
   establishing a master data;
   setting a computer-generated virtual car model to represent at least a portion of a product design specification (PDS) of a test car;
   performing computer simulation of a test module using the car model, which has been set to represent at least the portion of the PDS of the test car, to produce a simulation result;
   performing conformity assessment of the test module based on the simulation result and the master data; and
   outputting the conformity assessment result,
   wherein the master data includes alternative characteristics for conformity assessment of the test module in terms of its system operation and for conformity assessment of the test module in terms of its effectiveness on the test car;
   wherein the master and test modules are of a traction control system (TCS), wherein processing the simulation result creates, as the alternative characteristics of the test module in terms of its effectiveness on the test car, the time integral of longitudinal car acceleration over span from the first occurrence of wheel slip to the subsequent convergent point thereof on constraint of traction control, and a change in longitudinal car acceleration between the average of longitudinal car acceleration over span from the first occurrence of wheel slip to the subsequent convergent point thereof and the minimum longitudinal car acceleration on constraint of traction control, and wherein the master data includes, as the alternative characteristics for conformity assessment of the test module in terms of its effectiveness on the test car, a desired value of the time integral of longitudinal car acceleration and a desired value of the change in longitudinal car acceleration.

4. The method as claimed in claim 3, wherein processing the simulation result creates, as the alternative characteristics of the test module in terms of its system operation, the time integral of wheel slip over the first cycle on constraint of traction control, a change in wheel slip over the first cycle on constraint of traction control, and a slip occurrence time from the first occurrence of wheel slip to the subsequent convergent point thereof, and the master data includes, as the alternative characteristics for conformity assessment of the test module in terms of its system operation, a desired value of the time integral of wheel slip and a desired value of the change in wheel slip.

5. A car engineering assist method comprising:
   establishing a master data;
   setting a computer-generated virtual car model to represent at least a portion of a product design specification (PDS) of a test car;
   performing computer simulation of a test module using the car model, which has been set to represent at least the portion of the PDS of the test car, to produce a simulation result;
   performing conformity assessment of the test module based on the simulation result and the master data; and
   outputting the conformity assessment result,
   wherein the master data includes alternative characteristics for conformity assessment of the test module in terms of its system operation and for conformity assessment of the test module in terms of its effectiveness on the test car;
   wherein the master and test modules are of a vehicle dynamics control (VDC) system, wherein processing the simulation result creates, as the alternative characteristic of the test module in terms of its effectiveness on the test car, a car slip angle hysteresis on constraint of VDC, and wherein the master data includes, as the alternative characteristic for conformity assessment of the test module in its effectiveness on the test car, a desired form of the car slip angle hysteresis.

6. The method as claimed in claim 5, wherein processing the simulation result creates, as the alternative characteristics of the test module in terms of its system operation, a car slip angle on constraint of VDC and a change in car slip angle on constraint of VDC, and wherein the master data includes, as the alternative characteristics for conformity assessment of the test module in its system operation, a desired value of the car slip angle and a desired value of the change in car slip angle.

7. An engineering assist system comprising:
   a master data;
   a test module;

a real time simulator performing computer simulation of the test module using a computer-generated virtual car model, which is set to represent at least a portion of a product design specification (PDS) of a test car, to produce a simulation result;

a logic unit performing conformity assessment of the test module based on the simulation result and the master data; and an output interface outputting the conformity assessment result, wherein the master data is established on a knowledge base that a master car installed with a master module exhibits a predetermined level of performance and the master module exhibits a predetermined level of system operation;

wherein the master and test modules are of a system, including an actuator under control of a microprocessor based controller;

wherein the system is one of an anti-lock braking system (ABS), a traction control system (TCS) and a vehicle dynamics control (VDC) system;

wherein the master data includes alternative characteristics for conformity assessment of the test module in terms of its system operation, and wherein the simulation result is processed to create alternative characteristics of the test module in its system operation;

wherein the test module is the ABS, wherein the simulation result produced by the real time simulator includes variations of wheel braking force against time, which are processed to create, as the alternative characteristic of the test module in terms of its system operation, a variation characteristic of wheel braking force, and wherein the master data includes, as the alternative characteristic for conformity assessment of the test module in terms of its system operation, a desired variation characteristic of wheel braking force.

8. The system as claimed in claim 7, wherein processing the simulation result creates, as the alternative characteristic of the test module in terms of its system operation, the time integral of braking force on constraint of anti-lock braking, the average of braking force on constraint of anti-lock braking and the stopping time required to stop a car on constraint of anti-lock braking, and wherein the master data includes, as the alternative characteristics for conformity assessment of the test module in terms of its system operation, a desired value of the time integral of braking force on constraint of anti-lock braking, a desired value of the average of braking force on constraint of anti-lock braking and a desired value of the stopping time required to stop a car on constraint of anti-lock braking.

9. The system as claimed in claim 8, wherein the conformity assessment performed by the logic unit determines whether or not the time integral of braking force created by processing the simulation result is greater than a first reference obtained by subtracting a first predetermined value from the desired value of the time integral of braking force, wherein the conformity assessment performed by the logic unit determines whether or not the average of braking force created by processing the simulation result is greater than a second reference obtained by subtracting a second predetermined value from the desired value of the average of braking force, wherein the conformity assessment performed by the logic unit determines whether or not the stopping time required to stop a car created by processing the simulation result is less than a third reference obtained by subtracting a third predetermined value from the desired value of the stopping time required to stop a car, and wherein the conformity assessment performed by the logic unit makes a decision that the test module has a satisfactory fit to the test car upon determination that the time integral of braking force created by processing the simulation data is greater than the first reference, the average of braking force created by processing the simulation result is greater than the second reference, and the stopping time required to stop a car created by processing the simulation result is less than the third reference.

10. An engineering assist system comprising:

a master data;

a test module;

a real time simulator performing computer simulation of the test module using a computer-generated virtual car model, which is set to represent at least a portion of a product design specification (PDS) of a test car, to produce a simulation result;

a logic unit performing conformity assessment of the test module based on the simulation result and the master data; and an output interface outputting the conformity assessment result, wherein the master data is established on a knowledge base that a master car installed with a master module exhibits a predetermined level of performance and the master module exhibits a predetermined level of system operation;

wherein the master and test modules are of a system, including an actuator under control of a microprocessor based controller;

wherein the system is one of an anti-lock braking system (ABS), a traction control system (TCS) and a vehicle dynamics control (VDC) system;

wherein the master data includes an alternative characteristic for conformity assessment of the test module in terms of its effectiveness on the test car, and wherein the simulation result is processed to create an alternative characteristic of the test module in its effectiveness on the test car;

wherein the conformity assessment performed by the logic unit determines whether or not a deviation of the alternative characteristic of the test module in terms of its effectiveness on the test car from the alternative characteristic for conformity assessment of the test module in terms of its effectiveness on the test car falls in a predetermined range, and, if this is the case, makes a decision that the test module will have a predetermined level of fit to the test car;

wherein the test module is the ABS, wherein the simulation result produced by the real time simulator includes variations of car longitudinal acceleration against time, which are processed to create, as the alternative characteristic of the test module in terms of its effectiveness on the test car, a variation characteristic of car longitudinal acceleration, and wherein the master data includes, as the alternative characteristic for conformity assessment of the test module in terms of its effectiveness on the test car, a desired variation characteristic of car longitudinal acceleration.

11. The system as claimed in claim 10,
wherein processing the simulation data creates, as the alternative characteristic of the test module in its effectiveness on the test car, a deceleration factor that is expressed as a ratio between the average of car deceleration and peak thereof on constraint of anti-lock braking,
wherein the master data includes, as the alternative characteristic for conformity assessment of the test module in terms of its effectiveness on the test car, a desired value of the deceleration factor,
wherein the conformity assessment performed by the logic unit determines whether or not the deceleration factor created by processing the simulation result is greater than a reference obtained by subtracting a predetermined value from the deceleration factor of the master data,
wherein the conformity assessment performed by the logic unit makes a decision that the test module has a satisfactory fit to the test car upon determination that the deceleration factor created by processing the simulation result is greater than the reference.

12. An engineering assist system comprising:
a master data;
a test module;
a real time simulator performing computer simulation of the test module using a computer-generated virtual car model, which is set to represent at least a portion of a product design specification (PDS) of a test car, to produce a simulation result;
a logic unit performing conformity assessment of the test module based on the simulation result and the master data; and
an output interface outputting the conformity assessment result,
wherein the master data is established on a knowledge base that a master car installed with a master module exhibits a predetermined level of performance and the master module exhibits a predetermined level of system operation;
wherein the master and test modules are of a system, including an actuator under control of a microprocessor based controller;
wherein the system is one of an anti-lock braking system (ABS), a traction control system (TCS) and a vehicle dynamics control (VDC) system;
wherein the master data includes alternative characteristics for conformity assessment of the test module in terms of its system operation, and wherein the simulation result is processed to create alternative characteristics of the test module in its system operation;
wherein the test module is the TCS,
wherein the simulation result produced by the real time simulator includes variations of wheel spin velocity against time, which are processed to create, as the alternative characteristic of the test module in terms of its system operation, a variation characteristic of wheel spin velocity,
wherein the master data includes, as the alternative characteristic for conformity assessment of the test module in terms of its system operation, a desired variation characteristic of wheel spin velocity.

13. The system as claimed in claim 12,
wherein processing the simulation result creates, as the alternative characteristics of the test module in terms of its system operation, the time integral of wheel slip over the first cycle on constraint of traction control, a change in wheel slip over the first cycle on constraint of traction control, and a slip occurrence time from the first occurrence of wheel slip to the subsequent convergent point thereof, and
wherein the master data includes, as the alternative characteristics for conformity assessment of the test module in terms of its system operation, a desired value of the time integral of wheel slip, a desired value of the change in wheel slip, and a desired value of the slip occurrence time.

14. The system as claimed in claim 13,
wherein the conformity assessment performed by the logic unit determines whether or not the time integral of wheel slip created by processing the simulation result is less than a first reference value obtained by adding a first predetermined value to the desired value of the time integral of wheel slip,
wherein the conformity assessment performed by the logic unit determines whether or not the change in wheel slip created by processing the simulation result is less than a second reference value obtained by adding a second predetermined value to the desired value of the change in wheel slip,
wherein the conformity assessment performed by the logic unit determines whether or not the slip occurrence time created by processing the simulation result is less than a third reference value obtained by adding a third predetermined value to the desired value of the slip occurrence time, and
wherein the conformity assessment performed by the logic unit makes a decision that the test module has a satisfactory fit to the test car upon determination that the time integral of wheel slip created by processing the simulation result is less than the first reference value, the change in wheel slip created by processing the simulation result is less than the second reference value, and the slip occurrence time created by processing the simulation result is less than the third reference value.

15. An engineering assist system comprising:
a master data;
a test module;
a real time simulator performing computer simulation of the test module using a computer-generated virtual car model, which is set to represent at least a portion of a product design specification (PDS) of a test car, to produce a simulation result;
a logic unit performing conformity assessment of the test module based on the simulation result and the master data; and
an output interface outputting the conformity assessment result;
wherein the master data is established on a knowledge base that a master car installed with a master module exhibits a predetermined level of performance and the master module exhibits a predetermined level of system operation;
wherein the master and test modules are of a system, including an actuator under control of a microprocessor based controller;
wherein the system is one of an anti-lock braking system (ABS), a traction control system (TCS) and a vehicle dynamics control (VDC) system;
wherein the master data includes an alternative characteristic for conformity assessment of the test module in terms of its effectiveness on the test car, and wherein the simulation result is processed to create an alternative characteristic of the test module in its effectiveness on the test car;

wherein the conformity assessment performed by the logic unit determines whether or not a deviation of the alternative characteristic of the test module in terms of its effectiveness on the test car from the alternative characteristic for conformity assessment of the test module in terms of its effectiveness on the test car falls in a predetermined range, and, if this is the case, makes a decision that the test module will have a predetermined level of fit to the test car;

wherein the test module is the TCS, wherein the simulation result produced by the real time simulator includes variations of car longitudinal deceleration against time, which are processed to create, as the alternative characteristic of the test module in terms of its effectiveness on the test car, a variation characteristic of car longitudinal acceleration, and wherein the master data includes, as the alternative characteristic for conformity assessment of the test module in terms of its effectiveness on the test car, a desired variation characteristic of car longitudinal acceleration.

16. The system as claimed in claim 15, wherein processing the simulation result creates, as the alternative characteristics of the test module in terms of its effectiveness on the test car, the time integral of longitudinal car acceleration over span from the first occurrence of wheel slip to the subsequent convergent point thereof on constraint of traction control, and a change in longitudinal car acceleration between the average of longitudinal car acceleration over span from the first occurrence of wheel slip to the subsequent convergent point thereof and the minimum longitudinal car acceleration on constraint of traction control, wherein the master data includes, as the alternative characteristics for conformity assessment of the test module in its effectiveness on the test car, a desired value of the time integral of longitudinal car acceleration and a desired value of the change in longitudinal car acceleration, wherein the conformity assessment performed by the logic unit determines whether or not the time integral of longitudinal car acceleration created by processing the simulation result is greater than a fourth reference value obtained by subtracting a fourth predetermined value from the desired value of the time integral of longitudinal car acceleration, wherein the conformity assessment performed by the logic unit determines whether or not the change in longitudinal car acceleration created by processing the simulation result is greater than a fifth reference value obtained by subtracting a fifth predetermined value from the desired value of the change in longitudinal car acceleration, wherein the conformity assessment performed by the logic unit makes a decision that the test module has a satisfactory fit to the test car upon determination that the time integral of longitudinal car acceleration created by processing the simulation result is greater than the fourth reference value and the change in longitudinal car acceleration created by processing the simulation result is greater than the fifth reference value.

17. An engineering assist system comprising:
a master data;
a test module;
a real time simulator performing computer simulation of the test module using a computer-generated virtual car model, which is set to represent at least a portion of a product design specification (PDS) of a test car, to produce a simulation result;
a logic unit performing conformity assessment of the test module based on the simulation result and the master data; and
an output interface outputting the conformity assessment result, wherein the master data is established on a knowledge base that a master car installed with a master module exhibits a predetermined level of performance and the master module exhibits a predetermined level of system operation;

wherein the master and test modules are of a system, including an actuator under control of a microprocessor based controller;

wherein the system is one of an anti-lock braking system (ABS), a traction control system (TCS) and a vehicle dynamics control (VDC) system;

wherein the master data includes alternative characteristics for conformity assessment of the test module in terms of its system operation and for conformity assessment of the test module in terms of its effectiveness on the test car, and wherein simulation data is processed to create alternative characteristics of the test module in terms of its system operation and in terms of its effectiveness on the test car;

wherein the conformity assessment performed by the logic unit determines whether or not each of a set of deviations of the alternative characteristics of the test module in terms of its system operation from the alternative characteristics for conformity assessment of the test module in terms of its system operation falls in a predetermined range;

wherein the conformity assessment performed by the logic unit determines whether or not a deviation of the alternative characteristics of the test module in terms of its effectiveness on the test car from the alternative characteristics for conformity assessment of the test module in terms of its effectiveness on the test car falls in a predetermined range;

wherein the conformity assessment performed by the logic unit makes a decision that modification to the test module has been completed and the test module as modified will have a predetermined level of fit to the test car upon determination that each of the set of deviations of the alternative characteristics of the test module in terms of its system operation from the alternative characteristics for conformity assessment of the test module in terms of its system operation fails to fall in the predetermined range, and the deviation of the alternative characteristics of the test module in terms of its effectiveness on the test car from the alternative characteristics for conformity assessment of the test module in terms of its effectiveness on the test car falls in the predetermined range;

wherein the test module is the TCS, wherein the simulation result produced by the real time simulator includes variations of wheel spin velocity against time, which are processed to create, as the alternative characteristic of the test module in terms of its system operation, a variation characteristic of wheel spin velocity, wherein the master data includes, as the alternative characteristic for conformity assessment of the test module in terms of its system operation, a desired variation characteristic of wheel spin velocity, wherein the simulation result produced by the real time simulator includes variations of longitudinal car acceleration against time, which are processed to create, as the alternative characteristic of the test module in terms of its effectiveness on the test car, a variation characteristic of longitudinal car acceleration, and wherein the master data includes, as the alternative characteristic for conformity assessment of the test module in terms of its effectiveness on the test car, a desired variation characteristic of longitudinal car acceleration.

18. The system as claimed in claim 17, wherein processing the simulation result creates, as the alternative characteristics of the test module in terms of its system operation, the time integral of wheel slip over the first cycle on constraint of traction control, a change in wheel slip over the first cycle on constraint of traction control, and a slip occurrence time from the first occurrence of wheel slip to the subsequent convergent point thereof, wherein the master data includes, as the alternative characteristics for conformity assessment of the test module in terms of its system operation, a desired value of the time integral of wheel slip, a desired value of the change in wheel slip, and a desired value of the slip occurrence time, wherein processing the simulation result creates, as the alternative characteristics of the test module in terms of its effectiveness on the test car, the time integral of longitudinal car acceleration over span from the first occurrence of wheel slip to the subsequent convergent point thereof on constraint of traction control, and a change in longitudinal car acceleration between the average of longitudinal car acceleration over span from the first occurrence of wheel slip to the subsequent convergent point thereof and the minimum longitudinal car acceleration on constraint of traction control, and wherein the master data includes, as the alternative characteristics for conformity assessment of the test module in its effectiveness on the test car, a desired value of the time integral of longitudinal car acceleration and a desired value of the change in longitudinal car acceleration.

19. The system as claimed in claim 18, wherein the conformity assessment performed by the logic unit determines whether or not the time integral of wheel slip created by processing the simulation result is less than a first reference value obtained by adding a first predetermined value to the desired value of the time integral of wheel slip, wherein the conformity assessment performed by the logic unit determines whether or not the change in wheel slip created by processing the simulation result is less than a second reference value obtained by adding a second predetermined value to the desired value of the change in wheel slip, wherein the conformity assessment performed by the logic unit determines whether or not the slip occurrence time created by processing the simulation result is less than a third reference value obtained by adding a third predetermined value to the desired value of the slip occurrence time wherein the conformity assessment performed by the logic unit determines whether or not the time integral of longitudinal car acceleration created by processing the simulation result is greater than a fourth reference value obtained by subtracting a fourth predetermined value from the desired value of the time integral of longitudinal car acceleration, wherein the conformity assessment performed by the logic unit determines whether or not the change in longitudinal car acceleration created by processing the simulation result is greater than a fifth reference value obtained by subtracting a fifth predetermined value from the desired value of the change in longitudinal car acceleration, wherein the conformity assessment performed by the logic unit makes a decision that the test module has a satisfactory fit to the test car upon determination that the time integral of wheel slip created by processing the simulation result is less than the first reference value, the change in wheel slip created by processing the simulation result is less than the second reference value, the slip occurrence time created by processing the simulation result is less than the third reference value, the time integral of longitudinal car acceleration created by processing the simulation result is greater than the fourth reference value, and the change in longitudinal car acceleration created by processing the simulation result is greater than the fifth reference value, wherein the conformity assessment performed by the logic unit makes a decision that the test module has a satisfactory fit to the test car upon determination that the time integral of longitudinal car acceleration created by processing the simulation result is greater than the fourth reference value, and the change in longitudinal car acceleration created by processing the simulation result is greater than the fifth reference value unless the time integral of wheel slip created by processing the simulation result is less than the first reference value, the change in wheel slip created by processing the simulation result is less than the second reference value, and the slip occurrence time created by processing the simulation result is less than the third reference value, and wherein the conformity assessment performed by the logic unit makes a decision that the test module fails to have a satisfactory fit to the test car upon determination otherwise.

20. An engineering assist system comprising:

a master data;

a test module;

a real time simulator performing computer simulation of the test module using a computer-generated virtual car model, which is set to represent at least a portion of a product design specification (PDS) of a test car, to produce a simulation result;

a logic unit performing conformity assessment of the test module based on the simulation result and the master data; and an output interface outputting the conformity assessment result, wherein the master data is established on a knowledge base that a master car installed with a master module exhibits a predetermined level of performance and the master module exhibits a predetermined level of system operation;

wherein the master and test modules are of a system, including an actuator under control of a microprocessor based controller;

wherein the system is one of an anti-lock braking system (ABS), a traction control system (TCS) and a vehicle dynamics control (VDC) system;

wherein the master data includes alternative characteristics for conformity assessment of the test module in terms of its system operation, and wherein the simulation result is processed to create alternative characteristics of the test module in its system operation;

wherein the test module is the VDC system, wherein the simulation result produced by the real time simulator includes variations of slip angles of the front and rear axles against time, which are processed to create, as the alternative characteristic of the test module in terms of its system operation, a variation characteristic of slip angles of the front and rear axles, and wherein the master data includes, as the alternative characteristic for conformity assessment of the test module in terms of its system operation, a desired variation characteristic of the slip angles of the front and rear axles.

21. The system as claimed in claim 20, wherein processing the simulation result creates, as the alternative characteristics of the test module in terms of its system operation, a car slip angle on constraint of VDC, and a change in car slip angle on constraint of VDC, and wherein the master data includes, as the alternative characteristics for conformity assessment of the test module in terms of its system operation, a desired value of the car slip angle, and a desired value of the change in car slip angle.

22. The system as claimed in claim 21, wherein the conformity assessment performed by the logic unit determines whether or not the car slip angle created by processing the simulation result falls in a first predetermined window about the desired value of the car slip angle, wherein the conformity assessment performed by the logic unit determines whether or not the change in car slip angle created by processing the simulation result falls in a second predetermined window about the desired value of the change in car slip angle, and wherein the conformity assessment performed by the logic unit makes a decision that the test module has a satisfactory fit to the test car upon determination that the car slip angle created by processing the simulation result falls in the first predetermined window and the change in car slip angle created by processing the simulation result falls in the second predetermined window.

23. An engineering assist system comprising:

a master data;

a test module;

a real time simulator performing computer simulation of the test module using a computer-generated virtual car model, which is set to represent at least a portion of a product design specification (PDS) of a test car, to produce a simulation result;

a logic unit performing conformity assessment of the test module based on the simulation result and the master data; and an output interface outputting the conformity assessment result;

wherein the master data is established on a knowledge base that a master car installed with a master module exhibits a predetermined level of performance and the master module exhibits predetermined level of system operation;

wherein the master and test modules are of a system, including an actuator under control of a microprocessor based controller;

wherein the system is one of an anti-lock braking system (ABS), a traction control system (TCS) and a vehicle dynamics control (VDC) system;

wherein the master data includes an alternative characteristic for conformity assessment of the test module in terms of its effectiveness on the test car, and wherein the simulation result is processed to create an alternative characteristic of the test module in its effectiveness on the test car;

wherein the conformity assessment performed by the logic unit determines whether or not a deviation of the alternative characteristic of the test module in terms of its effectiveness on the test car from the alternative characteristic for conformity assessment of the test module in terms of its effectiveness on the test car falls in a predetermined range, and, if this is the case, makes a decision that the test module will have a predetermined level of fit to the test car;

wherein the test module is the VDC system, wherein the simulation result produced by the real time simulator includes variations of car slip angle against time, which are processed to create, as the alternative characteristic of the test module in terms of its effectiveness on the test car, a variation characteristic of car slip angle, and wherein the master data includes, as the alternative characteristic for conformity assessment of the test module in terms of its effectiveness on the test car, a desired variation characteristic of car slip angle.

24. The system as claimed in claim 23, wherein processing the simulation result creates, as the alternative characteristic of the test module in terms of its effectiveness on the test car, a car slip angle hysteresis on constraint of VDC, wherein the master data includes, as the alternative characteristic for conformity assessment of the test module in its effectiveness on the test car, a desired form of the car slip angle hysteresis, wherein the conformity assessment performed by the logic unit determines whether or not the car slip angle hysteresis created by processing the simulation result falls in a third predetermined window about the desired form of the car slip angle hysteresis, and wherein the conformity assessment performed by the logic unit makes a decision that the test module has a satisfactory fit to the test car upon determination that the car slip angle hysteresis falls in the third predetermined window.

25. An engineering assist system comprising:

a master data;

a test module;

a real time simulator performing computer simulation of the test module using a computer-generated virtual car model, which is set to represent at least a portion of a product design specification (PDS) of a test car, to produce a simulation result;

a logic unit performing conformity assessment of the test module based on the simulation result and the master data; and an output interface outputting the conformity assessment result;

wherein the master data is established on a knowledge base that a master car installed with a master module exhibits a predetermined level of performance and the master module exhibits a predetermined level of system operation;

wherein the master and test modules are of a system, including an actuator under control of a microprocessor based controller;

wherein the system is one of an anti-lock braking system (ABS), a traction control system (TCS) and a vehicle dynamics control (VDC) system;

wherein the master data includes alternative characteristics for conformity assessment of the test module in terms of its system operation and for conformity assessment of the test module in terms of its effectiveness on the test car, and wherein simulation data is processed to create alternative characteristics of the test module in terms of its system operation and in terms of its effectiveness on the test car;

wherein the conformity assessment performed by the logic unit determines whether or not each of a set of deviations of the alternative characteristics of the test module in terms of its system operation from the alternative characteristics for conformity assessment of the test module in terms of its system operation falls in a predetermined range;

wherein the conformity assessment performed by the logic unit determines whether or not a deviation of the alternative characteristics of the test module in terms of its effectiveness on the test car from the alternative characteristics for conformity assessment of the test module in terms of its effectiveness on the test car falls in a predetermined range;

wherein the conformity assessment performed by the logic unit makes a decision that modification to the test module has been completed and the test module as modified will have a predetermined level of fit to the test car upon determination that each of the set of deviations of the alternative characteristics of the test module in terms of its system operation from the alternative characteristics for conformity assessment of the test module in terms of its system operation fails to fall in the predetermined range, and the deviation of the alternative characteristics of the test module in terms of its effectiveness on the test car from the alternative characteristics for conformity assessment of the test module in terms of its effectiveness on the test car falls in the predetermined range;

wherein the test module is the VDC system, wherein the simulation result produced by the real time simulator includes variations of slip angles of the front and rear axles against time, which are processed to create, as the alternative characteristic of the test module in terms of its system operation, a variation characteristic of slip angles of the front and rear axles, wherein the master data includes, as the alternative characteristic for conformity assessment of the test module in terms of its system operation, a desired variation characteristic of the slip angles of the front and rear axles, wherein the simulation result produced by the real time simulator includes variations of car slip angle against time, which are processed to create, as the alternative characteristic of the test module in terms of its effectiveness on the test car, a variation characteristic of car slip angle, and wherein the master data includes, as the alternative characteristic for conformity assessment of the test module in terms of its effectiveness on the test car, a desired variation characteristic of car slip angle.

26. The system as claimed in claim 25, wherein processing the simulation result creates, as the alternative characteristics of the test module in terms of its system operation, a car slip angle on constraint of VDC, and a change in car slip angle on constraint of VDC, and wherein the master data includes, as the alternative characteristics for conformity assessment of the test module in terms of its system operation, a desired value of the car slip angle, and a desired value of the change in car slip angle, wherein processing the simulation result creates, as the alternative characteristic of the test module in terms of its effectiveness on the test car, a car slip angle hysteresis on constraint of VDC, wherein the master data includes, as the alternative characteristic for conformity assessment of the test module in its effectiveness on the test car, a desired form of the car slip angle hysteresis.

27. The system as claimed in claim 26, wherein the conformity assessment performed by the logic unit determines whether or not the car slip angle created by processing the simulation result falls in a first predetermined window about the desired value of the car slip angle, wherein the conformity assessment performed by the logic unit determines whether or not the change in car slip angle created by processing the simulation result falls in a second predetermined window about the desired value of the change in car slip angle, wherein the conformity assessment performed by the logic unit determines whether or not the car slip angle hysteresis created by processing the simulation result falls in a third predetermined window about the desired form of the car slip angle hysteresis, wherein the conformity assessment performed by the logic unit makes a decision that the test module has a satisfactory fit to the test car upon determination that the car slip angle created by processing the simulation result falls in the first predetermined window, and the change in car slip angle created by processing the simulation result falls in the second predetermined window, and the car slip angle hysteresis created by processing the simulation result falls in the third predetermined window, wherein the conformity assessment performed by the logic unit makes a decision that the test module has a satisfactory fit to the test car upon determination that the car slip angle hysteresis created by processing the simulation result falls in the third predetermined window unless the car slip angle created by processing the simulation result falls in the first predetermined window, and the change in car slip angle created by processing the simulation result falls in the second predetermined window, and wherein the conformity assessment performed by the logic unit makes a decision that the test module fails to have a satisfactory fit to the test car upon determination otherwise.

28. An engineering assist system comprising:

a master data;

a test module;

a real time simulator performing computer simulation of the test module using a computer-generated virtual car model, which is set to represent at least a portion of a product design specification (PDS) of a test car, to produce a simulation result;

a logic unit performing conformity assessment of the test module based on the simulation result and the master data;

wherein the master data is established on a knowledge base that the master car installed with a master module exhibits a predetermined level of performance and the master module exhibits a predetermined level of system operation;

wherein the master and test modules are of a system, including an actuator under control of a microprocessor based controller;

wherein the system is one of an anti-lock braking system (ABS), a traction control system (TCS) and a vehicle dynamics control (VDC) system;

wherein the master data includes alternative characteristics for conformity assessment of the test module in terms of its system operation and for conformity assessment of the test module in terms of its effectiveness on the test car, and wherein simulation data is processed to create alternative characteristics of the test module in terms of its system operation and in terms of its effectiveness on the test car;

wherein the conformity assessment performed by the logic unit determines whether or not each of a set of deviations of the alternative characteristics of the test module in terms of its system operation from the alternative characteristics for conformity assessment of the test module in terms of its system operation falls in a predetermined range;

wherein the conformity assessment performed by the logic unit determines whether or not a deviation of alternative characteristics of the test module in terms of its effectiveness on the test car from the alternative characteristics for conformity assessment of the test module in terms of its effectiveness on the test car falls in a predetermined range;

wherein the conformity assessment performed by the logic unit makes a decision that modification to the test module has been completed and the test module as modified will have a predetermined level of fit to the test car upon determination that each of the set of deviations of the alternative characteristics of the test module in terms of its system operation from the alternative characteristics for conformity assessment of the test module in terms of its system operation fails to fall in the predetermined range, and the deviation of the alternative characteristics of the test module in terms of its effectiveness on the test car from the alternative characteristics for conformity assessment of the test module in terms of its effectiveness on the test car falls in the predetermined range;

wherein the test module is the ABS;

wherein the simulation result produced by the real time simulator includes variations of wheel braking force against time, which are processed to create, as the alternative characteristics of the test module in terms of its system operation, a variation characteristic of wheel braking force;

wherein the master data includes, as the alternative characteristics for conformity assessment of the test module in terms of its system operation, a desired variation characteristic of wheel braking force;

wherein the simulation result produced by the real time simulator includes variations of longitudinal car acceleration against time, which are processed to create, as the alternative characteristics of the test module in terms of its effectiveness on the test car, a variation characteristic of longitudinal car acceleration; and wherein the master data includes, as the alternative characteristics for conformity assessment of the test module in terms of its effectiveness on the test car, a desired variation characteristic of longitudinal car acceleration.

29. The system as claimed in claim 28, wherein processing the simulation result creates, as the alternative characteristics of the test module in terms of its system operation, the time integral of braking force on constraint of anti-lock braking, the average of braking force on constraint of anti-lock braking and the stopping time required to stop a car on constraint of anti-lock braking;

wherein the master data includes, as the alternative characteristics for conformity assessment of the test module in terms of its system operation, a desired value of the time integral of braking force on constraint of anti-lock braking, a desired value of the average of braking force on constraint of anti-lock braking, and a desired value of the stopping time required to stop a car on constraint of anti-lock braking;

wherein processing the simulation data creates, as the alternative characteristics of the test module in terms of its effectiveness on the test car, a deceleration factor that is expressed as a ratio between the average of car deceleration and peak thereof on constraint of anti-lock braking; and wherein the master data includes, as the alternative characteristics for conformity assessment of the test module in terms of its effectiveness on the test car, a desired value of the deceleration factor.

30. The system as claimed in claim 29, wherein the conformity assessment performed by the logic unit determines whether or not the time integral of braking force created by processing the simulation result is greater than a first reference obtained by subtracting a first predetermined value from the desired value of the time integral of braking force;

wherein the conformity assessment performed by the logic unit determines whether or not the average of braking force created by processing the simulation result is greater than a second reference obtained by subtracting a second predetermined value from the desired value of the average of braking force;

wherein the conformity assessment performed by the logic unit determines whether or not the stopping time required to stop a car created by processing the simulation result is less than a third reference obtained by subtracting a third predetermined value from the desired value of the stopping time required to stop a car;

wherein the conformity assessment performed by the logic unit determines whether or not the deceleration factor created by processing the simulation result is greater than a fourth reference obtained by subtracting a fourth predetermined value from the desired value of the deceleration factor;

wherein the conformity assessment performed by the logic unit makes a decision that the test module has a satisfactory fit to the test car upon determination that the time integral of braking force created by processing the simulation data is greater than the first reference, the average of braking force created by processing the simulation result is greater than the second reference, and the stopping time required to stop a car created by processing the simulation result is less than the third reference, and the deceleration factor created by processing the simulation result is greater than the fourth reference;

wherein the conformity assessment performed by the logic unit makes a decision that the test module has a satisfactory fit to the test car upon determination that the deceleration factor created by processing the simulation result is greater than the fourth reference unless the time integral of braking force created by processing the simulation data is greater than the first reference, the average of braking force created by processing the simulation result failure is greater than the second reference, and the stopping time required to stop a car created by processing the simulation result failure is less than the third reference; and wherein the conformity assessment performed by the logic unit makes a decision that the test module fails to have a satisfactory fit to the test car upon determination otherwise.

* * * * *